(12) United States Patent
Hwang et al.

(10) Patent No.: US 10,692,881 B2
(45) Date of Patent: Jun. 23, 2020

(54) SEMICONDUCTOR MEMORY DEVICE AND METHOD OF MANUFACTURING THE SAME

(71) Applicant: Samsung Electronics Co., Ltd., Suwon-si, Gyeonggi-do (KR)

(72) Inventors: Sung-Min Hwang, Hwaseong-si (KR); Joon-Sung Lim, Seongnam-si (KR); Jihye Kim, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/982,213

(22) Filed: May 17, 2018

(65) Prior Publication Data
US 2018/0358376 A1    Dec. 13, 2018

(30) Foreign Application Priority Data

Jun. 12, 2017  (KR) .................. 10-2017-0073390
Dec. 5, 2017   (KR) .................. 10-2017-0166233

(51) Int. Cl.
*H01L 27/11582*   (2017.01)
*H01L 23/538*     (2006.01)
(Continued)

(52) U.S. Cl.
CPC .... *H01L 27/11582* (2013.01); *H01L 23/5384* (2013.01); *H01L 27/11556* (2013.01); *H01L 27/11573* (2013.01); *H01L 27/11575* (2013.01)

(58) Field of Classification Search
None
See application file for complete search history.

(56) References Cited

U.S. PATENT DOCUMENTS 6,071,763 A    6/2000  Lee
8,654,584 B2   2/2014  Kim et al.
(Continued)

FOREIGN PATENT DOCUMENTS

KR    101040154 B1     6/2011
KR    10-2012-0003351 A  1/2012
KR    10-2013-0136249 A 12/2013

OTHER PUBLICATIONS

U.S. Office Action dated Feb. 15, 2019 in corresponding U.S. Appl. No. 15/841,762.
(Continued)

*Primary Examiner* — Mounir S Amer
(74) *Attorney, Agent, or Firm* — Harness, Dickey & Pierce, P.L.C.

(57) ABSTRACT

A semiconductor memory device includes a body conductive layer that includes a cell array portion and a peripheral circuit portion, an electrode structure on the cell array portion of the body conductive layer, vertical structures that penetrate the electrode structure, a residual substrate on the peripheral circuit portion of the body conductive layer, and a connection conductive pattern penetrating the residual substrate. The electrode structure includes a plurality of electrode that are stacked on top of each other. The vertical structures are connected to the cell array portion of the body conductive layer. The connection conductive pattern is connected to the peripheral circuit portion of the body conductive layer.

20 Claims, 47 Drawing Sheets

(51) Int. Cl.
*H01L 27/11556* (2017.01)
*H01L 27/11575* (2017.01)
*H01L 27/11573* (2017.01)

(56) References Cited

U.S. PATENT DOCUMENTS

| | | | |
|---|---|---|---|
| 8,803,206 B1 | 8/2014 | Or-Bach et al. | |
| 9,130,052 B2 | 9/2015 | Kim et al. | |
| 9,190,472 B2 | 11/2015 | Tessariol et al. | |
| 9,236,426 B2 | 1/2016 | Lee | |
| 9,257,508 B2 | 2/2016 | Lee et al. | |
| 9,293,172 B2 | 3/2016 | Lee et al. | |
| 9,305,934 B1 | 4/2016 | Ding et al. | |
| 9,337,198 B2 | 5/2016 | Kwon et al. | |
| 9,356,043 B1 | 5/2016 | Sakakibara et al. | |
| 9,461,019 B2 | 10/2016 | Miyajima | |
| 9,502,432 B1 | 11/2016 | Shin | |
| 9,502,471 B1 | 11/2016 | Lu et al. | |
| 9,543,318 B1* | 1/2017 | Lu | H01L 27/11582 |
| 9,691,781 B1 | 6/2017 | Nishikawa et al. | |
| 9,953,925 B2 | 4/2018 | Or-Bach et al. | |
| 2006/0216886 A1 | 9/2006 | Jang et al. | |
| 2008/0067573 A1 | 3/2008 | Jang et al. | |
| 2008/0073635 A1 | 3/2008 | Kiyotoshi et al. | |
| 2009/0230449 A1 | 9/2009 | Sakaguchi et al. | |
| 2010/0109071 A1 | 5/2010 | Tanaka et al. | |
| 2011/0241101 A1 | 10/2011 | Ino et al. | |
| 2012/0108048 A1 | 5/2012 | Lim et al. | |
| 2012/0168831 A1 | 7/2012 | Ahn | |
| 2012/0168858 A1 | 7/2012 | Hong | |
| 2013/0065386 A1 | 3/2013 | Kim et al. | |
| 2013/0320424 A1 | 12/2013 | Lee et al. | |
| 2014/0061776 A1 | 3/2014 | Kwon et al. | |
| 2014/0061849 A1 | 3/2014 | Tanzawa | |
| 2014/0175533 A1* | 6/2014 | Kwon | H01L 29/66833 257/324 |
| 2014/0252426 A1 | 9/2014 | Huang et al. | |
| 2015/0079748 A1 | 3/2015 | Kim et al. | |
| 2015/0179660 A1 | 6/2015 | Yada et al. | |
| 2015/0221667 A1 | 8/2015 | Fukuzumi et al. | |
| 2015/0303214 A1 | 10/2015 | Kim et al. | |
| 2016/0079164 A1 | 3/2016 | Fukuzumi et al. | |
| 2016/0111436 A1 | 4/2016 | Ding et al. | |
| 2016/0133630 A1 | 5/2016 | Kim et al. | |
| 2016/0149004 A1 | 5/2016 | Rabkin et al. | |
| 2016/0329101 A1 | 11/2016 | Sakakibara | |
| 2017/0047403 A1 | 2/2017 | Oda | |
| 2017/0062461 A1 | 3/2017 | Takamatsu | |
| 2017/0104068 A1 | 4/2017 | Lee et al. | |
| 2017/0162592 A1* | 6/2017 | Nishikawa | H01L 27/11573 |
| 2017/0194057 A1 | 7/2017 | Lee et al. | |

OTHER PUBLICATIONS

U.S. Office Action dated Aug. 7, 2018 issued in co-pending U.S. Appl. No. 15/841,762.
U.S. Office Action dated May 8, 2019, issued in co-pending U.S. Appl. No. 15/841,762.
U.S. Appl. No. 15/841,762, filed Dec. 14, 2017.
Notice of Allowance dated Apr. 22, 2019, issued in co-pending U.S. Appl. No. 15/989,477.
Advisory Action dated Jul. 30, 2019, issued in co-pending U.S. Appl. No. 15/841,762.

* cited by examiner

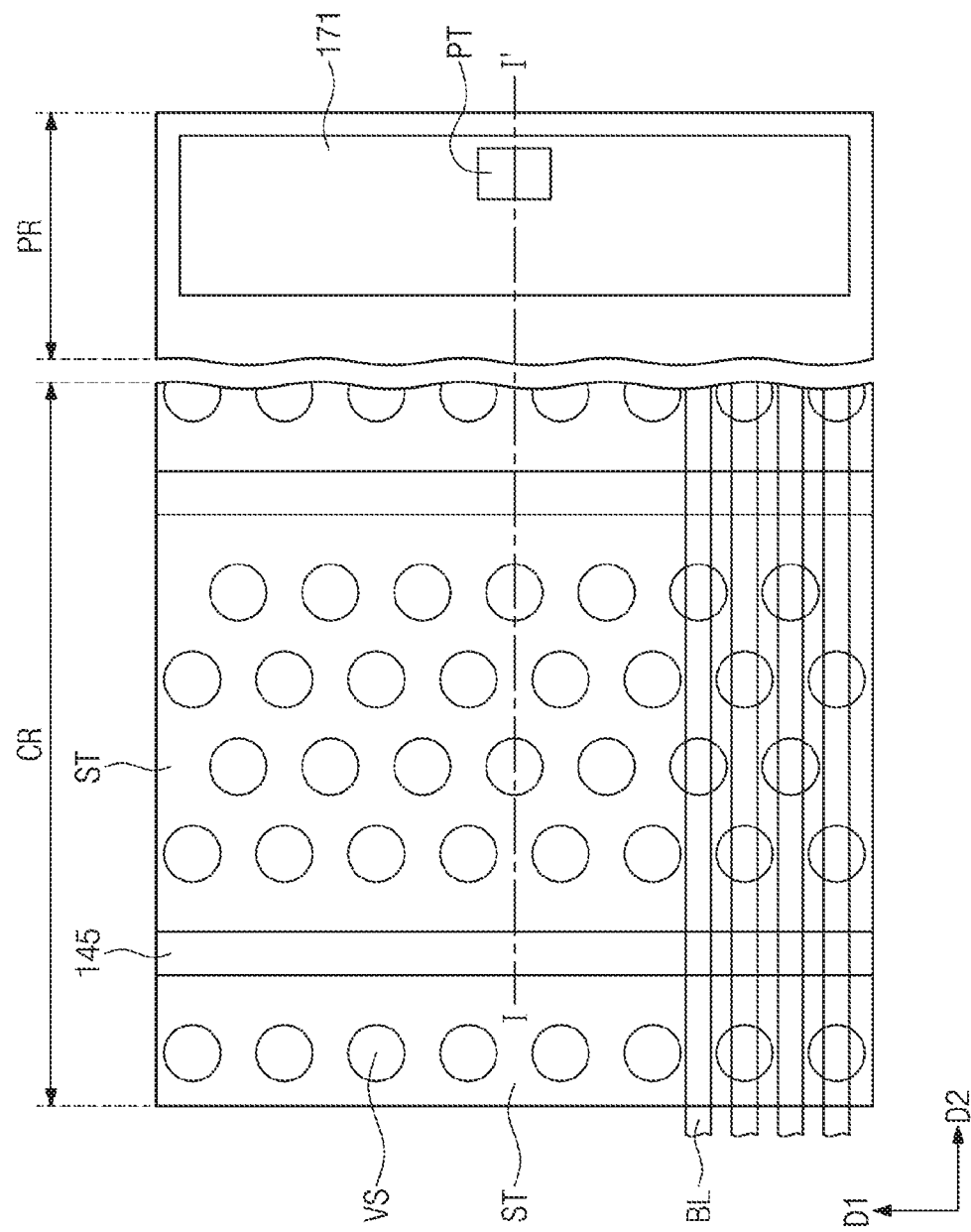

SEMICONDUCTOR MEMORY DEVICE AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2017-0073390 filed on Jun. 12, 2017 and Korean Patent Application No. 10-2017-0166233, filed on Dec. 5, 2017, in the Korean Intellectual Property Office, the disclosure of which is hereby incorporated by reference in its entirety.

BACKGROUND

Embodiments of inventive concepts relate to a semiconductor device and a method of manufacturing the same and, more particularly, to a three-dimensional (3D) non-volatile memory device and a method of manufacturing the same.

Semiconductor devices have been highly integrated to provide excellent performance and low manufacture costs. In particular, an integration density of memory devices may be an important factor determining costs thereof. The integration density of conventional two-dimensional (2D) semiconductor memory devices may be mainly determined by an area where a unit memory cell occupies. Therefore, the integration density of the conventional 2D semiconductor memory devices may be greatly affected by a technique of forming fine patterns. However, since extremely high-priced apparatuses are used to form fine patterns, the integration density of 2D semiconductor memory devices continues to increase but may be limited.

SUMMARY

Embodiments of inventive concepts may provide a semiconductor memory device with improved electrical characteristics and a method of manufacturing the same.

Embodiments of inventive concepts may also provide a semiconductor memory device capable of reducing a thickness and a method of manufacturing the same.

In an aspect, a semiconductor memory device may include a body conductive layer, an electrode structure, a vertical structure, a residual substrate, and connection conductive pattern. The body conductive layer may include a cell array portion and a peripheral circuit portion. The electrode structure may be on the cell array portion of the body conductive layer and may include a plurality of electrodes sequentially stacked on top of each other. The vertical structures may penetrate the electrode structure and may be connected to the cell array portion of the body conductive layer. The residual substrate may be on the peripheral circuit portion of the body conductive layer. The connection conductive pattern may penetrate the residual substrate and may be connected to the peripheral circuit portion of the body conductive layer.

In an aspect, a semiconductor memory device may include a body conductive layer, an electrode structure, vertical structures, a residual substrate, and connection conductive pattern. The body conductive layer may include a cell array portion and a peripheral circuit portion. The cell array portion may correspond to a cell array region of the semiconductor memory device. The peripheral circuit portion may correspond to a peripheral circuit region of the semiconductor memory device. The electrode structure may be on the cell array portion of the body conductive layer. The electrode structure may include a plurality of electrodes sequentially stacked on top of each other. The vertical structures may penetrate the electrode structure and may be connected to the cell array portion of the body conductive layer. The residual substrate may be on the peripheral circuit portion of the body conductive layer. The connection conductive pattern may penetrate the residual substrate and may be connected to the body conductive layer. A bottom surface of the connection conductive pattern may be at substantially a same level as bottom surfaces of the vertical structures.

In an aspect, a method of manufacturing a semiconductor memory device may include forming a connection conductive pattern in an upper portion of a peripheral circuit region of a substrate that includes a cell array region and the peripheral circuit region, removing an upper portion of the substrate in the cell array region to expose a lower portion of the substrate in the cell array region, forming vertical structures connected to the lower portion of the substrate in the cell array region, removing the lower portion of the substrate to expose bottoms of the vertical structures and a bottom of the connection conductive pattern, and forming a body conductive layer connected to the bottoms of the vertical structures and the bottom of the connection conductive pattern.

BRIEF DESCRIPTION OF THE DRAWINGS

Inventive concepts will become more apparent in view of the attached drawings and accompanying detailed description.

FIG. 5 is a plan view illustrating a semiconductor memory device according to some embodiments of inventive concepts.

DETAILED DESCRIPTION

Embodiments of inventive concepts will be described hereinafter in detail with reference to the accompanying drawings.

Figure 1:
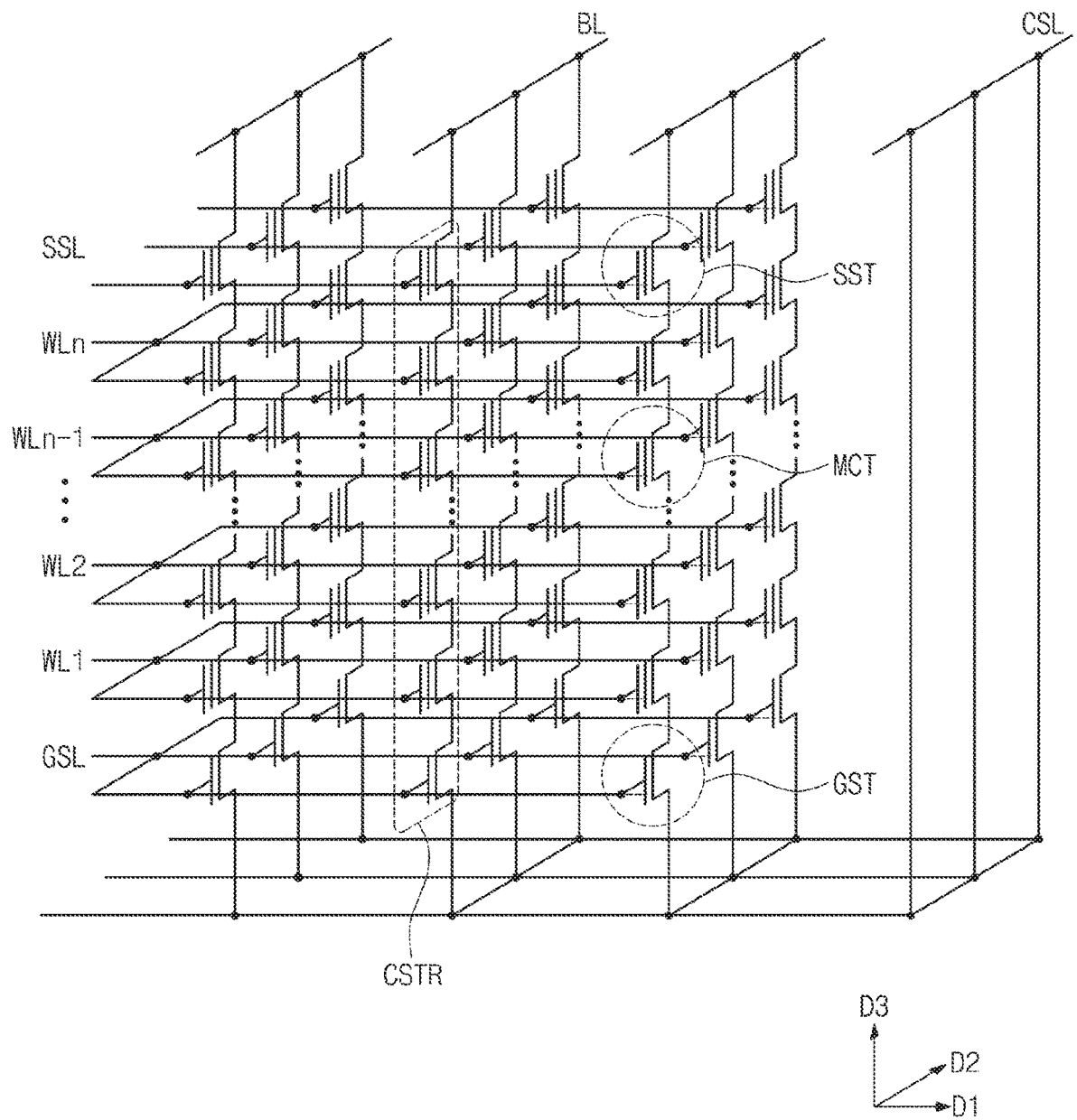
FIG. 1 is a schematic circuit diagram illustrating a cell array of a semiconductor memory device according to some embodiments of inventive concepts.

FIG. 1 is a schematic circuit diagram illustrating a cell array of a semiconductor memory device according to some embodiments of inventive concepts.

Referring to FIG. 1, a cell array of a semiconductor memory device according to some embodiments may include a common source line CSL, a plurality of bit lines BL, and a plurality of cell strings CSTR connected between the common source line CSL and the bit lines BL.

The common source line CSL may be a conductive layer disposed on a substrate or a dopant region formed in the substrate. The bit lines BL may be conductive patterns (e.g., metal lines) vertically spaced apart from the substrate. The bit lines BL may be two-dimensionally arranged and a plurality of the cell strings CSTR may be connected in parallel to each of the bit lines BL. The cell strings CSTR may be connected in common to the common source line CSL. In other words, a plurality of the cell strings CSTR may be disposed between the common source line CSL and the plurality of bit lines BL. In some embodiments, the common source line CSL may be provided in plurality. In some embodiments, the same voltage may be applied to the plurality of common source lines CSL. In certain embodiments, the common source lines CSL may be electrically controlled independently of each other.

Each of the cell strings CSTR may include a ground selection transistor GST connected to the common source line CSL, a string selection transistor SST connected to the bit line BL, and a plurality of memory cell transistors MCT disposed between the ground and string selection transistors GST and SST. The ground selection transistor GST, the memory cell transistors MCT and the string selection transistor SST may be connected in series to each other.

The common source line CSL may be connected in common to sources of the ground selection transistors GST. A ground selection line GSL, a plurality of word lines WL1 to WLn and a string selection line SSL which are disposed between the common source line CSL and the bit lines BL may be used as a gate electrode of the ground selection transistor GST, gate electrodes of the memory cell transistors MCT, and a gate electrode of the string selection transistor SST, respectively. Each of the memory cell transistors MCT may include a data storage element.

In some embodiments, the ground selection line GSL, word lines WL1 to WLn, and string selection line SSL may extend in a first direction D1. The bit line BL may extend in a second direction D2 crossing the first direction D1. The memory cell transistors MCT in a same string may be stacked on top of each other in a third direction D3 that crosses the first direction D1 and the second direction D2.

Figure 2A:
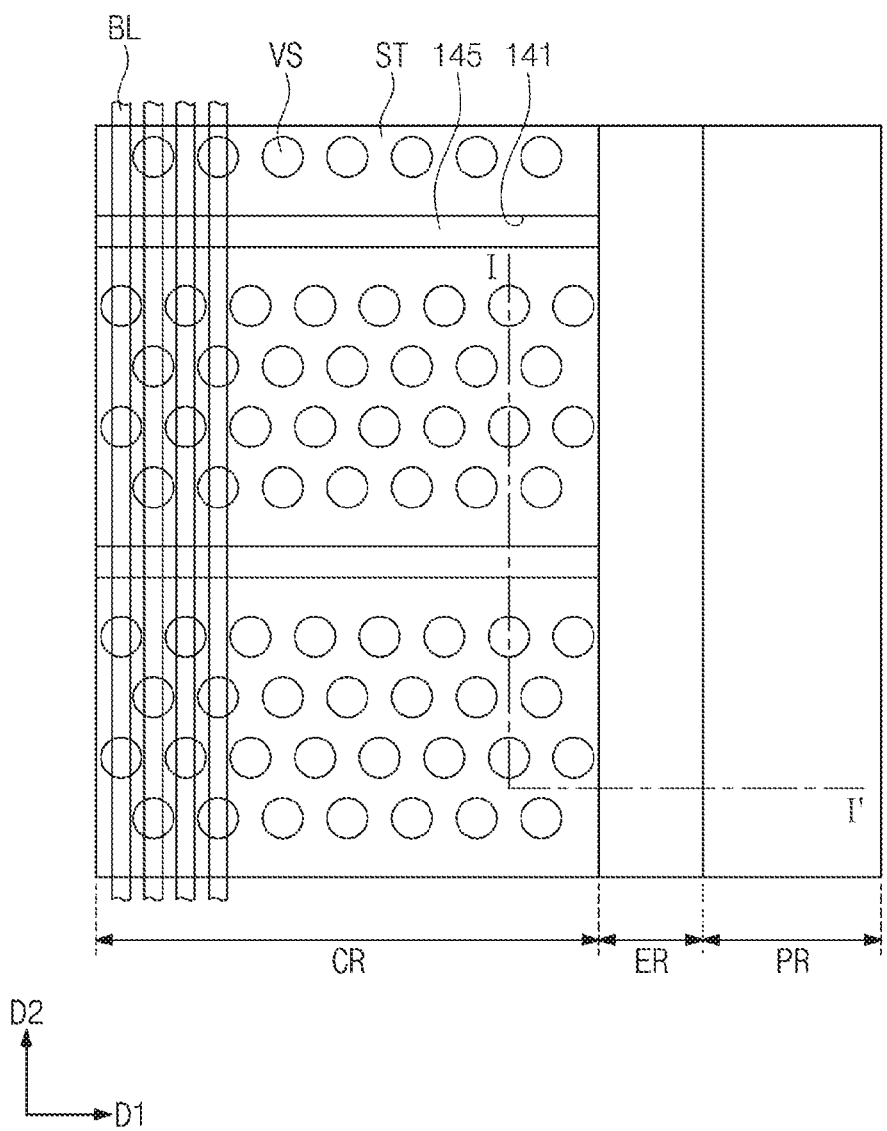
FIG. 2A is a plan view illustrating a semiconductor memory device according to some embodiments of inventive concepts.
Figure 2B:
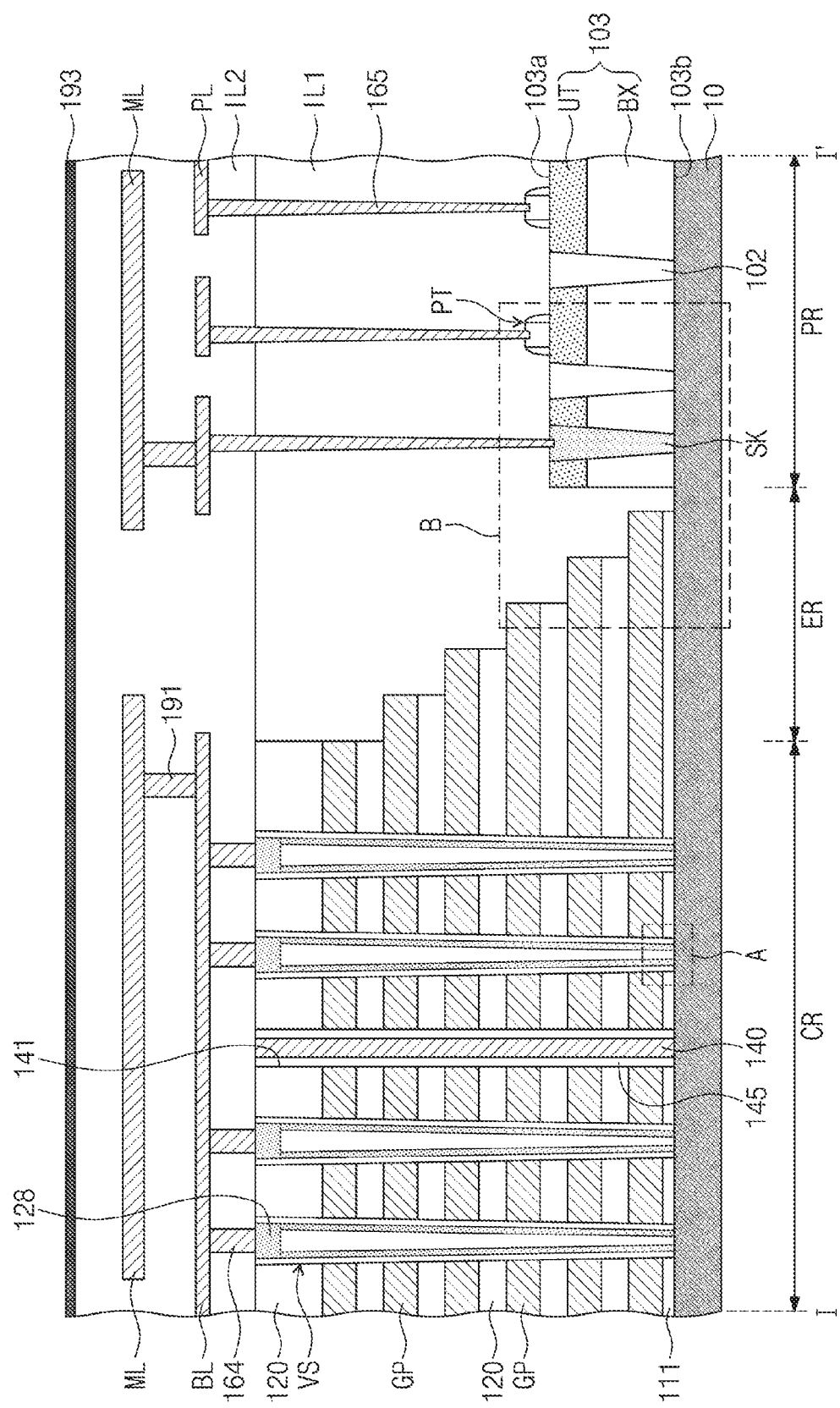
FIG. 2B is a cross-sectional view taken along a line I-I' of FIG. 2A.
Figure 3A:
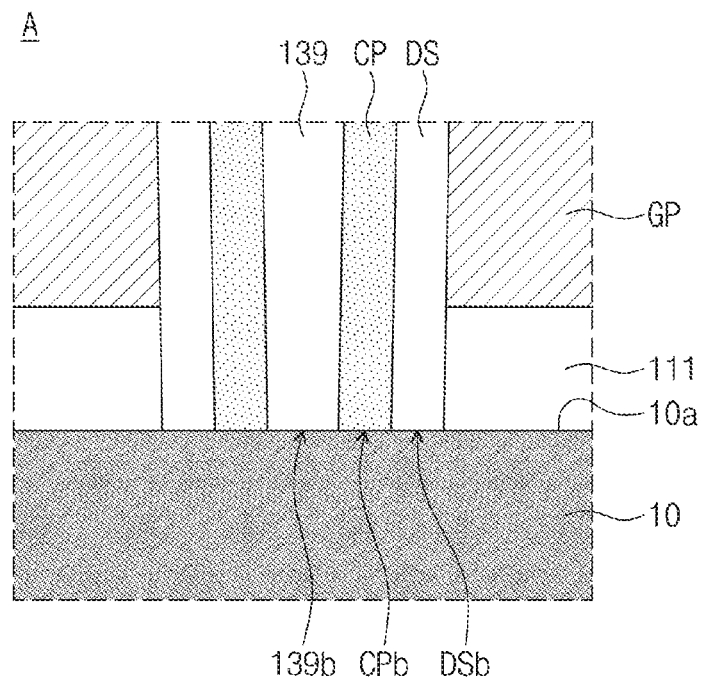
FIGS. 3A and 3B are enlarged views of a region 'A' of FIG. 2B to illustrate semiconductor memory devices according to some embodiments of inventive concepts.
Figure 3B:
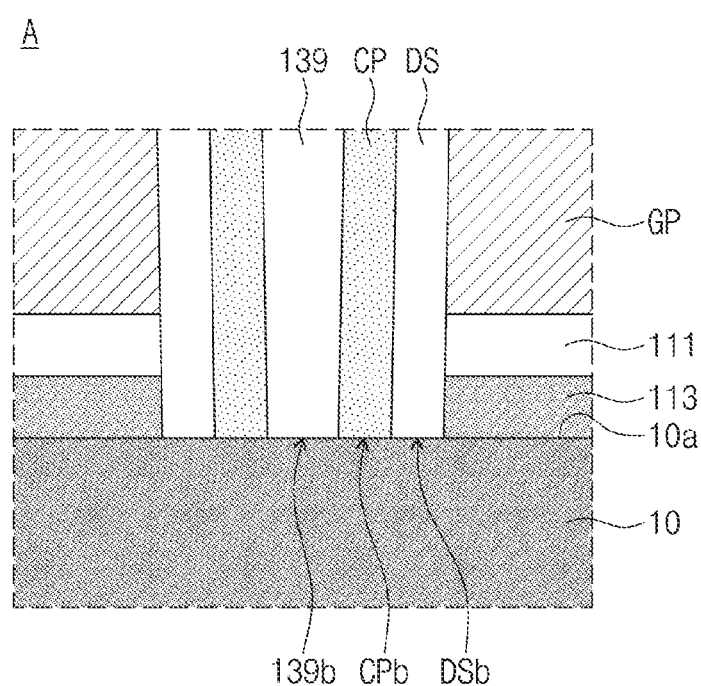
Figure 4A:
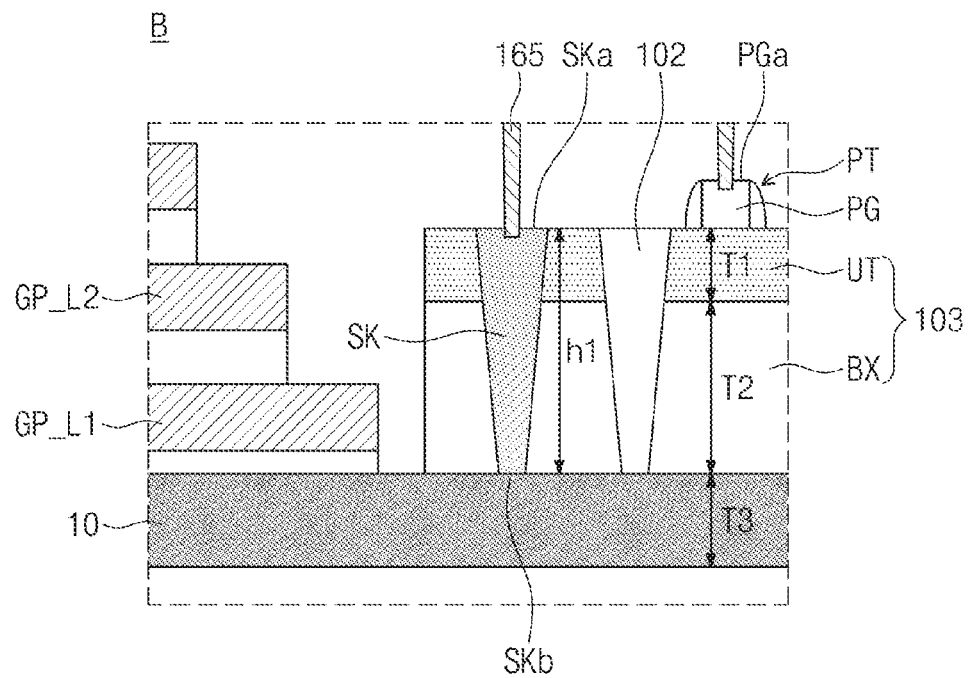
FIG. 4A is an enlarged view of a region 'B' of FIG. 2B.

FIG. 2A is a plan view illustrating a semiconductor memory device according to some embodiments of inventive concepts. FIG. 2B is a cross-sectional view taken along a line I-I' of FIG. 2A. FIGS. 3A and 3B are enlarged views of a region 'A' of FIG. 2B to illustrate semiconductor memory devices according to some embodiments of inventive concepts. FIG. 4A is an enlarged view of a region 'B' of FIG. 2B.

Referring to FIGS. 2A, 2B, 3A, 3B and 4A, a semiconductor memory device according to some embodiments may include a cell array region CR, a connection region ER, and a peripheral circuit region PR. In some embodiments, the semiconductor memory device may be a flash memory device. A plurality of memory cells may be provided in the cell array region CR. In some embodiments, the cell array of FIG. 1 may be provided in the cell array region CR.

The peripheral circuit region PR may be a region in which a word line driver, a sense amplifier, row and column decoders and control circuits are disposed. The peripheral circuit region PR disposed at one side of the cell array region CR is illustrated as an example in FIG. 2A for the purpose of ease and convenience in explanation. Alternatively, the peripheral circuit region PR may be additionally disposed at other side(s) of the cell array region CR. In some embodiments, the peripheral circuit region PR may surround the cell array region CR when viewed in a plan view.

The connection region ER may be a region in which connection pads for electrical connection of gate electrodes to be described below are provided. The connection pads may be end portions of the gate electrodes and may constitute a stepped shape.

A residual substrate 103 may be provided in the peripheral circuit region PR, and peripheral transistors PT may be provided on the residual substrate 103. The peripheral transistors PT may include gate electrodes PG and a gate insulation layer. The peripheral transistors PT may include a PMOS transistor and/or an NMOS transistor.

The residual substrate 103 may include a buried insulation layer BX and a peripheral active layer UT on the buried insulation layer BX. The residual substrate 103 may be a portion of a semiconductor-on-insulator substrate. For example, the residual substrate 103 may have a structure obtained by removing a lower semiconductor layer from a silicon-on-insulator (SOI) substrate. The residual substrate 103 may further include a device isolation layer 102 that penetrates the peripheral active layer UT and the buried insulation layer BX. For example, the device isolation layer 102 may include silicon oxide. A sidewall of the buried insulation layer BX may face a sidewall of at least one of gate electrodes to be described below.

The residual substrate 103 may include a top surface 103a on which the gate electrodes PG of the peripheral transistors PT are formed, and a bottom surface 103b which is opposite to the top surface 103a. In some embodiments, a distance between the top surface 103a and the bottom surface 103b of the residual substrate 103 (e.g., a thickness of the residual substrate 103) may range from about 50 nm to 1000 μm.

The peripheral active layer UT may be a substantially single-crystalline silicon layer. In the present specification, the term 'substantial single-crystal' may mean that a grain boundary does not exist in a corresponding layer or portion but the corresponding layer or portion has the same crystal orientation. In addition, the term 'substantial single-crystal' may also mean that the corresponding layer or portion is virtually single-crystalline even though a grain boundary locally exists in the corresponding layer or portion or even though a portion having a different crystal orientation locally exists in the corresponding layer or portion. For example, a substantially single-crystalline layer may include a plurality of low angle grain boundaries.

A source region, a drain region and a channel region of the peripheral transistor PT may be formed in the peripheral active layer UT. For example, the peripheral active layer UT may include the source and drain regions doped with P-type or N-type dopants on the basis of a kind of the peripheral transistor PT.

According to some embodiments of inventive concepts, the peripheral circuit region PR may include a body conductive layer 10 disposed under the residual substrate 103. The body conductive layer 10 may be in contact with the bottom surface 103b of the residual substrate 103. However, embodiments of inventive concepts are not limited thereto. The body conductive layer 10 may include a semiconductor material and/or a metal material. For example, the body conductive layer 10 may include a poly-crystalline semiconductor layer such as a poly-silicon layer. However, the material of the body conductive layer 10 is not limited to the silicon layer. In certain embodiments, the body conductive layer 10 may include a germanium layer or a silicon-germanium layer. The body conductive layer 10 may also be provided in the cell array region CR as well as the peripheral circuit region PR. The body conductive layer 10 may have a first conductivity type. For example, the first conductivity type may be a P-type. The body conductive layer 10 may also be referred to as including a cell array portion that corresponds to the cell array region CR, a peripheral circuit portion that corresponds to the peripheral circuit region PR, and a connection portion that corresponds to the connection region ER.

Interlayer dielectric layers IL1 and IL2 may be provided to cover the peripheral transistors PT. For example, each of the interlayer dielectric layers IL1 and IL2 may include a silicon oxide layer and/or a silicon oxynitride layer. A material of the interlayer dielectric layer IL1 may be the same as or different than a material of the interlayer dielectric layer IL2. Peripheral contacts 165 may penetrate the interlayer dielectric layers IL1 and/or IL2. Some of the peripheral contacts 165 may be connected to the peripheral transistor PT. A peripheral line PL may be provided in an upper interlayer dielectric layer IL2 and may be connected to the peripheral contact 165. The peripheral contact 165 and the peripheral line PL may include a conductive material such as doped silicon, a metal, and/or a conductive metal nitride.

The cell array region CR may include electrode structures ST, each of which includes gate electrodes GP sequentially stacked on the body conductive layer 10. Insulation layers 120 may be provided between the gate electrodes GP. In other words, the gate electrodes GP and the insulation layers 120 may be alternately and repeatedly stacked on the body conductive layer 10. A buffer layer 111 may be provided between the body conductive layer 10 and a lowermost one of the gate electrodes GP. For example, the insulation layers 120 and the buffer layer 111 may include a silicon oxide layer and/or a silicon oxynitride layer. The buffer layer 111 may be thinner than the insulation layers 120.

In some embodiments, the lowermost gate electrode may correspond to a gate electrode of a ground selection transistor (e.g., at least a portion of the ground selection line GSL of FIG. 1), and an uppermost gate electrode may correspond to a gate electrode of a string selection transistor (e.g., at least a portion of the string selection line SSL of FIG. 1). The gate electrodes between the lowermost gate electrode and the uppermost gate electrode may correspond to cell gate electrodes (e.g., at least portions of the word lines WL1 to WLn of FIG. 1). Six gate electrodes GP are illustrated in FIG. 2B. However, embodiments of inventive concepts are not limited thereto. In certain embodiments, the number of the gate electrodes GP included in the electrode structure ST may be seven or more or may be five or less.

Each of the gate electrodes GP in the electrode structures ST may extend in the first direction D1. The electrode structures ST may be spaced apart from each other in the second direction D2 with separation patterns 145 interposed therebetween. In other words, separation trenches 141 may be provided between the electrode structures ST, and the separation patterns 145 may be provided in the separation trenches 141, respectively. Each of the separation patterns 145 may extend in the first direction D1. For example, the separation patterns 145 may include at least one of a silicon oxide layer, a silicon nitride layer, or a silicon oxynitride layer.

Common source lines 140 may penetrate the separation patterns 145 so as to be connected to the body conductive layer 10. In some embodiments, each of the common source lines 140 may have a plate shape extending in the first direction D1 when viewed in a cross-sectional view. Alternatively, the common source lines 140 may include a plurality of contacts penetrating one separation pattern 145.

The common source lines 140 may include at least one of doped silicon, a metal, or a conductive metal nitride. In some embodiments, when the common source lines 140 include doped silicon, the common source lines 140 may have a second conductivity type different from the first conductivity type of the body conductive layer 10. For example, the second conductivity type may be an N-type. In certain embodiments, when the common source lines 140 include a metal material such as tungsten, titanium, tantalum, and/or any nitride thereof, a metal silicide layer (e.g., a tungsten silicide layer) may be additionally provided between the body conductive layer 10 and each of the common source lines 140.

Vertical structures VS may penetrate the electrode structures ST so as to be connected to the body conductive layer 10. Each of the vertical structures VS may have a cylindrical shape of which a width becomes progressively less from a top toward a bottom thereof. The vertical structures VS may be two-dimensionally arranged on the body conductive layer 10. In the present specification, the term 'two-dimensional arrangement' may mean that corresponding elements or components are arranged in the first and second directions D1 and D2 perpendicular to each other to constitute a plurality of rows and a plurality of columns when viewed in a plan view. For example, a plurality of the vertical structures VS arranged in the first direction D1 may constitute one column, and the vertical structures VS of a plurality of the columns may be disposed in one electrode structure ST. In some embodiments, the vertical structures VS of four columns may be disposed in one electrode structure ST, as illustrated in FIG. 2A. However, embodiments of inventive concepts are not limited thereto. In certain embodiments, the vertical structures VS of the columns of which the number is less or greater than 4 may be disposed in one electrode structure ST. In some embodiments, the vertical structures VS constituting odd-numbered columns may be disposed to be offset from the vertical structures VS constituting even-numbered columns in the first direction D1.

As illustrated in FIGS. 3A and 3B, each of the vertical structures VS may include a filling insulation layer 139, a channel semiconductor layer CP, and a data storage layer DS. In some embodiments, the filling insulation layer 139 may have a shape similar to a cylinder, and the channel semiconductor layer CP and the data storage layer DS may be sequentially provided on a sidewall of the filling insulation layer 139. Alternatively, the filling insulation layer 139 may be omitted. For example, the filling insulation layer 139 may include a silicon oxide layer. The channel semiconductor layer CP may include a poly-crystalline semiconductor material. The channel semiconductor layer CP may be in an intrinsic state corresponding to an undoped state or may be lightly doped with dopants of the first or second conductivity type. For example, the channel semiconductor layer CP may include a poly-crystalline silicon layer. Alternatively, the channel semiconductor layer CP may include germanium or silicon-germanium. In certain embodiments, a conductive layer (e.g., a metal, a conductive metal nitride, or a silicide) or a nano-structure (e.g., carbon nanotube or graphene) may be provided in place of the channel semiconductor layer CP. The channel semiconductor layer CP may have a pipe shape of which a bottom is opened.

The data storage layer DS may include a blocking insulation layer adjacent to the gate electrodes GP, a tunnel insulation layer adjacent to the channel semiconductor layer CP, and a charge storage layer disposed between the blocking insulation layer and the tunnel insulation layer. The blocking insulation layer may include a high-k dielectric layer (e.g., an aluminum oxide layer or a hafnium oxide layer). In some embodiments, the blocking insulation layer may be a multi-layer including a plurality of layers. For example, the blocking insulation layer may include a first blocking insulation layer and a second blocking insulation layer, and each of the first and second blocking insulation layers may include an aluminum oxide layer and/or a hafnium oxide layer. All of the first and second blocking insulation layers may vertically extend along the channel semiconductor layer CP. Alternatively, a portion of the first blocking insulation layer may extend between the gate electrodes GP and the insulation layers 120.

The charge storage layer may include a charge trap layer or an insulation layer including conductive nano-dots. The charge trap layer may include, for example, a silicon nitride layer. The tunnel insulation layer may include a silicon oxide layer and/or a high-k dielectric layer (e.g., a hafnium oxide layer or an aluminum oxide layer). The charge storage layer and the tunnel insulation layer may vertically extend along the channel semiconductor layer CP.

As illustrated in FIGS. 3A and 3B, a bottom surface DSb of the data storage layer DS, a bottom surface CPb of the channel semiconductor layer CP and a bottom surface 139b of the filling insulation layer 139 may be disposed at substantially the same level and/or may be disposed on substantially the same plane. In some embodiments, the bottom surface DSb of the data storage layer DS, the bottom surface CPb of the channel semiconductor layer CP and the bottom surface 139b of the filling insulation layer 139 may be in contact with a top surface 10a of the body conductive layer 10. In certain embodiments, level differences may exist among the bottom surface DSb of the data storage layer DS, the bottom surface CPb of the channel semiconductor layer CP and the bottom surface 139b of the filling insulation layer 139, depending on a kind of a planarization process to be described later.

The bottom surface CPb of the channel semiconductor layer CP and the top surface 10a of the body conductive layer 10 may be substantially the same surface. An interface between the channel semiconductor layer CP and the body conductive layer 10 may be observed. However, embodiments of inventive concepts are not limited thereto. As illustrated in FIG. 3A, a bottom surface of the buffer layer 111 may be in contact with the top surface 10a of the body conductive layer 10 and may be disposed at substantially the same level as the bottom surface DSb of the data storage layer DS, the bottom surface CPb of the channel semiconductor layer CP and the bottom surface 139b of the filling insulation layer 139. Alternatively, as illustrated in FIG. 3B, an etch stop layer 113 may be provided between the buffer layer 111 and the body conductive layer 10. A bottom surface of the etch stop layer 113 may be in contact with the top surface 10a of the body conductive layer 10 and may be disposed at substantially the same level as the bottom surface DSb of the data storage layer DS, the bottom surface CPb of the channel semiconductor layer CP and the bottom surface 139b of the filling insulation layer 139. For example, the etch stop layer 113 may include a metal oxide layer such as an aluminum oxide layer.

The vertical structures VS may include pad patterns 128 in upper portions thereof. The pad patterns 128 may include doped poly-silicon or a metal. Sidewalls of the pad patterns 128 may be in contact with inner sidewalls of the data storage layers DS.

Bit lines BL may be provided on the vertical structures VS. Each of the bit lines BL may be connected in common to a plurality of the vertical structures VS. Some of the bit lines BL are illustrated in FIG. 2A for the purpose of ease and convenience in explanation and illustration. The bit lines BL may be electrically connected to the vertical structures VS through bit line contacts 164. The method of connecting the bit lines BL to the vertical structures VS is not limited to FIGS. 2A and 2B but may be variously modified. In certain embodiments, sub-bit lines may be provided between the bit lines BL and the bit line contacts 164. The bit lines BL and the bit line contacts 164 may include at least one of a metal (e.g., tungsten, copper, or aluminum), a conductive metal nitride (e.g., titanium nitride or tantalum nitride), or a transition metal (e.g., titanium or tantalum).

As illustrated in FIG. 4A, a thickness T3 of the body conductive layer 10 may be less than the thickness of the residual substrate 103. In some embodiments, a thickness T2 of the buried insulation layer BX may be greater than the thickness T3 of the body conductive layer 10. For example, the thickness T2 of the buried insulation layer BX may range from about 1.5 times to about 5 times the thickness T3 of the body conductive layer 10. The thickness T2 of the buried insulation layer BX may be greater than a thickness T1 of the peripheral active layer UT. For example, the thickness T2 of the buried insulation layer BX may range from about 1.5 times to about 5 times the thickness T1 of the peripheral active layer UT. The thickness T3 of the body conductive layer 10 may be greater than the thickness T1 of the peripheral active layer UT. For example, the thickness T3 of the body conductive layer 10 may range from about 1.1 times to about 3 times the thickness T1 of the peripheral active layer UT.

The top surface 103a of the residual substrate 103 may be higher than the lowermost one of the gate electrodes GP and may be lower than the uppermost one of the gate electrodes GP. For example, a height of the top surface of the peripheral active layer UT may be higher than a height of a top surface of a first gate electrode GP_L1, closest to the body conductive layer 10, of the gate electrodes GP. For example, the first gate electrode GP_L1 may be a lower selection gate electrode. In some embodiments, the height of the top surface of the peripheral active layer UT may be higher than a height of a top surface of a second gate electrode GP_L2, next closest to the body conductive layer 10, of the gate electrodes GP. Alternatively, the height of the top surface of the peripheral active layer UT may be lower than the height of the top surface of the second gate electrode GP_L2.

A connection conductive pattern SK may penetrate the residual substrate 103 so as to be connected to the body conductive layer 10. For example, the connection conductive pattern SK may penetrate the peripheral active layer UT and the buried insulation layer BX. The connection conductive pattern SK may be provided in the peripheral circuit region PR. The connection conductive pattern SK may include at least one of a doped semiconductor material, a metal, or a conductive metal nitride. In some embodiments, the connection conductive pattern SK may have the same conductivity type (e.g., the first conductivity type) as the body conductive layer 10. For example, the connection conductive pattern SK may include poly-crystalline silicon doped with P-type dopants. A width of a lower portion of the connection conductive pattern SK may be less than a width of an upper portion of the connection conductive pattern SK. For example, a width of a top surface SKa of the connection conductive pattern SK may be greater than a width of a bottom surface SKb of the connection conductive pattern SK. This shape of the connection conductive pattern SK may be determined depending on an etch profile of a hole region in which the connection conductive pattern SK is provided.

The bottom surface SKb of the connection conductive pattern SK may be in contact with the top surface of the body conductive layer 10. For example, a height of the bottom surface SKb of the connection conductive pattern SK may be substantially the same as a height of the top surface of the body conductive layer 10. The bottom surface SKb of the connection conductive pattern SK may be disposed at substantially the same level as bottom surfaces of the vertical structures VS. For example, the bottom surface SKb of the connection conductive pattern SK may be disposed at substantially the same level as the bottom surface DSb of the data storage layer DS, the bottom surface CPb of the channel semiconductor layer CP, and the bottom surface 139b of the filling insulation layer 139.

The top surface SKa of the connection conductive pattern SK may be disposed at substantially the same level as the top surface of the residual substrate 103. For example, a vertical length h1 of the connection conductive pattern SK may be substantially equal to the thickness of the residual substrate 103.

The connection conductive pattern SK may be connected to at least one of the peripheral contacts 165. In some embodiments, a desired (and/or alternatively predetermined) voltage may be supplied to the body conductive layer 10 through the peripheral contact 165 and the connection conductive pattern SK when the semiconductor memory device is operated. For example, the desired (and/or alternatively predetermined) voltage may be an erasing voltage.

Upper interconnection lines ML may be provided on the bit lines BL and the peripheral line PL. The upper interconnection lines ML may be connected to the bit lines BL and/or the peripheral line PL through upper contacts 191. The upper interconnection lines ML and the upper contacts 191 may include a metal or a conductive metal nitride.

A protective layer 193 may be provided on the upper interconnection lines ML. The protective layer 193 may cover the upper interlayer dielectric layer IL2. For example, the protective layer 193 may include a silicon nitride layer or a silicon oxynitride layer. An opening may penetrate the protective layer 193 to expose the upper interconnection lines ML. However, illustration of the opening is omitted for the purpose of ease and convenience in explanation and illustration.

The semiconductor memory device according to some embodiments of inventive concepts may include the connection conductive pattern SK connected to the body conductive layer 10. A desired (and/or alternatively predetermined) voltage may be applied to the body conductive layer 10 through the connection conductive pattern SK. In addition, the residual substrate 103 may not be provided in the cell array region CR and the connection region ER of the semiconductor memory device according to some embodiments of inventive concepts. The vertical structures VS may be connected to the common source lines 140 through the body conductive layer 10 having a relatively thin thickness. As a result, according to some embodiments of inventive concepts, a thickness of the semiconductor memory device may be reduced. Thus, an integration density of the semiconductor memory device may be increased by increasing the number of the gate electrodes stacked in the semiconductor memory device and/or the number of a gate stack including a plurality of the gate electrodes.

FIGS. 4B to 4F are enlarged cross-sectional views corresponding to the region 'B' of FIG. 2B to illustrate semiconductor memory devices according to some embodiments of inventive concepts. Hereinafter, the descriptions to the same elements or components as in the above embodiments will be omitted for the purpose of ease and convenience in explanation.

Figure 4B:
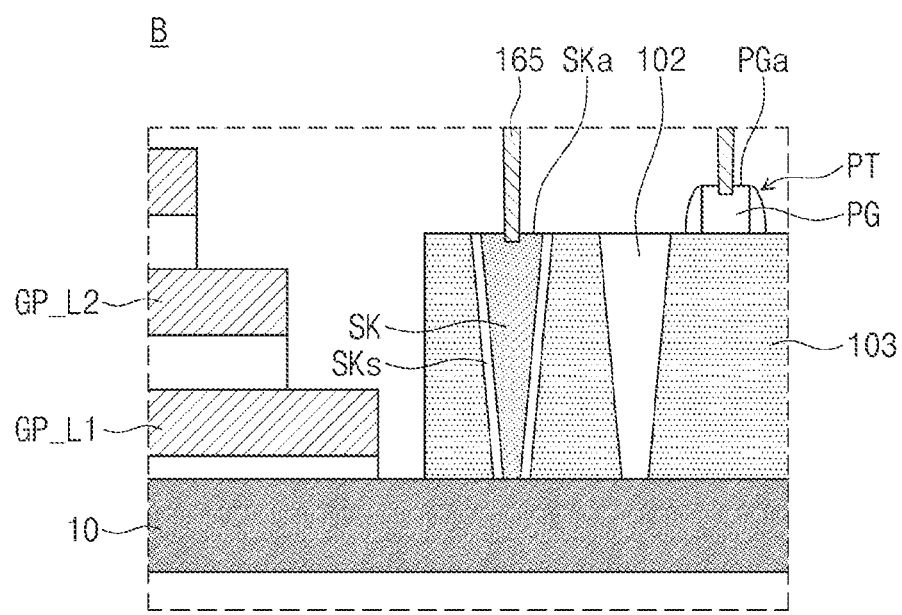
FIGS. 4B to 4F are enlarged cross-sectional views corresponding to the region 'B' of FIG. 2B to illustrate semiconductor memory devices according to some embodiments of inventive concepts.

Referring to FIG. 4B, a residual substrate 103 of a semiconductor memory device according to the present embodiment may not include a buried insulation layer, unlike FIG. 4A. For example, the residual substrate 103 may be a single-crystalline silicon layer not having the buried insulation layer. The semiconductor memory device according to some embodiments of inventive concepts may include an insulating spacer SKs disposed between the connection conductive pattern SK and the residual substrate 103. The insulating spacer SKs may include at least one of silicon oxide, silicon oxynitride, or silicon nitride. The connection conductive pattern SK may be electrically isolated from the residual substrate 103 by the insulating spacer SKs.

Figure 4C:
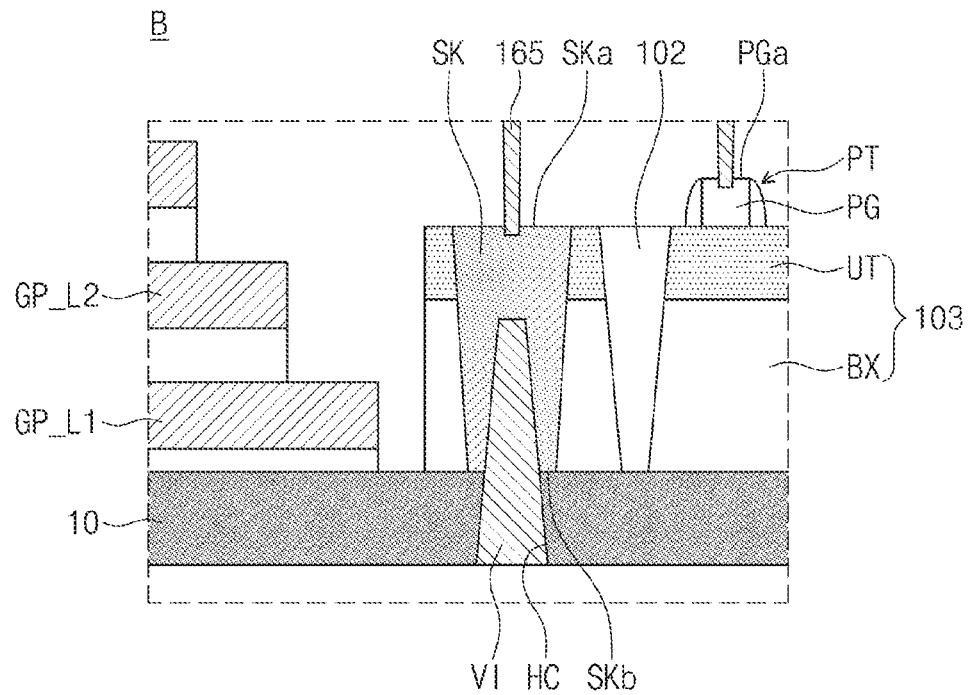

Referring to FIG. 4C, a semiconductor memory device according to the present embodiment may include a through-electrode VI that penetrates the body conductive layer 10 so as to be connected to the connection conductive pattern SK. The through-electrode VI may be formed of at least one of a metal, a conductive metal nitride, or a doped semiconductor material. The connection conductive pattern SK is connected to the through-electrode VI and the peripheral contact 165 in FIG. 4C. Alternatively, the connection conductive pattern SK may not be connected to the peripheral contact 165. The through-electrode VI may be provided in a contact hole HC penetrating the body conductive layer 10. A width of a lower portion of the through-electrode VI may be greater than a width of an upper portion of the through-electrode VI. A desired (and/or alternatively predetermined)

voltage may be applied to a portion of the peripheral active layer UT through the through-electrode VI and the connection conductive pattern SK.

Figure 4D:
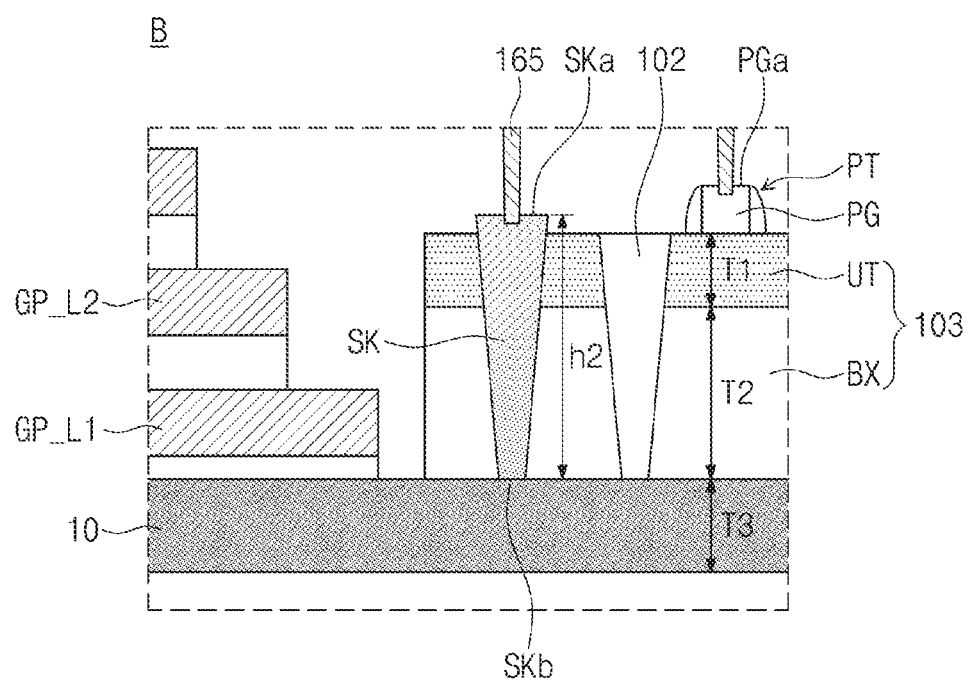
Figure 4E:
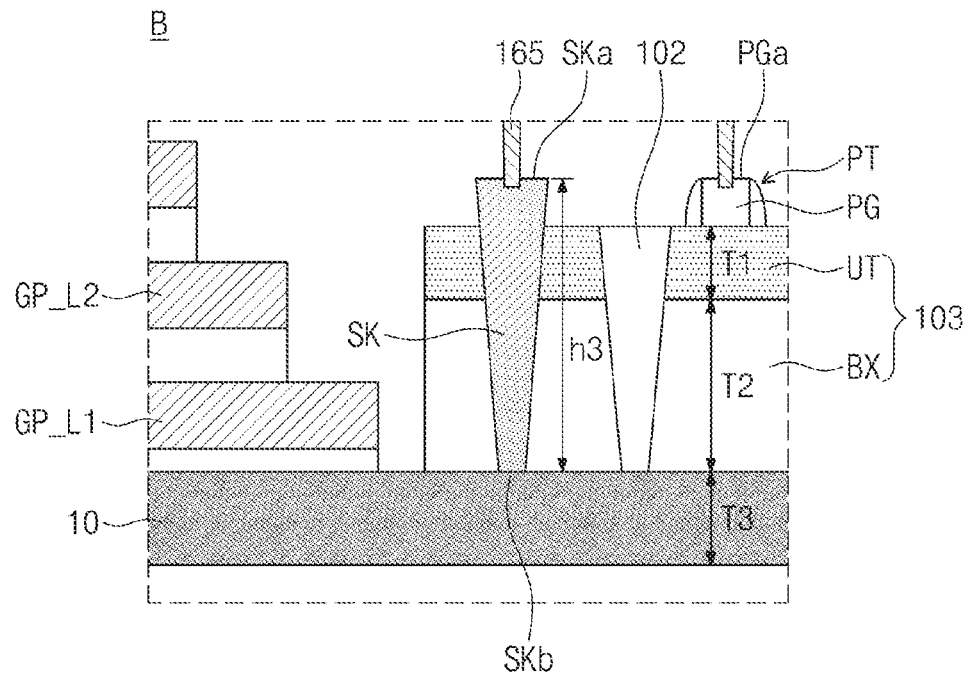
Figure 4F:
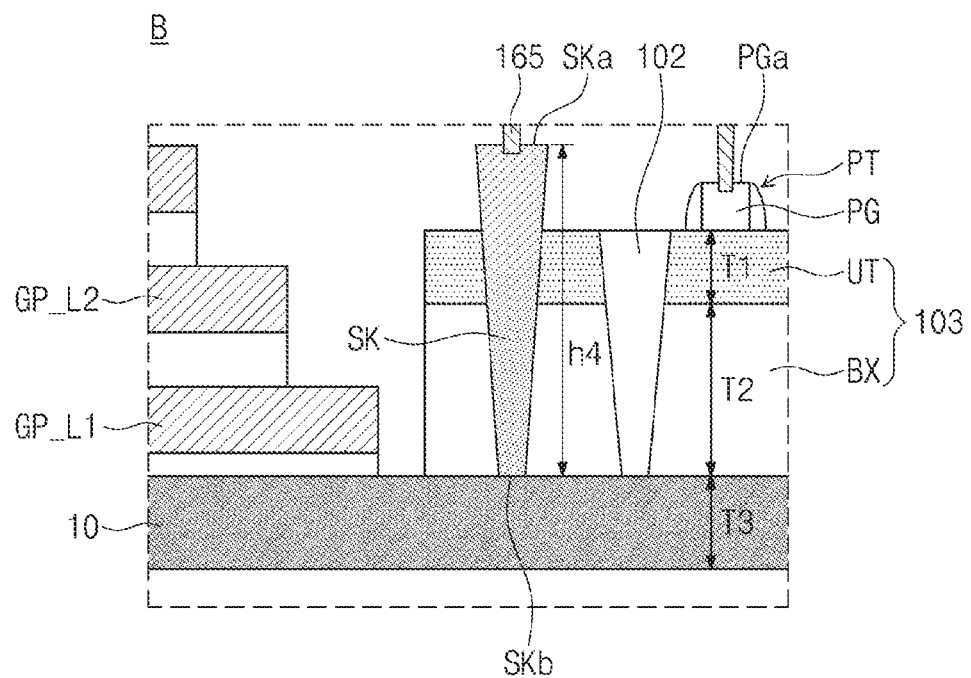

Referring to FIGS. 4D, 4E and 4F, a top surface SKa of the connection conductive pattern SK may be higher than the top surface of the residual substrate 103. In some embodiments, as illustrated in FIG. 4D, the top surface SKa of the connection conductive pattern SK may be lower than a top surface PGa of the gate electrode PG of the peripheral transistor PT. A vertical length h2 of the connection conductive pattern SK may be greater than the thickness of the residual substrate 103. In some embodiments, as illustrated in FIG. 4E, the top surface SKa of the connection conductive pattern SK may be disposed at substantially the same level as the top surface PGa of the gate electrode PG of the peripheral transistor PT. A vertical length h3 of the connection conductive pattern SK may be greater than the thickness of the residual substrate 103. In some embodiments, as illustrated in FIG. 4F, the top surface SKa of the connection conductive pattern SK may be higher than the top surface PGa of the gate electrode PG of the peripheral transistor PT. A vertical length h4 of the connection conductive pattern SK may be greater than the thickness of the residual substrate 103. The height of the top surface SKa of the connection conductive pattern SK and the vertical length of the connection conductive pattern SK may be determined depending on the formation time of the connection conductive pattern SK, and these will be described in more detail in the following manufacturing method.

FIG. 5 is a plan view illustrating a semiconductor memory device according to some embodiments of inventive concepts. FIGS. 6 to 14 are cross-sectional views taken along a line I-I' of FIG. 5 to illustrate a method of manufacturing a semiconductor memory device according to some embodiments of inventive concepts.

Figure 6:
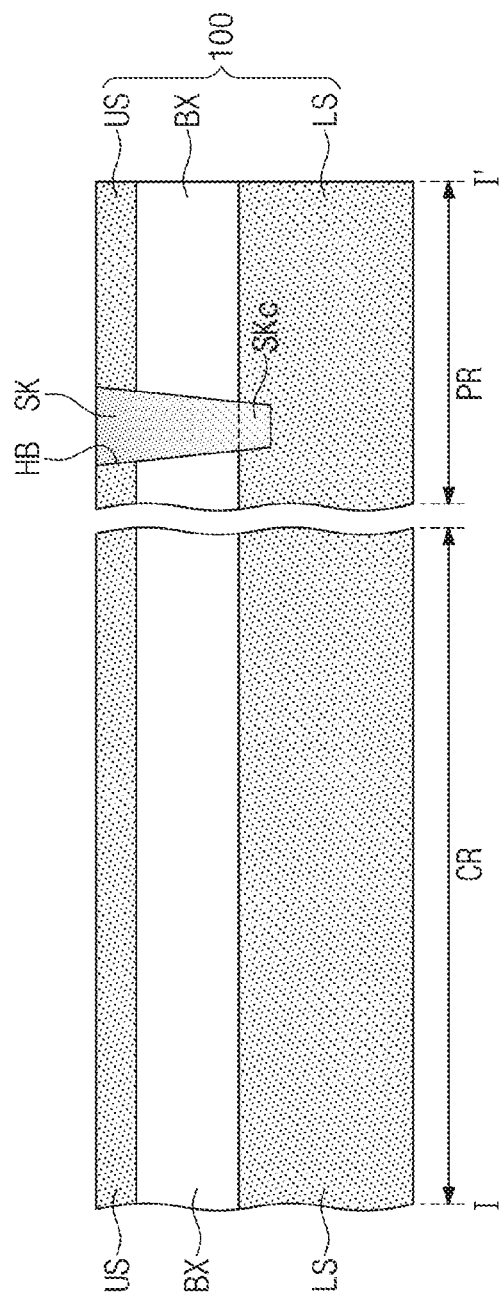
FIGS. 6 to 14 are cross-sectional views taken along a line I-I' of FIG. 5 to illustrate a method of manufacturing a semiconductor memory device according to some embodiments of inventive concepts.

Referring to FIGS. 5 and 6, a semiconductor substrate 100 including a cell array region CR and a peripheral circuit region PR may be provided. The connection region ER of FIGS. 2A and 2B is omitted for the purpose of ease and convenience in explanation and illustration. The semiconductor substrate 100 may be a semiconductor-on-insulator substrate. For example, the semiconductor substrate 100 may be a silicon-on-insulator (SOI) substrate. The semiconductor substrate 100 may include a lower semiconductor layer LS, an upper semiconductor layer US, and a buried insulation layer BX between the lower and upper semiconductor layers LS and US. The lower semiconductor layer LS may be thicker than the buried insulation layer BX. The lower semiconductor layer LS and the upper semiconductor layer US may be substantially single-crystalline. The lower semiconductor layer LS and the upper semiconductor layer US may be semiconductor layers doped with dopants of a first conductivity type. The first conductivity type may be a P-type.

A hole region HB may be formed in the peripheral circuit region PR. A planar shape of the hole region HB may be a circular shape or may be a line shape extending in one direction. The hole region HB may penetrate the upper semiconductor layer US and the buried insulation layer BX. When the hole region HB is formed, an upper portion of the lower semiconductor layer LS may also be etched. In other words, the hole region HB may extend into the upper portion of the lower semiconductor layer LS.

A connection conductive pattern SK may be formed in the hole region HB. In some embodiments, the formation of the connection conductive pattern SK may include forming a conductive layer filling the hole region HB and performing a planarization process on the conductive layer until a top surface of the upper semiconductor layer US is exposed. A lower portion SKc of the connection conductive pattern SK may be formed in the lower semiconductor layer LS.

The connection conductive pattern SK may be formed of at least one of a doped semiconductor material, a metal, or a conductive metal nitride. In some embodiments, when the connection conductive pattern SK is formed of a P-type semiconductor material, a dopant doping process may be additionally performed or may be performed together with a deposition process.

Figure 7:
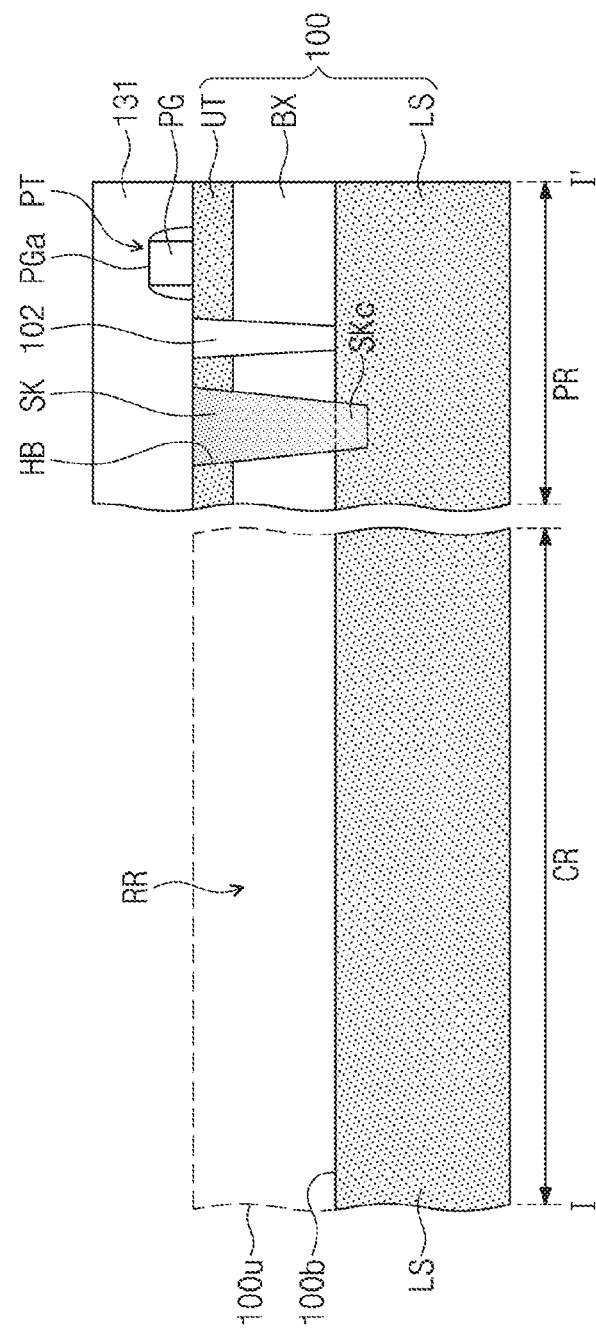

Referring to FIGS. 5 and 7, a device isolation layer 102 and peripheral transistors PT may be formed in the peripheral circuit region PR. The device isolation layer 102 may penetrate the upper semiconductor layer US and the buried insulation layer BX. A bottom surface of the device isolation layer 102 may coincide with a top surface of the lower semiconductor layer LS in the present embodiment. Alternatively, the bottom surface of the device isolation layer 102 may be spaced apart from the top surface of the lower semiconductor layer LS. A peripheral impurity region 171 of FIG. 5 may be formed in the upper semiconductor layer US of the peripheral circuit region PR. A conductivity type of the peripheral impurity region 171 may be determined depending on a kind of the peripheral transistors PT. A bottom surface of the peripheral impurity region 171 may correspond to a bottom surface of the upper semiconductor layer US. The formation of the peripheral transistors PT may include forming a gate electrode PG on the peripheral impurity region 171. A top surface of the gate electrode PG may be higher than a top surface of the connection conductive pattern SK.

After the formation of the peripheral transistors PT, a first interlayer dielectric layer 131 may be formed to cover the semiconductor substrate 100. For example, the first interlayer dielectric layer 131 may be formed of a silicon oxide layer. An upper portion 100u of the semiconductor substrate 100 in the cell array region CR may be removed to form a recess region RR. In some embodiments, the upper semiconductor layer US and the buried insulation layer BX in the cell array region CR may be removed. As a result, a top surface 100b of the lower semiconductor layer LS of the cell array region CR may be exposed. Hereinafter, a portion of the upper semiconductor layer US which remains in the peripheral circuit region PR is referred to as a peripheral active layer UT. The formation of the recess region RR may include forming a mask pattern exposing the cell array region CR on the semiconductor substrate 100, and etching the first interlayer dielectric layer 131 and the semiconductor substrate 100 by using the mask pattern as an etch mask. The etching process may include a plurality of dry and/or wet etching processes.

According to some embodiments of inventive concepts, the etch stop layer 113 described with reference to FIG. 3B may be formed on the semiconductor substrate 100. The etch stop layer 113 may be confined in the cell array region CR. The etch stop layer 113 may be formed of a material having an etch selectivity with respect to both insulation layers 120 and sacrificial layers 125 to be described below. For example, the etch stop layer 113 may include a metal oxide layer such as an aluminum oxide layer. Alternatively, the etch stop layer 113 may be omitted. The etch stop layer 113 may be formed in the present step or may be formed after formation of a buffer layer 111 to be described below.

Figure 8:
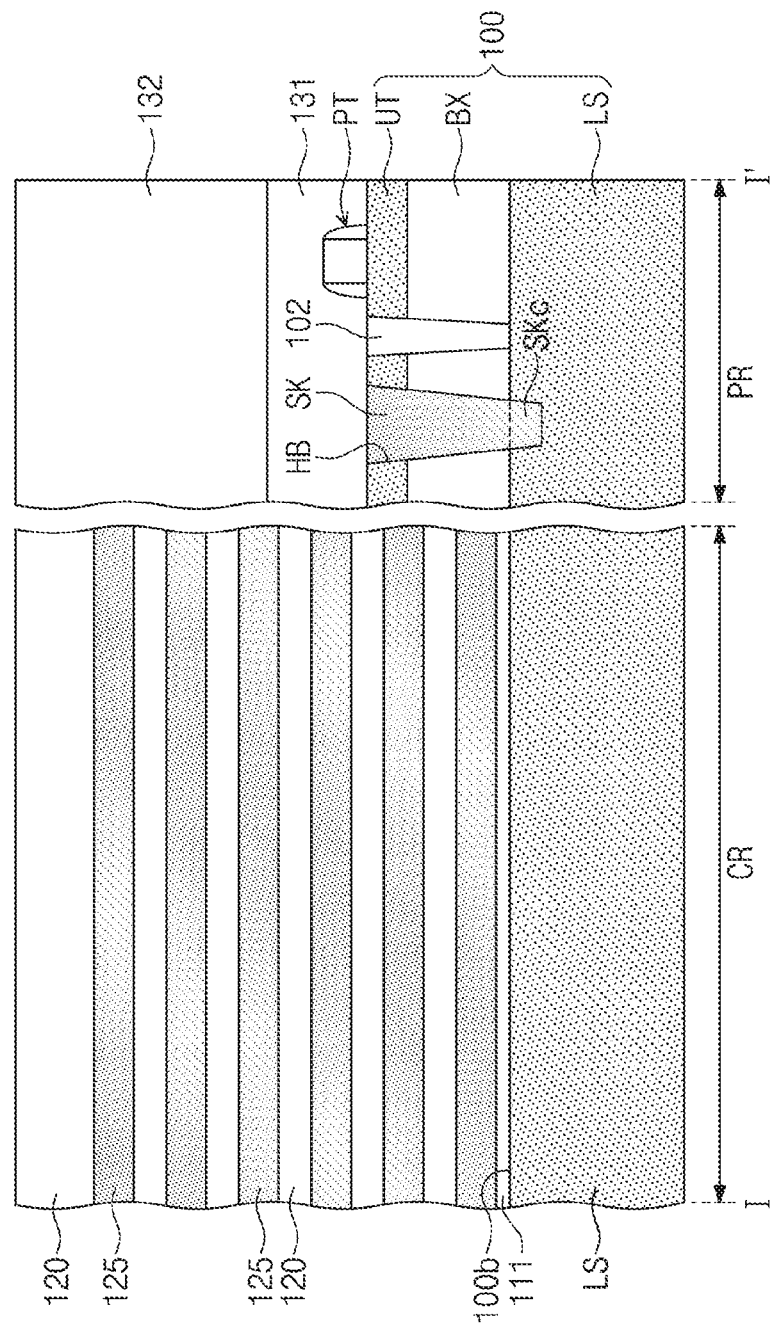

Referring to FIGS. 5 and 8, a buffer layer 111 may be formed in the cell array region CR, and then, sacrificial layers 125 and insulation layers 120 may be alternately and repeatedly formed on the buffer layer 111. The buffer layer 111 may be a silicon oxide layer. For example, the buffer layer 111 may be formed by a thermal oxidation process. The sacrificial layers 125 may be formed of a material having an etch selectivity with respect to the insulation layers 120. In other words, the sacrificial layers 125 may be formed of a material which can be etched while minimizing etching of the insulation layers 120 in a process of etching the sacrificial layers 125 using a desired (and/or alternatively predetermined) etch recipe.

The etch selectivity may be expressed quantitatively by a ratio of an etch rate of the insulation layers 120 to an etch rate of the sacrificial layers 125. In some embodiments, the ratio of the etch rate of the insulation layers 120 to the etch rate of the sacrificial layers 125 may range from 1:10 to 1:200 (in particular, from 1:30 to 1:100). For example, each of the sacrificial layers 125 may be a silicon nitride layer, a silicon oxynitride layer, or a poly-silicon layer, and each of the insulation layers 120 may be a silicon oxide layer. The sacrificial layers 125 and the insulation layers 120 may be formed using, for example, a chemical vapor deposition (CVD) method. The sacrificial layers 125 and the insulation layers 120 of the peripheral circuit region PR may be removed. Thereafter, a second interlayer dielectric layer 132 may be formed to cover the peripheral circuit region PR. For example, the second interlayer dielectric layer 132 may include a silicon oxide layer.

Figure 9:
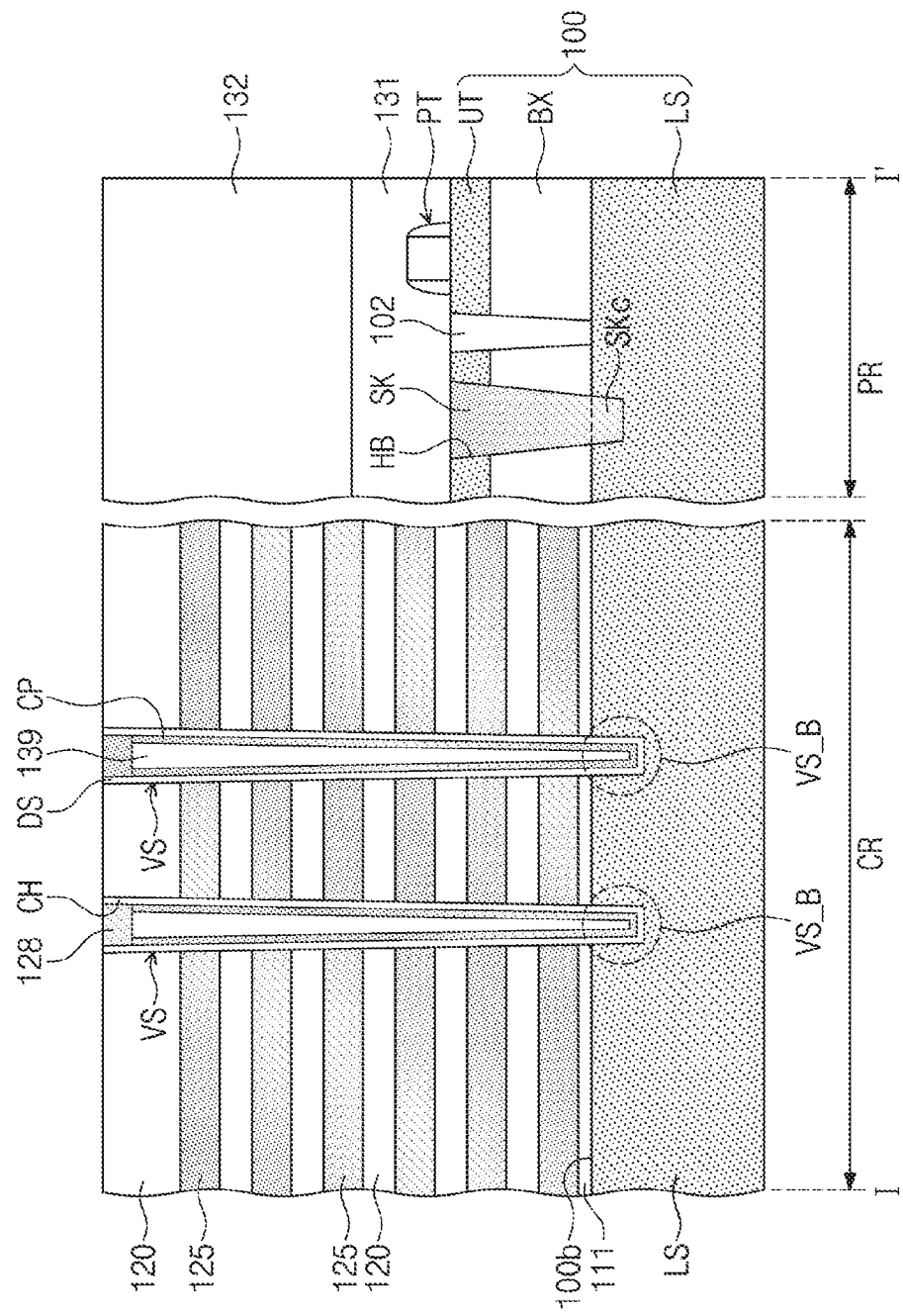

Referring to FIGS. 5 and 9, vertical structures VS may be formed to penetrate the sacrificial layers 125 and the insulation layers 120. The vertical structures VS may be connected to the lower semiconductor layer LS. The formation of the vertical structures VS may include forming vertical holes CH, which penetrate the sacrificial layers 125 and the insulation layers 120 to expose the semiconductor substrate 100, by an anisotropic etching process, and sequentially depositing a data storage layer DS, a channel semiconductor layer CP, and a filling insulation layer 139 in the vertical holes CH. The data storage layer DS, the channel semiconductor layer CP and the filling insulation layer 139 may be substantially the same as described with reference to FIGS. 3A and 3B and may be formed using at least one of a CVD method, an atomic layer deposition (ALD) method, or a sputtering method. The data storage layer DS and the channel semiconductor layer CP may be conformally formed along a sidewall and a bottom surface of each of the vertical holes CH. The filling insulation layer 139 may completely fill the vertical holes CH. Upper portions of the filling insulation layer 139 and the channel semiconductor layer CP may be removed to form recessed regions in the vertical holes CH, and pad patterns 128 may be formed to fill the recessed regions in the vertical holes CH. The pad patterns 128 may be formed of doped poly-silicon or a metal.

Lower portions VS_B of the vertical structures VS may be inserted in the semiconductor substrate 100, e.g., in an upper portion of the lower semiconductor layer LS. In other words, in the process of forming the vertical holes CH, the bottom surfaces of the vertical holes CH may be lower than the top surface 100b of the lower semiconductor layer LS due to over-etching. As a result, the lower portions VS_B of the vertical structures VS may be buried in the lower semiconductor layer LS. The data storage layer DS may surround a bottom portion of the channel semiconductor layer CP in the bottom portion VS_B of each of the vertical structures VS. The channel semiconductor layer CP may be spaced apart from the lower semiconductor layer LS by the data storage layer DS.

Figure 10:
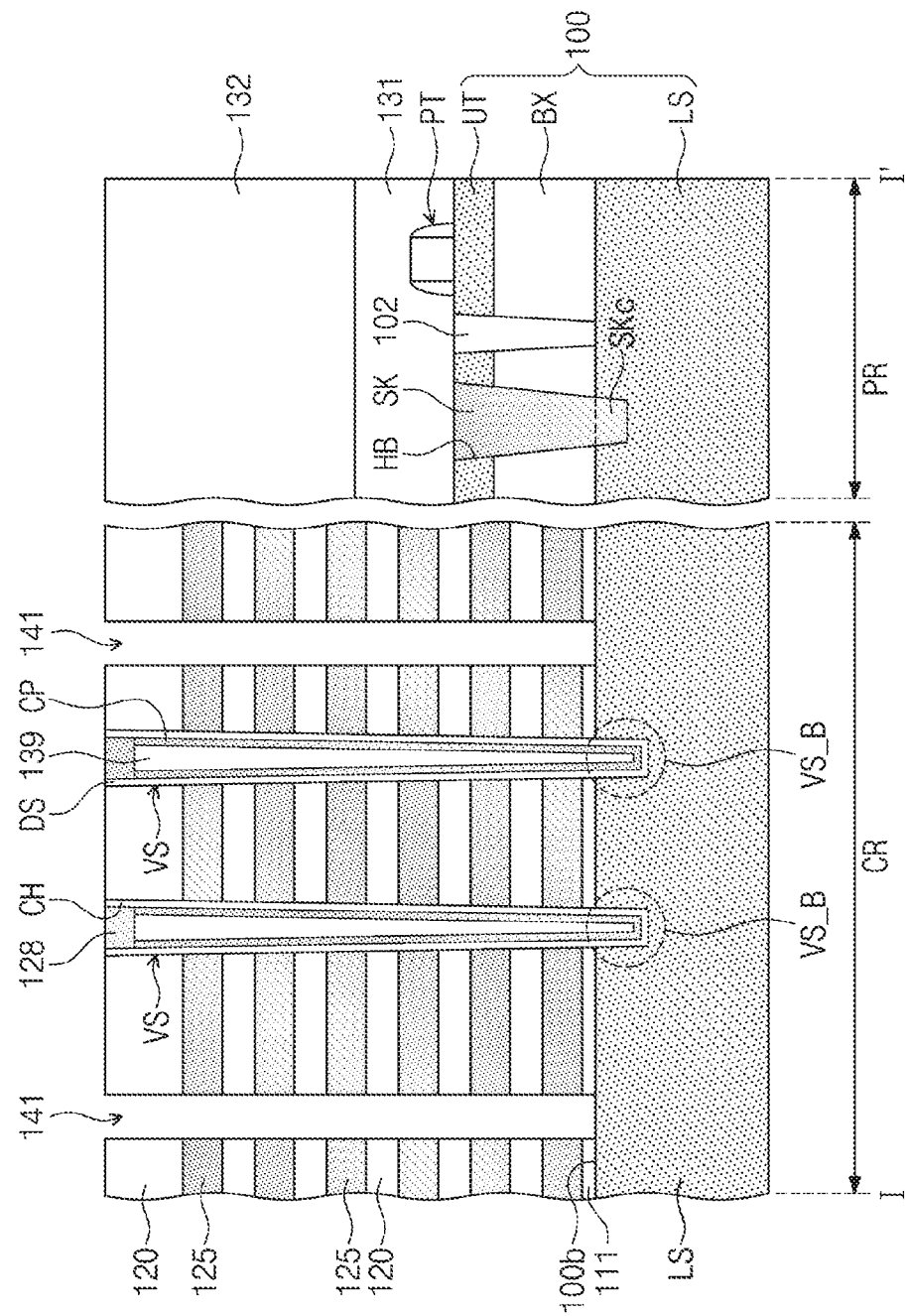

Referring to FIGS. 5 and 10, separation trenches 141 may be formed to penetrate the sacrificial layers 125 and the insulation layers 120. The separation trenches 141 may expose the top surface 100b of the lower semiconductor layer LS. Alternatively, the buffer layer 111 or the etch stop layer 113 of FIG. 3B may remain in the separation trenches 141. The separation trenches 141 may be formed using an anisotropic etching process.

Figure 11:
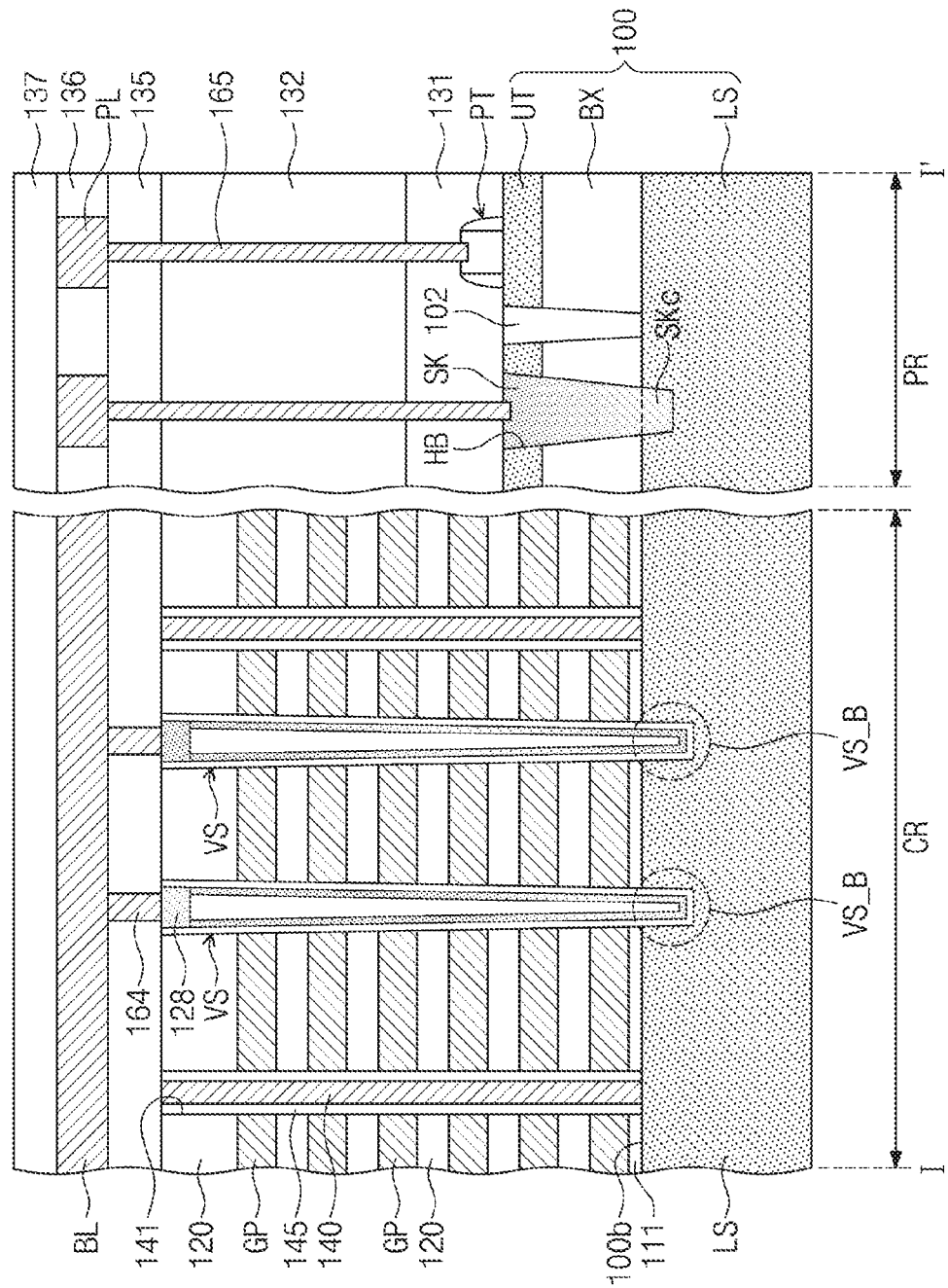

Referring to FIGS. 5 and 11, the sacrificial layers 125 may be replaced with gate electrodes GP. In other words, the sacrificial layers 125 exposed by the separation trenches 141 may be removed, and then, the gate electrodes GP may be formed in empty regions formed by the removal of the sacrificial layers 125. For example, the removal of the sacrificial layers 125 may be performed using an etching solution including phosphoric acid. According to some embodiments, a blocking insulation layer may be conformally formed in the empty regions formed by the removal of the sacrificial layers 125 before the formation of the gate electrodes GP.

Separation patterns 145 and common source lines 140 may be formed in the separation trenches 141. The common source lines 140 may penetrate the separation patterns 145 so as to be connected to the semiconductor substrate 100. In some embodiments, each of the common source lines 140 may be formed in a plate shape extending in a first direction D1 when viewed in a cross-sectional view. In some embodiments, the separation patterns 145 may be formed in spacer shapes covering sidewalls of the separation trenches 141, and the common source lines 140 may be formed to fill the separation trenches 141. Alternatively, contact holes may be formed to penetrate the separation patterns 145, and then, the common source lines 140 may be formed to fill the contact holes. The separation patterns 145 may be formed of at least one of a silicon oxide layer, a silicon nitride layer, or a silicon oxynitride layer. The common source lines 140 may be formed of at least one of doped silicon, a metal, or a conductive metal nitride.

In some embodiments, when the common source lines 140 include doped silicon, the common source lines 140 may be doped in-situ with dopants of a second conductivity type different from the first conductivity type of the lower semiconductor layer LS. For example, the second conductivity type may be an N-type.

A third interlayer dielectric layer 135 and a fourth interlayer dielectric layer 136 may be formed to cover the cell array region CR and the peripheral circuit region PR. Bit line contacts 164 may be formed to penetrate the third interlayer dielectric layer 135 and may be connected to the vertical structures VS. Peripheral contacts 165 may be formed to penetrate the first to third interlayer dielectric layers 131, 132 and 135 of the peripheral circuit region PR. At least some of the peripheral contacts 165 may be connected to the peripheral transistors PT. At least another of the peripheral contacts 165 may be connected to the connection conductive pattern SK. Bit lines BL and peripheral lines PL may be formed in the fourth interlayer dielectric layer 136. A fifth interlayer dielectric layer 137 may be formed to cover the bit lines BL and the peripheral lines PL. Each of the third to fifth interlayer dielectric layers 135, 136 and 137 may be formed of a silicon oxide layer. The bit lines BL, the peripheral lines PL and the contacts 164 and 165 may be formed of at least one of a metal (e.g., tungsten, copper, or aluminum), a conductive metal nitride (e.g., titanium nitride or tantalum nitride), or a transition metal (e.g., titanium or tantalum).

Figure 12:
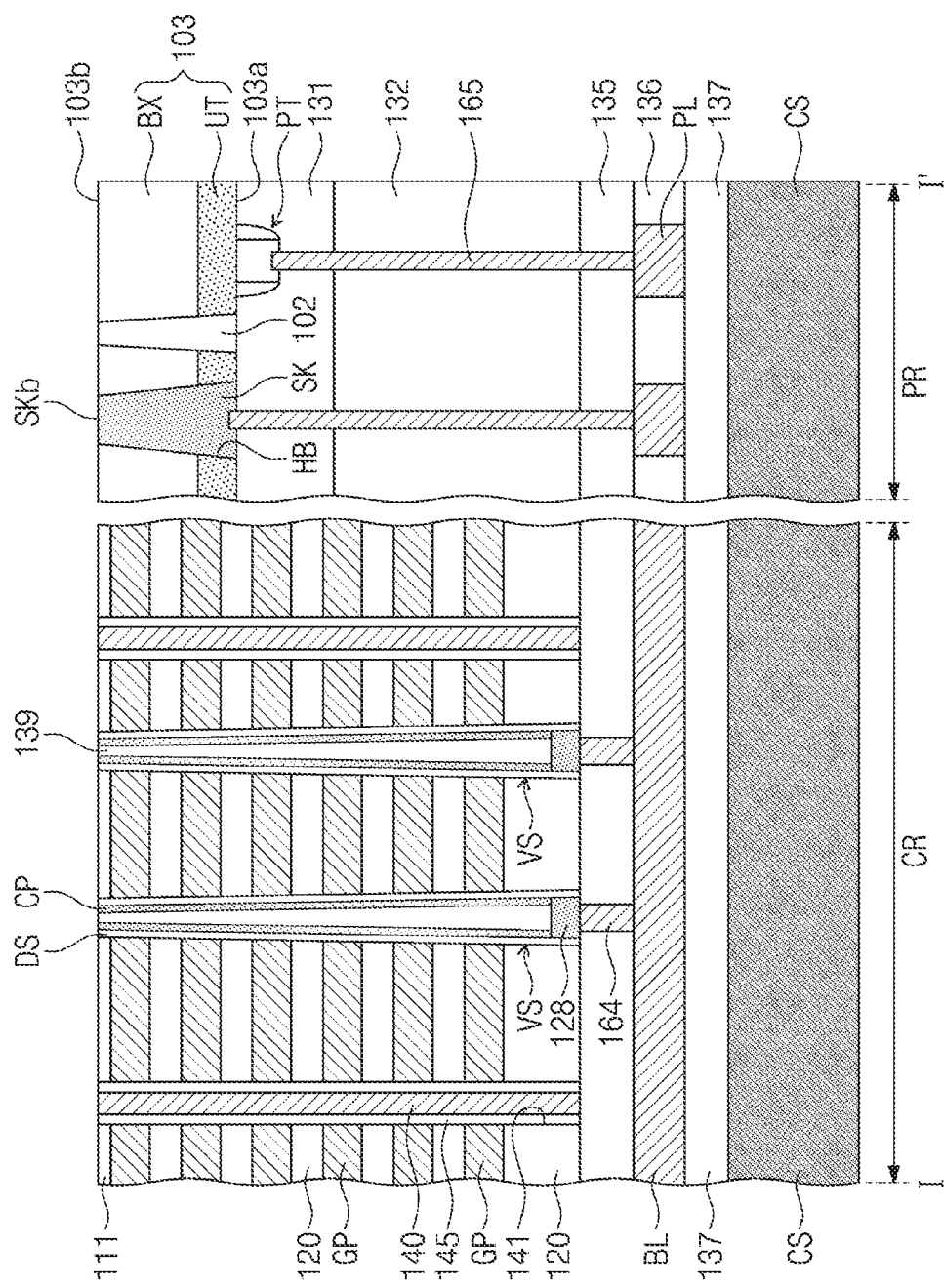

Referring to FIGS. 5 and 12, a process of removing the lower semiconductor layer LS may be performed. A carrier substrate CS may be provided on the fifth interlayer dielectric layer 137, and then, the semiconductor substrate 100 and the carrier substrate CS may be turned over such that a bottom surface of the semiconductor substrate 100 faces upward. The process of removing the lower semiconductor layer LS may be performed in the state in which the bottom surface of the semiconductor substrate 100 faces upward. The carrier substrate CS may be an insulating substrate such as a glass substrate or may be a conductive substrate such as a metal substrate. In some embodiments, the carrier substrate CS may be adhered onto the fifth interlayer dielectric layer 137 with an adhesive tape and/or an adhesive layer interposed therebetween.

The process of removing the lower semiconductor layer LS may include a chemical mechanical polishing (CMP) process. The channel semiconductor layer CP may be exposed by the process of removing the lower semiconductor layer LS. In other words, in the process of removing the lower semiconductor layer LS, the portion of the data storage layer DS which surrounds the channel semiconductor layer CP may be removed to expose an end portion of the channel semiconductor layer CP. In some embodiments, the process of removing the lower semiconductor layer LS may be performed until the lower portions VS_B of the vertical structures VS of FIG. 11 are removed.

The semiconductor substrate 100 may be removed from the cell array region CR by the process of removing the lower semiconductor layer LS. Thus, in the cell array region CR, the buffer layer 111 may be exposed or the etch stop layer 113 of FIG. 3B may be exposed. A portion of the semiconductor substrate 100 may remain in the peripheral circuit region PR due to the process of forming the recess region RR described with reference to FIG. 7. Hereinafter, the remaining portion of the semiconductor substrate 100 is referred to as 'a residual substrate 103'. The residual substrate 103 may include an exposed bottom surface 103b and a top surface 103a opposite to the bottom surface 103b. The bottom surface 103b of the residual substrate 103 may be a bottom surface of the buried insulation layer BX. The top surface 103a of the residual substrate 103 may be a top surface of the peripheral active layer UT.

The lower portion SKc of the connection conductive pattern SK may also be removed in the process of removing the lower semiconductor layer LS. As a result, a bottom surface SKb of the connection conductive pattern SK may be disposed at substantially the same level as the bottom surface 103b of the residual substrate 103. In some embodiments, the bottom surface SKb of the connection conductive pattern SK may be disposed at substantially the same level as a bottom surface (e.g., an exposed surface) of the channel semiconductor layer CP.

Figure 13:
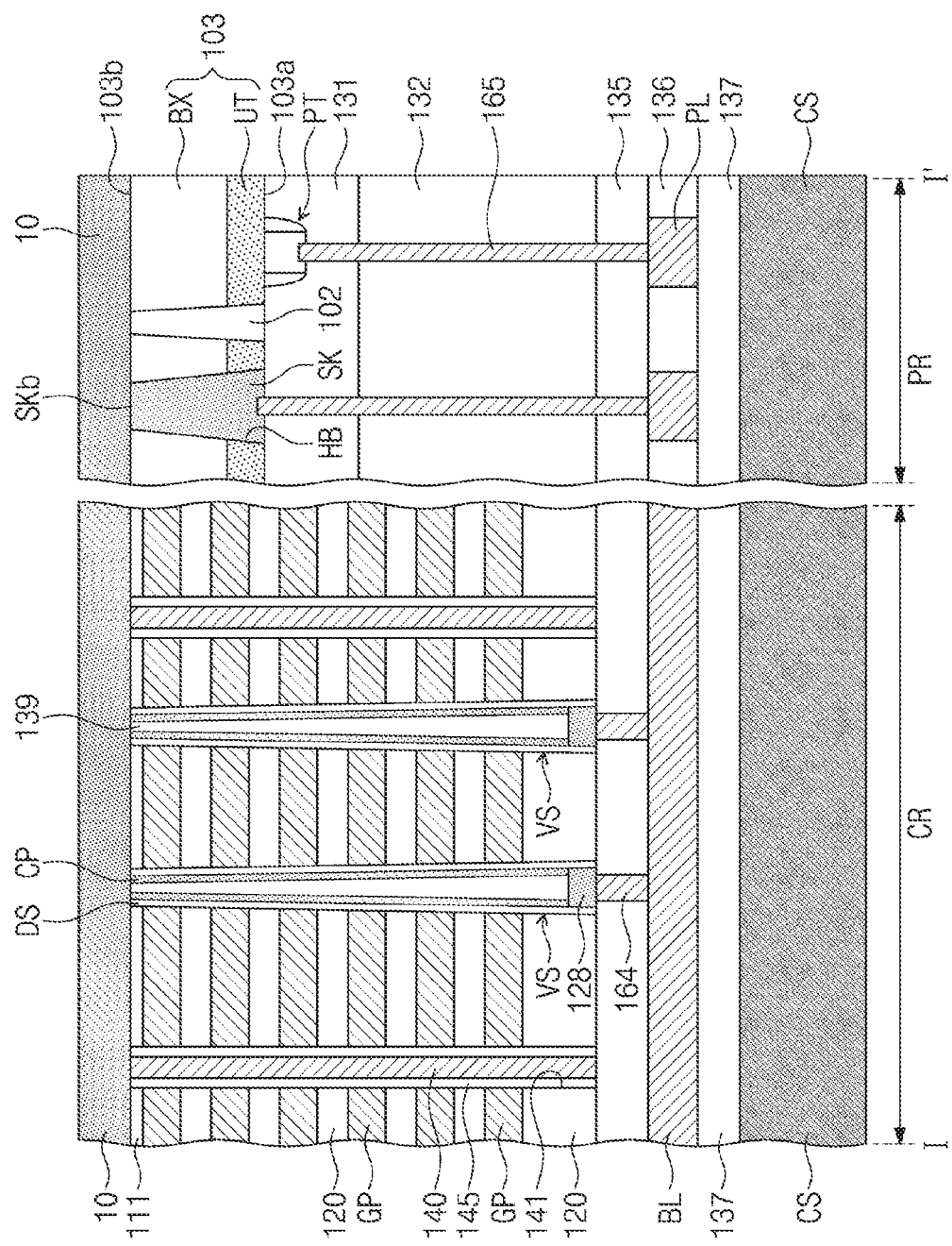

Referring to FIGS. 5 and 13, a body conductive layer 10 may be formed to cover the cell array region CR and the peripheral circuit region PR. The body conductive layer 10 may include a semiconductor material and/or a metal material. For example, the body conductive layer 10 may be formed of poly-silicon. The body conductive layer 10 may be doped in-situ with dopants of the first conductivity type. The body conductive layer 10 may be formed by a CVD method or an ALD method. In some embodiments, the formation of the body conductive layer 10 may include forming an amorphous silicon layer and performing a thermal treatment process on the amorphous silicon layer. The thermal treatment process may be performed at a temperature of about 700 degrees Celsius to about 1000 degrees Celsius. For example, a thickness of the body conductive layer 10 may range from about 5 nm to about 100 μm.

The body conductive layer 10 may be formed on the bottom surface 103b of the residual substrate 103 in the peripheral circuit region PR. The body conductive layer 10 may be connected to the bottom surface SKb of the connection conductive pattern SK. The body conductive layer 10 may be connected to the channel semiconductor layers CP in the cell array region CR. For example, the body conductive layer 10 may be in direct contact with the channel semiconductor layers CP. After the formation of the body conductive layer 10, a planarization process such as a CMP process may be performed on the body conductive layer 10. Alternatively, the planarization process may not be performed.

Figure 14:
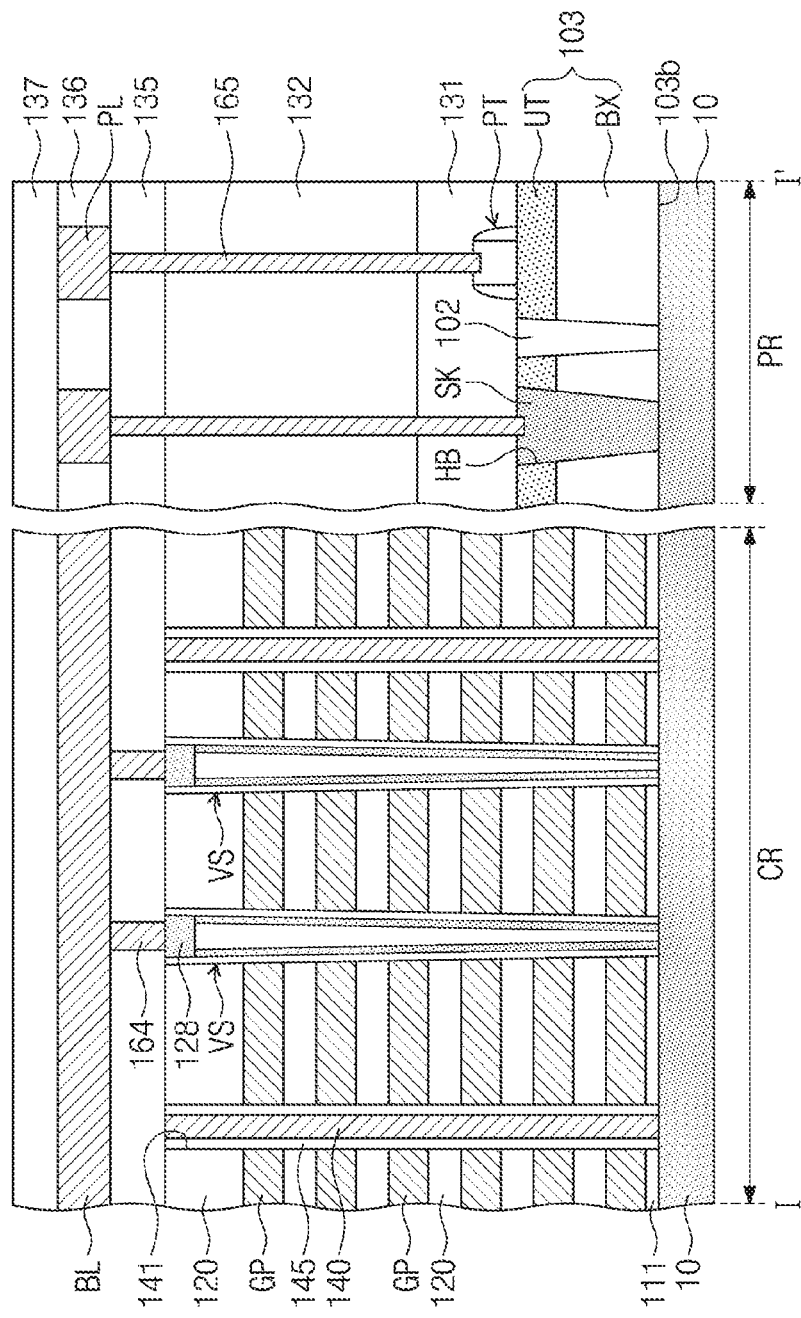

Referring to FIGS. 5 and 14, a process of removing the carrier substrate CS may be performed. Thereafter, subsequent processes may be performed to complete the process of manufacturing the semiconductor memory device.

According to some embodiments of inventive concepts, in the cell array region CR, the semiconductor substrate 100 may be removed and at the same time, the channel semiconductor layers CP may be exposed. Thus, the body conductive layer 10 may be connected to the channel semiconductor layers CP without an additional etching process. As a result, the manufacturing processes of the semiconductor memory device may be simplified.

According to some embodiments of inventive concepts, in the peripheral circuit region PR, a portion of the semiconductor substrate 100 may be removed and at the same time, the connection conductive pattern SK may be exposed. Thus, the body conductive layer 10 may be connected to the connection conductive pattern SK without an additional etching process.

Figure 15:
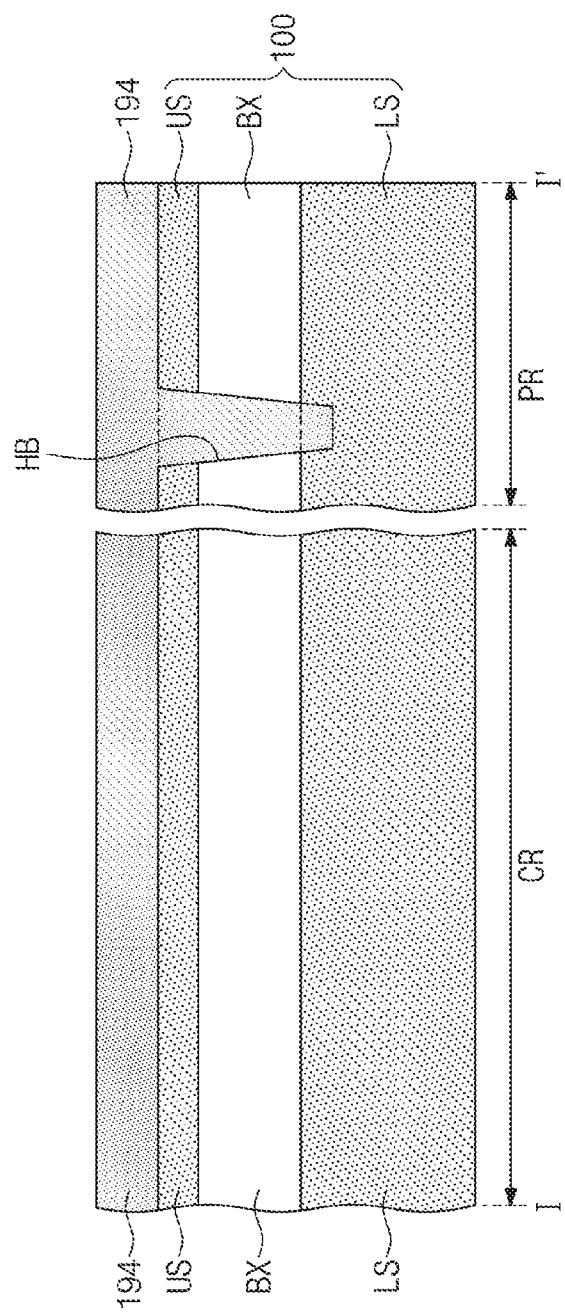
FIGS. 15 to 17 are cross-sectional views taken along the line I-I' of FIG. 5 to illustrate a method of manufacturing a semiconductor memory device according to some embodiments of inventive concepts.
Figure 16:
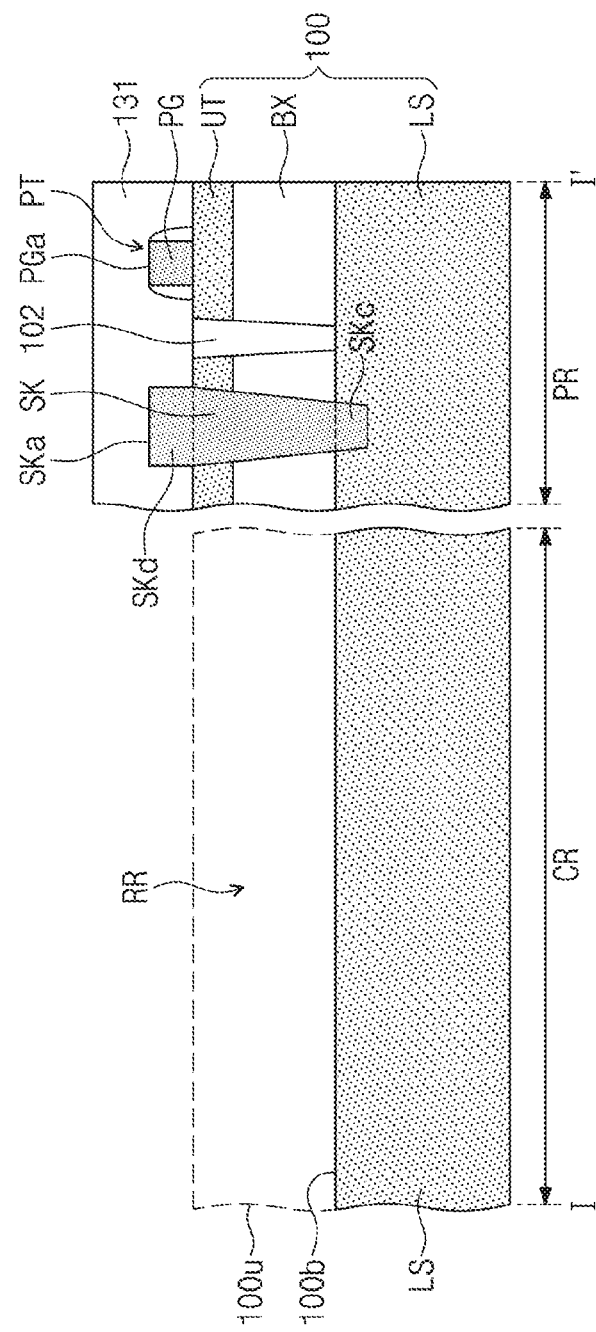
Figure 17:
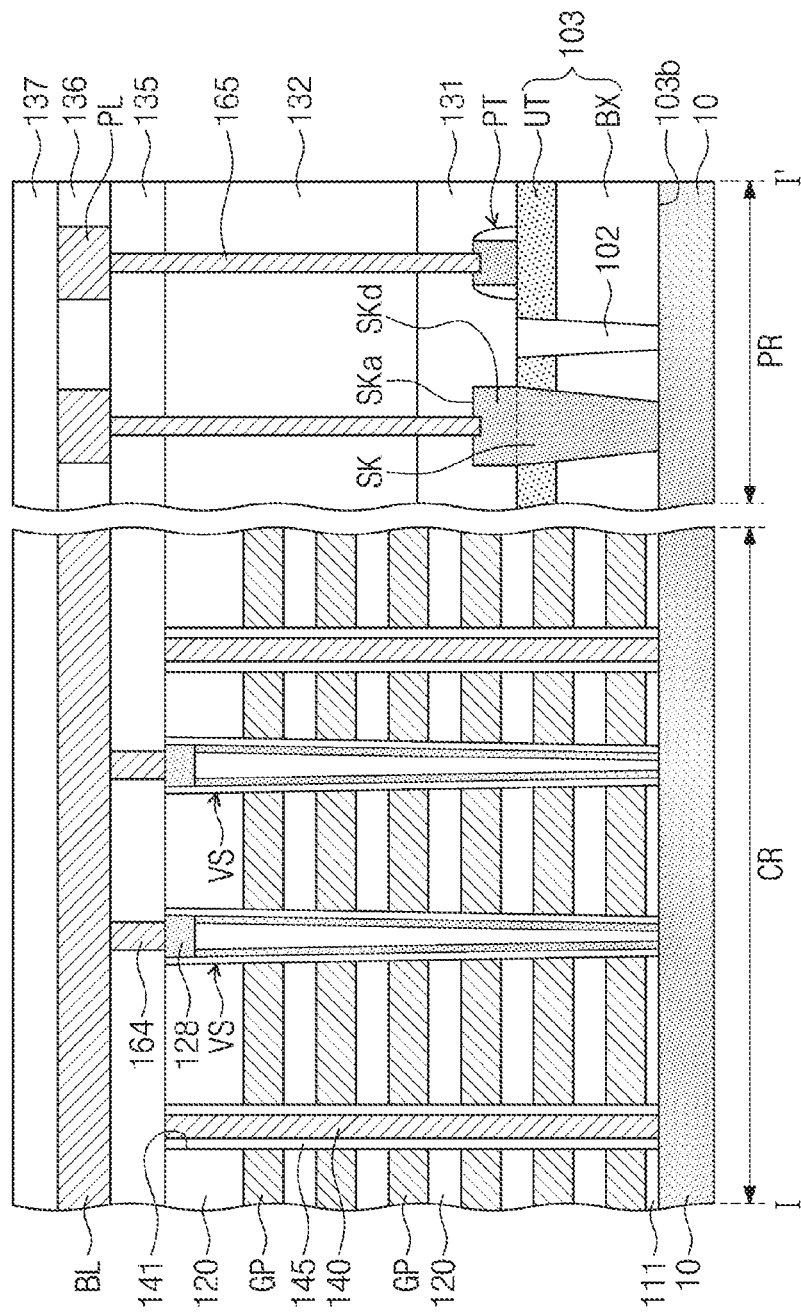

FIGS. 15 to 17 are cross-sectional views taken along the line I-I' of FIG. 5 to illustrate a method of manufacturing a semiconductor memory device according to some embodiments of inventive concepts.

Referring to FIGS. 5 and 15, after a hole region HB is formed in the peripheral circuit region PR, a conductive layer 194 may be formed on the semiconductor substrate 100 to fill the hole region HB. The conductive layer 194 may be formed of at least one of a doped semiconductor material, a metal, or a conductive metal nitride. For example, the conductive layer 194 may be formed of P-type poly-silicon. For example, the conductive layer 194 may be formed by a CVD process.

Referring to FIGS. 5, 16 and 17, the conductive layer 194 may be patterned to form a connection conductive pattern SK filling the hole region HB and a peripheral gate electrode PG of a peripheral transistor PT. In other words, the connection conductive pattern SK and the peripheral gate electrode PG may be formed from the same layer. The patterning process may include an etching process performed at least one time. The connection conductive pattern SK may include a protrusion SKd protruding upward from the top surface of the residual substrate 103. In some embodiments, a top surface SKa of the connection conductive pattern SK may be formed at substantially the same level as a top surface PGa of the peripheral gate electrode PG. Thereafter, the processes described with reference to FIGS. 8 to 14 may be performed to manufacture a semiconductor memory device illustrated in FIG. 17.

Figure 18:
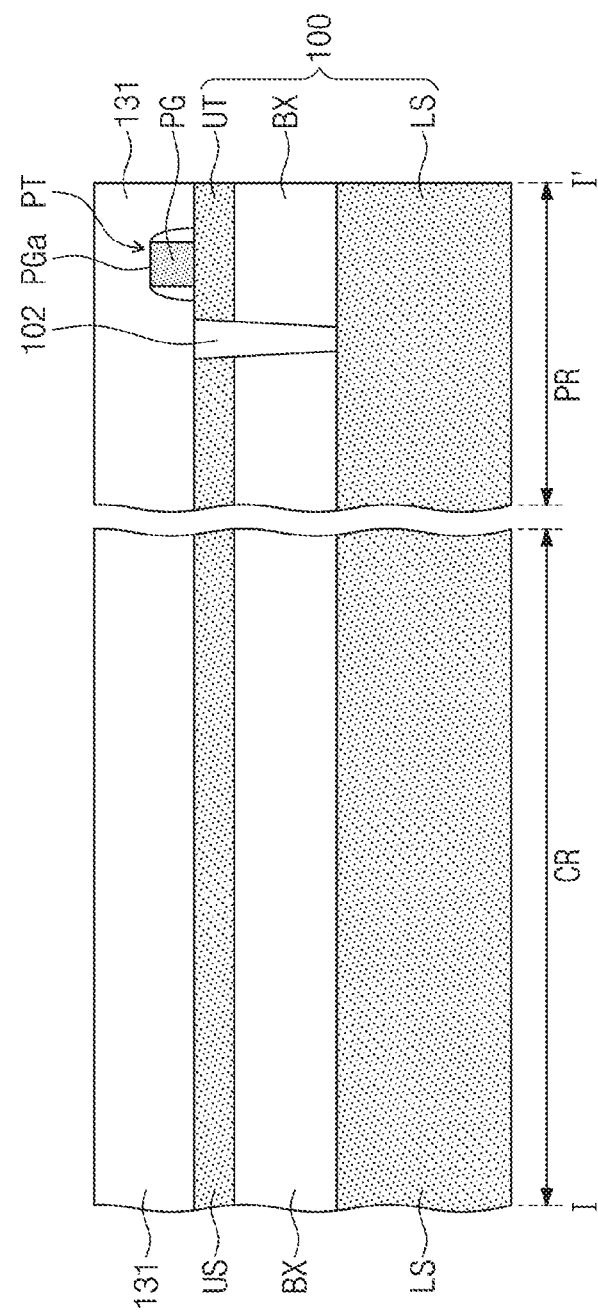
FIGS. 18 to 20 are cross-sectional views taken along the line I-I' of FIG. 5 to illustrate a method of manufacturing a semiconductor memory device according to some embodiments of inventive concepts.
Figure 19:
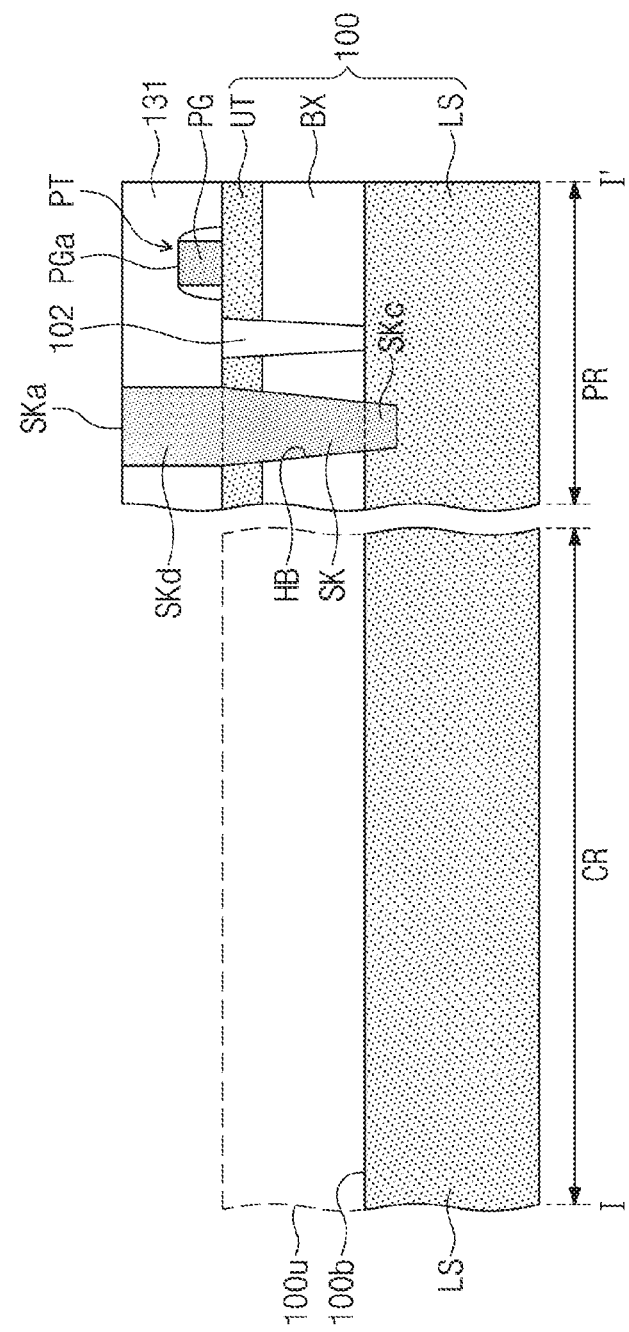
Figure 20:
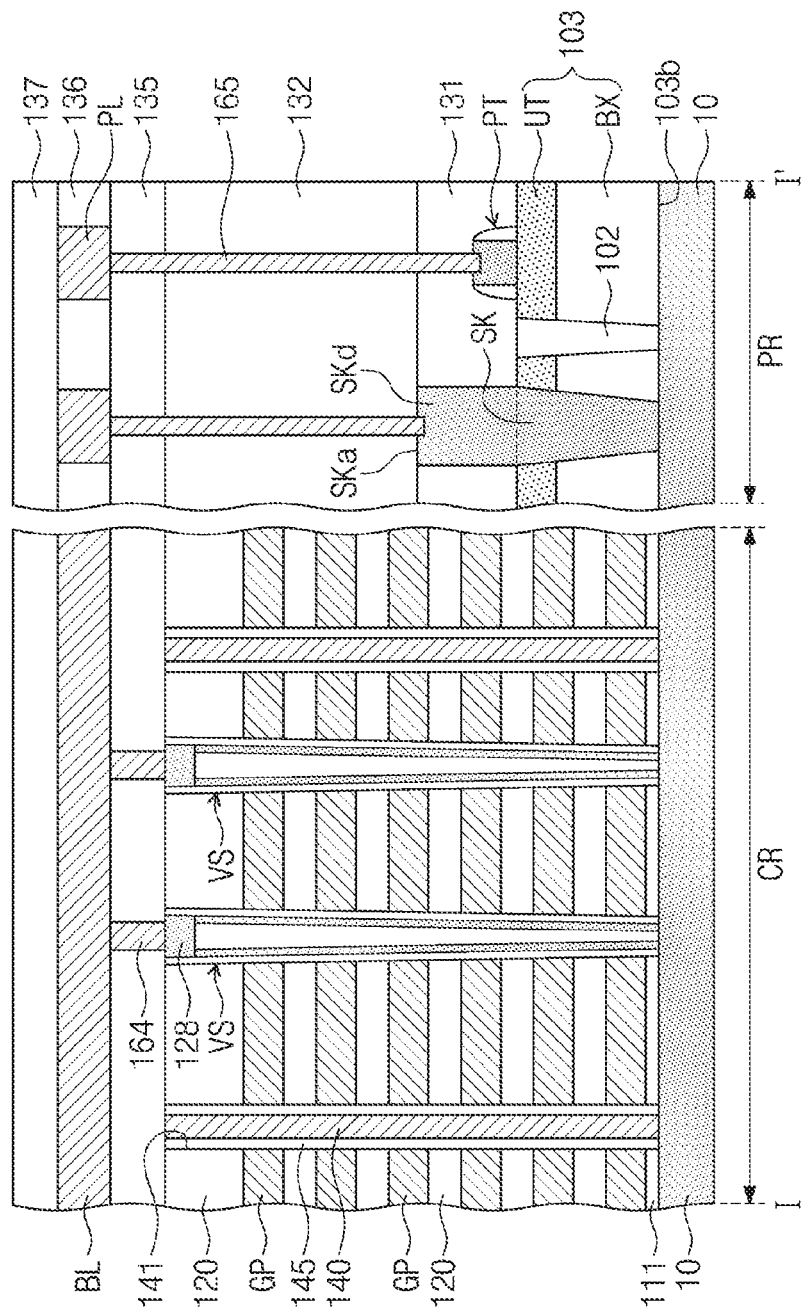

FIGS. 18 to 20 are cross-sectional views taken along the line I-I' of FIG. 5 to illustrate a method of manufacturing a semiconductor memory device according to some embodiments of inventive concepts.

Referring to FIGS. 5 and 18, a device isolation layer 102 and a peripheral transistor PT may be formed in the peripheral circuit region PR. The peripheral transistor PT may include a peripheral gate electrode PG. Thereafter, a first interlayer dielectric layer 131 may be formed to cover a top surface PGa of the peripheral gate electrode PG.

Referring to FIGS. 5, 19 and 20, a connection conductive pattern SK may be formed to penetrate the first interlayer dielectric layer 131, the upper semiconductor layer US, and the buried insulation layer BX. The connection conductive pattern SK may be formed in a hole region HB. The connection conductive pattern SK may include a protrusion SKd protruding upward from the top surface of the residual substrate 103. In some embodiments, a top surface SKa of the connection conductive pattern SK may be higher than a top surface PGa of the peripheral gate electrode PG. An upper portion 100u of the semiconductor substrate 100 in the cell array region CR may be removed to form a recess region RR. Thereafter, the processes described with reference to FIGS. 8 to 14 may be performed to manufacture a semiconductor memory device illustrated in FIG. 20.

Figure 21:
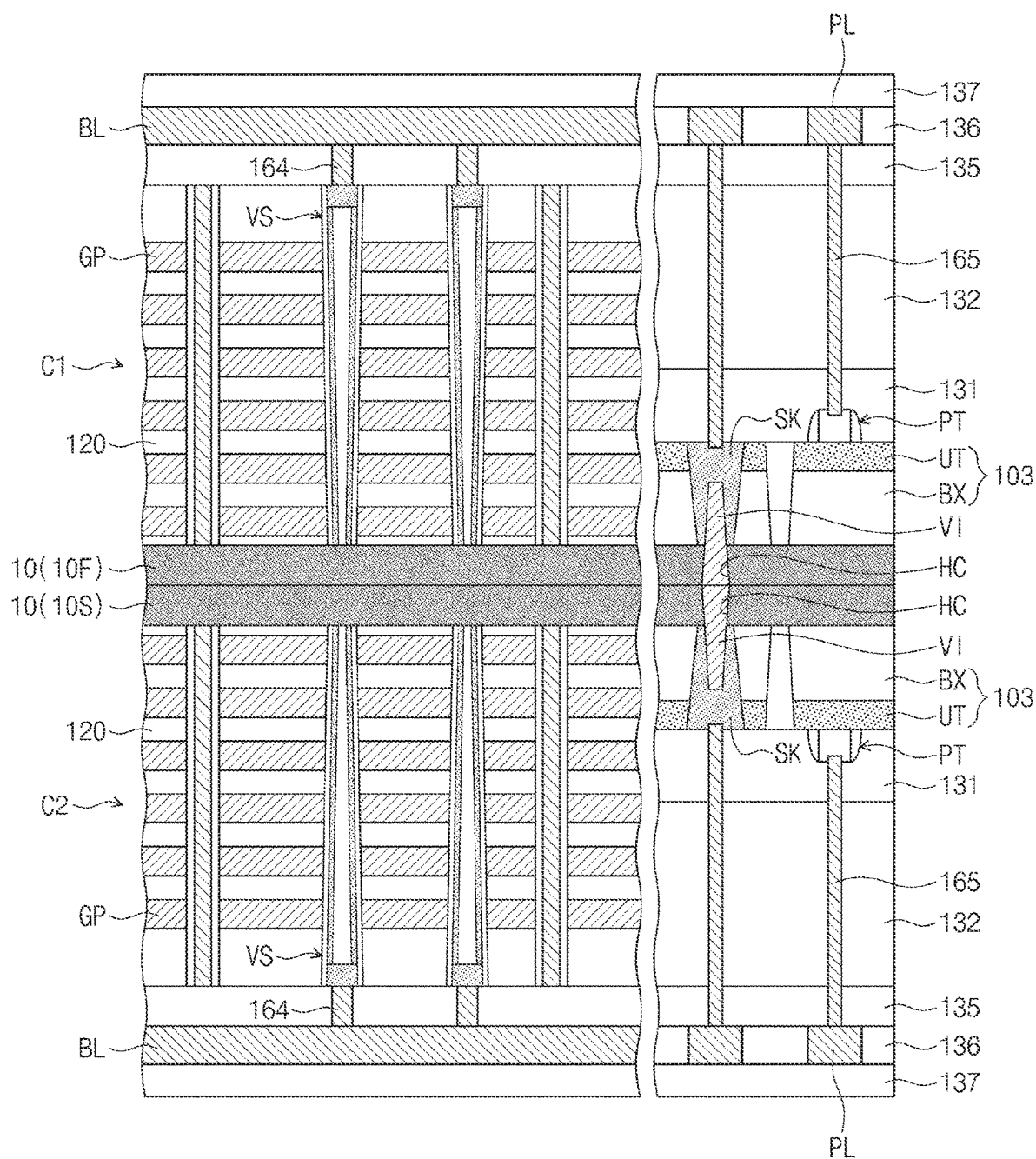
FIG. 21 is a cross-sectional view illustrating a semiconductor memory device according to some embodiments of inventive concepts.

FIG. 21 is a cross-sectional view illustrating a semiconductor memory device according to some embodiments of inventive concepts.

A semiconductor memory device according to some embodiments of inventive concepts may include a first semiconductor chip C1 and a second semiconductor chip C2. The first semiconductor chip C1 may be substantially the same or similar as the second semiconductor chip C2, and the first and second semiconductor chips C1 and C2 may be memory chips.

A bottom surface of a body conductive layer 10F (hereinafter, referred to as 'a first body conductive layer') of the first semiconductor chip C1 may face a bottom surface of a body conductive layer 10S (hereinafter, referred to as 'a second body conductive layer') of the second semiconductor chip C2. In other words, in the semiconductor memory device, the first and second semiconductor chips C1 and C2 may be connected to each other such that the first and second body conductive layers 10F and 10S are adjacent to each other. The first body conductive layer 10F may be electrically connected to the second body conductive layer 10S. In some embodiments, the bottom surface of the first body conductive layer 10F may be in direct contact with the bottom surface of the second body conductive layer 10S. Alternatively, in certain embodiments, an additional conductive layer may be provided between the first body conductive layer 10F and the second body conductive layer 10S.

A contact hole HC penetrating the first body conductive layer 10F may be provided, and a through-electrode VI may be provided in the contact hole HC. In addition, a contact hole HC penetrating the second body conductive layer 10S may be provided, and a through-electrode VI may be provided in the contact hole HC. The through-electrodes VI may be connected to connection conductive patterns SK. The through-electrode VI of the first semiconductor chip C1 and the through-electrode VI of the second semiconductor chip C2 may be connected directly to each other or may be connected to each other through an additional conductive layer disposed therebetween.

Figure 22A:
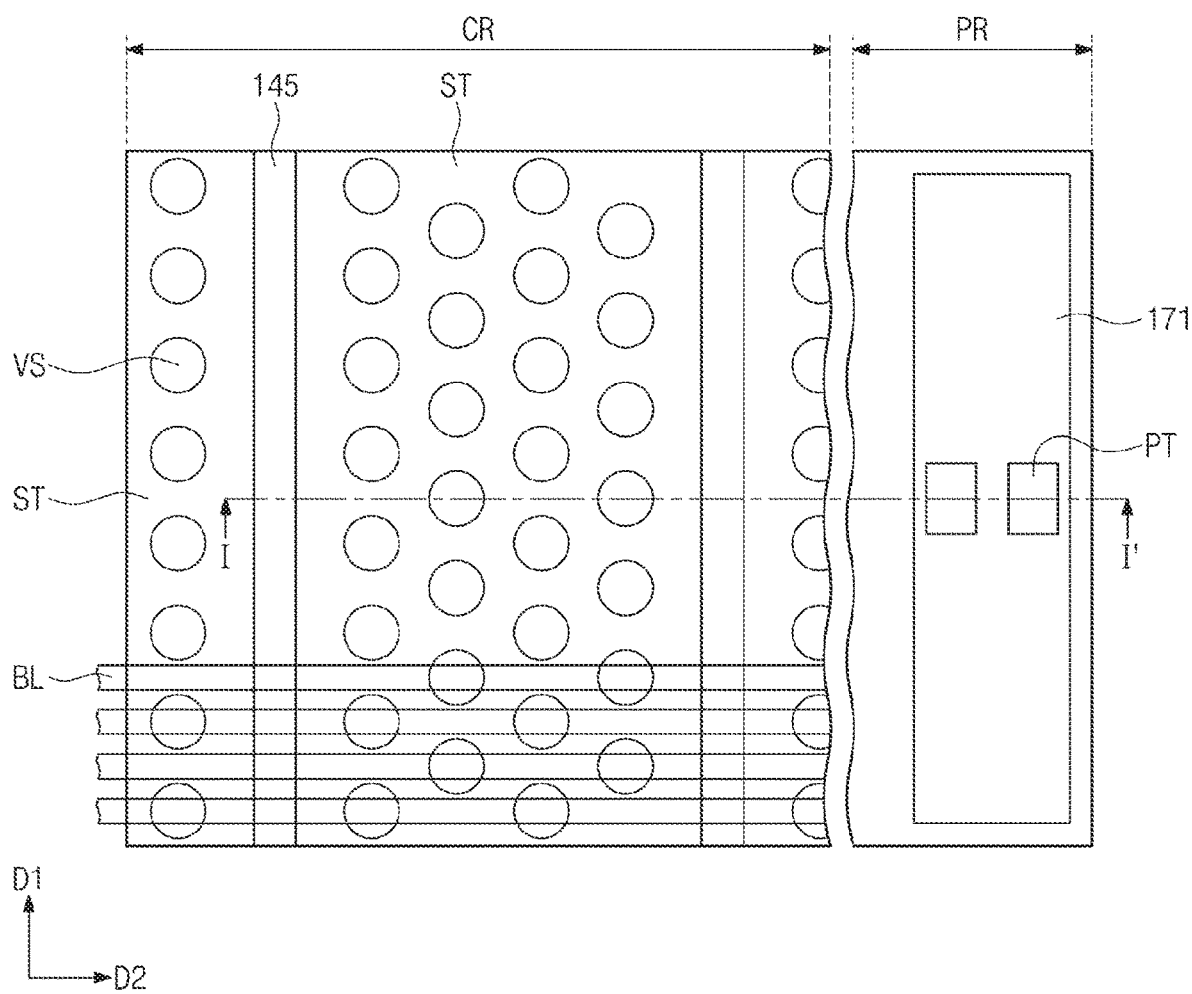
FIG. 22A illustrates a plan view showing a semiconductor memory device according to some example embodiments of inventive concepts.
Figure 22B:
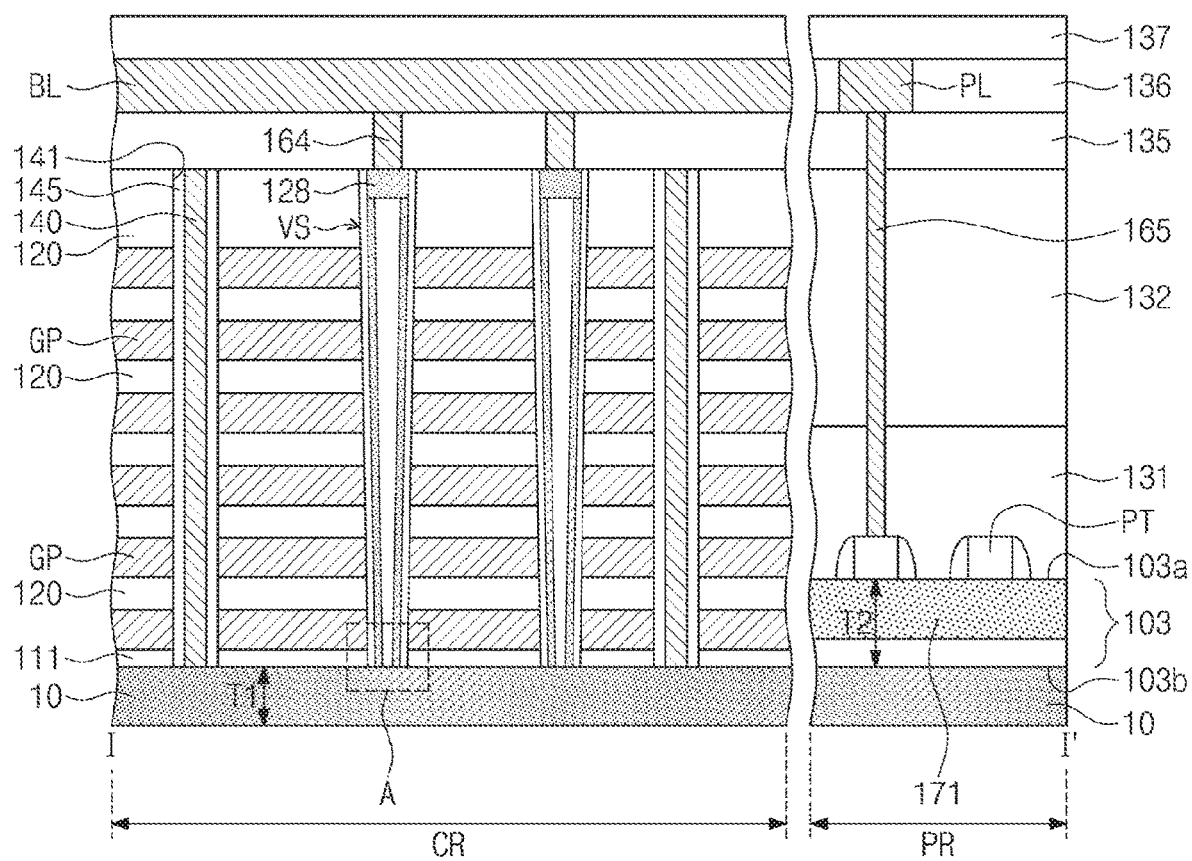
FIG. 22B illustrates a cross-sectional view taken along line I-I' of FIG. 22A.

FIG. 22A illustrates a plan view showing a semiconductor memory device according to some example embodiments of inventive concepts. FIG. 22B illustrates a cross-sectional view taken along line I-I' of FIG. 22A. Section A of FIG. 22B is corresponding to the FIGS. 3A and 3B.

Referring to FIGS. 22A and 22B, a semiconductor memory device may be provided to include a cell array region CR and a peripheral circuit region PR. For example, the semiconductor memory device may be a flash memory device. The cell array region CR may be a zone provided with a plurality of memory cells, and according to some example embodiments of inventive concepts, the cell array of FIG. 1 may be provided on the cell array region CR. The peripheral circuit region PR may be a zone provided with a word line driver, a sense amplifier, row and column decoders, and control circuits. For brevity of description, the peripheral circuit region PR is illustrated to lie on one side of the cell array region CR, but it should be recognized that the peripheral circuit region PR may be additionally disposed at least one of other sides of the cell array region CR. For example, the peripheral circuit region PR may surround the cell array region CR.

The peripheral circuit region PR may include peripheral transistors PT on a residual substrate 103. The peripheral transistors PT may include a peripheral impurity region 171 and gate electrodes on the peripheral impurity region 171. The peripheral transistors PT may include a PMOS transistor and/or an NMOS transistor, and the peripheral impurity region 171 may have conductivity of which conductive type is determined based on a type of transistor. The conductivity of the peripheral impurity region 171 will be further discussed in detail below with reference to FIGS. 42 and 43.

The residual substrate 103 may include a top surface 103a on which the gate electrodes are formed and a bottom surface 103b opposite the top surface 103a. For example, the residual substrate 103 may have a thickness T2, a distance between the top and bottom surfaces 103a and 103b, ranging from about 50 nm to about 1000 µm. A bottom surface of the peripheral impurity region 171 may be spaced apart from the bottom surface 103b of the residual substrate 103.

The residual substrate 103 may be originated from a semiconductor substrate, or a semiconductor wafer. For example, the residual substrate 103 may be a substantially single crystalline silicon layer. In this description, the term "substantially single crystalline" may mean that an object has the same crystallographic orientation without any grain boundaries. The term "substantially single crystalline" may also indicate that an object or portion is virtually single crystalline even if there are locally grain boundaries or different orientations. For example, the substantially single crystalline layer may include a plurality of low angle grain boundaries.

According to some example embodiments of inventive concepts, the peripheral circuit region PR may include a body conductive layer 10 below the residual substrate 103. The body conductive layer 10 may be in contact with the bottom surface 103b of the residual substrate 103, but inventive concepts are not limited thereto. The body conductive layer 10 may include a semiconductor material and/or a metallic material. For example, the body conductive layer 10 may include a polycrystalline semiconductor layer such as a polysilicon layer. The body conductive layer 10 may not be limited to the silicon layer, but may include a germanium layer, a silicon-germanium layer, etc. The body conductive layer 10 may be provided not only on the peripheral circuit region PR but on the cell array region CR. The body conductive layer 10 may have a thickness T1 less than the thickness T2 of the residual substrate 103. For example, the thickness T1 of the body conductive layer 10 may be in the range of about 5 nm to about 100 µm. The body conductive layer 10 may have first conductivity. For example, the first conductivity may be a p-type conductive type.

Interlayer dielectric layers 131, 132, 135, 136, and 137 may be provided to cover the peripheral transistors PT. For example, the interlayer dielectric layers 131, 132, 135, 136, and 137 may include a silicon oxide layer and/or a silicon oxynitride layer. At least one of the interlayer dielectric layers 131, 132, 135, 136, and 137 may be formed of a different material (e.g., silicon oxide versus silicon oxynitride, CVD oxide versus HDP oxide, etc.) than at least one other one of the interlayer dielectric layers 131, 132, 135, 136, and 137. At least one of the interlayer dielectric layers 131, 132, 135, 136, and 137 may be formed of a same material as at least one other one of the interlayer dielectric layers 131, 132, 135, 136, and 137. A peripheral contact 165 may be provided to penetrate first to third interlayer dielectric layers 131, 132, and 135, and may be connected to the peripheral transistor PT. A peripheral line PL may be provided in a fourth interlayer dielectric layer 136, and may be connected to the peripheral contact 165. The peripheral contact 165 and the peripheral line PL may include a conductive material such as doped silicon, metal, and conductive metal nitride.

The cell array region CR may include electrode structures ST, each of which includes gate electrodes GP that are sequentially stacked on the body conductive layer 10. Insulation layers 120 may be provided between the gate electrodes GP. For example, the gate electrodes GP and the insulation layers 120 may be alternately and repeatedly stacked on the body conductive layer 10. A buffer layer 111 may be provided between the body conductive layer 10 and a lowermost one of the gate electrodes GP. For example, the insulation layers 120 and the buffer layer 111 may include a silicon oxide layer and/or a silicon oxynitride layer. The buffer layer 111 may be thinner than the insulation layers 120.

For example, the lowermost one of the gate electrodes GP may be a gate electrode of a ground select transistor, e.g., a portion of the ground select line GSL of FIG. 1, and an uppermost one of the gate electrodes GP may be a gate electrode of a string select transistor, e.g., a portion of the string select line SSL of FIG. 1. Other ones between the lowermost and uppermost gate electrodes may be cell gate electrodes, e.g., portions of the word lines WL1 to WLn of FIG. 1. Although figures show that six gate electrodes GP are vertically stacked, the number of the gate electrodes GP may be more or less than that shown in figures.

Each of the gate electrodes GP in the electrode structures ST may extend in a first direction D1. The electrode structures ST may be spaced apart from each other in a second direction D2 across separation patterns 145. For example, separation trenches 141 may be provided in the electrode structures ST, and the separation patterns 145 may be provided in the separation trenches 141. Each of the separation patterns 145 may extend in the first direction D1. For example, the separation patterns 145 may include one or more of a silicon oxide layer, a silicon nitride layer, and a silicon oxynitride layer.

Common source lines 140 may be provided to penetrate the separation patterns 145 and may be connected to the body conductive layer 10. For example, each of the common source lines 140 may have a plate shape that extends along the first direction D1. Alternatively, the common source lines 140 may include a plurality of contacts each of which penetrates one separation pattern 145.

The common source lines 140 may include one or more of doped silicon, metal, and conductive metal nitride. For example, when the common source lines 140 include doped silicon, the common source lines 140 may have conductivity, or a second conductive type, different from that of the body conductive layer 10. For example, the second conductivity may be an n-type conductive type. Alternatively, when the common source lines 140 include a metallic material such as tungsten, titanium, tantalum, or any nitride thereof, the common source lines 140 and the body conductive layer 10 may be provided therebetween with additional metal silicide layer including tungsten silicide, etc.

Vertical structures VS may be provided to penetrate the electrode structures ST, and may be connected to the body conductive layer 10. Each of the vertical structures VS may have a circular pillar shape whose width decreases approaching its bottom from its top. The vertical structures VS may be two-dimensionally arranged on the body conductive layer 10. In this description, the term "two-dimensionally arranged" may mean that some components are arranged in a plurality of rows and columns along the first and second directions D1 and D2 that are perpendicular to each other. For example, one column may be made by a plurality of the vertical structures VS that are arranged along the first direction D1, and one electrode structure ST may be provided therein with a plurality of columns of the vertical structures ST. For example, as illustrated in FIG. 22A, four columns of the vertical structures VS may be disposed in one electrode structure ST, but this is only an example so that more or less than 4 columns may be disposed in one electrode structure ST. In some embodiments, the vertical structures VS on odd columns may be offset in the first direction D1 from the vertical structures VS on even columns.

The vertical structures VS may include pad patterns 128 at or on their top portions. The pad patterns 128 may include polysilicon or metal. The pad patterns 128 may have sidewalls in contact with an inner surface of the data storage layer DS.

Bit lines BL may be provided on the vertical structures VS. The bit lines BL may each be connected in common to a plurality of the vertical structures VS. For brevity of description, all of the bit lines BL are not illustrated in FIG. 22A. The bit lines BL may be electrically connected through bit line contacts 164 to the vertical structures VS. A connection type between the bit lines BL and the vertical structures VS is not limited to that shown in FIG. 22A, but a variety of connection types are available. For example, subsidiary bit lines may be provided between the bit lines BL and the bit line contacts 164. The bit lines BL and the bit line contacts 164 may include one or more of metal (e.g., tungsten, copper, or aluminum), conductive metal nitride (e.g., titanium nitride or tantalum nitride), and transition metal (e.g., titanium or tantalum).

In a semiconductor memory device according to some example embodiments of inventive concepts, no residual substrate 103 may be provided on the cell array region CR. The vertical structures VS may be connected to the common source lines 140 through the body conductive layer 10 whose thickness is relatively small. As a result, a reduced thickness may be provided in a semiconductor memory device according to some example embodiments of inventive concepts. The thickness reduction may allow the semiconductor memory device to increase the number of stacked gate electrodes and/or of gate stacks including the stacked gate electrodes, thereby enhancing integration of the semiconductor memory device.

FIGS. 23 to 30 illustrate cross-sectional views taken along line I-I' of FIG. 22A, showing a method of manufacturing a semiconductor memory device according to some example embodiments of inventive concepts.

Figure 23:
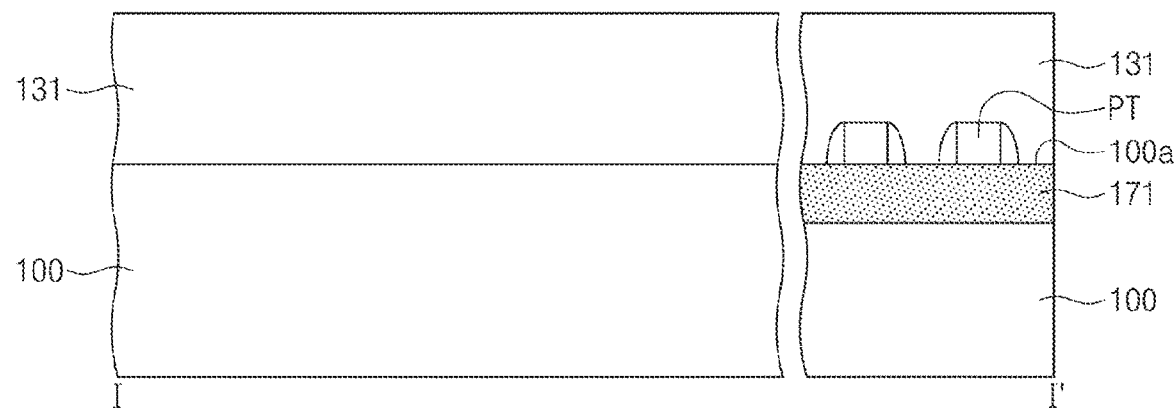
FIGS. 23 to 30 illustrate cross-sectional views taken along line I-I' of FIG. 22A, showing a method of manufacturing a semiconductor memory device according to some example embodiments of inventive concepts.

Referring to FIGS. 22A and 23, a semiconductor substrate 100 may be provided to include a cell array region CR and a peripheral circuit region PR. For example, the semiconductor substrate 100 may be a single crystalline silicon substrate. The semiconductor substrate 100 may be doped with, for example, a first conductivity type impurity. The first conductivity may be a p-type conductive type. Peripheral transistors PT may be formed on the peripheral circuit region PR. The formation of the peripheral transistors PT may include forming a peripheral impurity region 171 and forming gate electrodes on the peripheral impurity region 171. Types of the peripheral transistors PT may determine conductivity of the peripheral impurity region 171. After the peripheral transistors PT are formed, a first interlayer dielectric layer 131 may be formed to cover the semiconductor substrate 100. For example, the first interlayer dielectric layer 131 may be formed of a silicon oxide layer.

Figure 24:
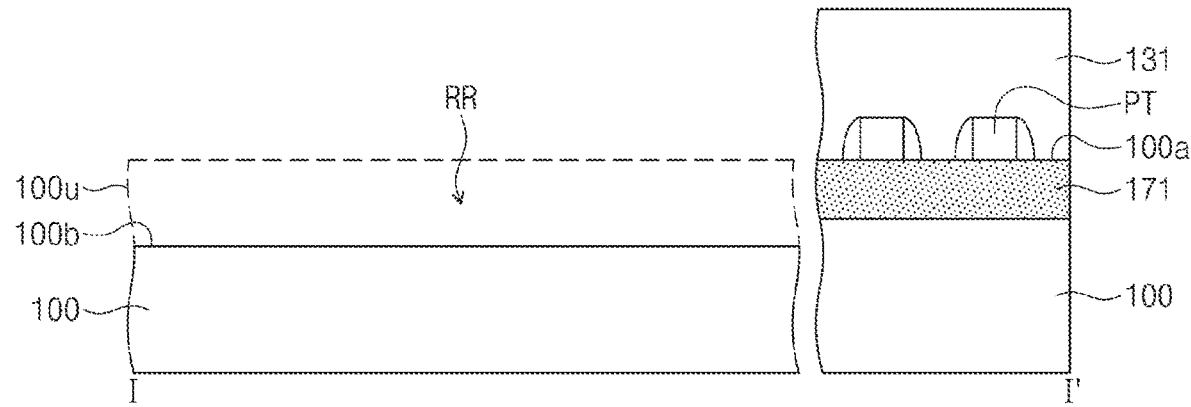

Referring to FIGS. 22A and 24, an upper portion 100u of the semiconductor substrate 100 on the cell array region CR may be removed to form a recess region RR. The formation of the recess region RR may result in step difference between a top surface 100b of the semiconductor substrate 100 on the cell array region CR and a top surface 100a of the semiconductor substrate 100 on the peripheral circuit region PR. For example, a thickness of the upper portion 100u removed from the semiconductor substrate 100 may be in the range of about 50 nm to about 1000 μm. The formation of the recess region RR may include forming on the semiconductor substrate 100 a mask pattern exposing the cell array region CR and performing an etching process on the first interlayer dielectric layer 131 and the semiconductor substrate 100 using the mask pattern as an etch mask. The etching process may include a plurality of dry or wet etching processes.

According to some example embodiments of inventive concepts, the etch stop layer 113 discussed with reference to FIG. 3B may be formed on the semiconductor substrate 100. The etch stop layer 113 may be formed substantially only on the cell array region CR. The etch stop layer 113 may include a material exhibiting an etch selectivity to all of insulation layers 120 and sacrificial layers 125 which will be discussed below. For example, the etch stop layer 113 may include a metal oxide layer such as an aluminum oxide layer. Alternatively, no etch stop layer 113 may be formed. The formation of the etch stop layer 113 may be performed in this step or may be preceded by the formation of a buffer layer 111 which will be discussed below.

Figure 25:
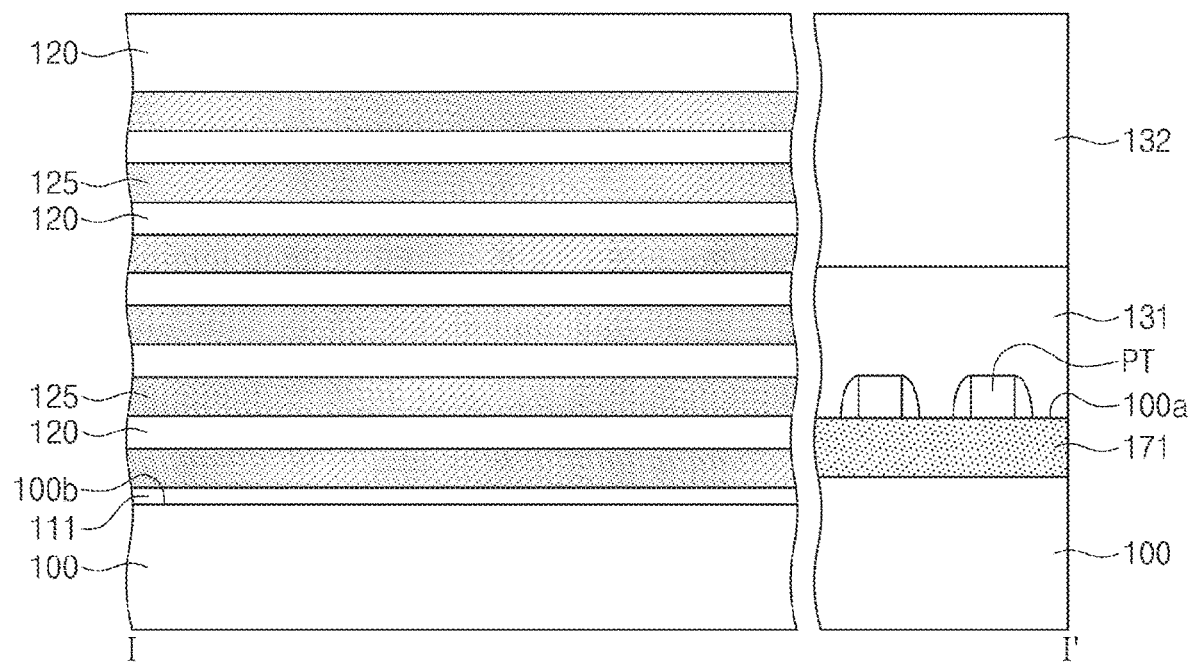

Referring to FIGS. 22A and 25, a buffer layer 111 may be formed on the cell array region CR, and then sacrificial layers 125 and insulation layers 120 may be alternately and repeatedly formed on the buffer layer 111. The buffer layer 111 may include a silicon oxide layer. For example, the buffer layer 111 may be formed by thermal oxidation. The sacrificial layers 125 and the insulation layers 120 may include materials exhibiting an etch selectivity to each other. For example, the sacrificial layers 125 may be formed of a material that may be etched while suppressing the insulation layers 120 from being etched when the sacrificial layers 125 are etched using a desired (and/or alternatively predetermined) etch recipe.

This etch selectivity may be quantitatively expressed as a ratio of an etch rate of the sacrificial layers 125 to an etch rate of the insulation layers 120. In some embodiments, the sacrificial layers 125 may include one of materials exhibiting an etch selectivity of about 1:10 to about 1:200 (more narrowly about 1:30 to about 1:100) with respect to the insulation layers 120. For example, the sacrificial layers 125 may include a silicon nitride layer, a silicon oxynitride layer, or a polysilicon layer, and the insulation layers 120 may include a silicon oxide layer. The sacrificial layers 125 and the insulation layers 120 may be formed by chemical vapor deposition (CVD). The sacrificial layers 125 and the insulation layers 120 may be formed on the peripheral circuit region PR and then removed from the peripheral circuit region PR. Thereafter, a second interlayer dielectric layer 132 may be formed to cover the peripheral circuit region PR. For example, the second interlayer dielectric layer 132 may include a silicon oxide layer, but is not limited thereto.

Figure 26:
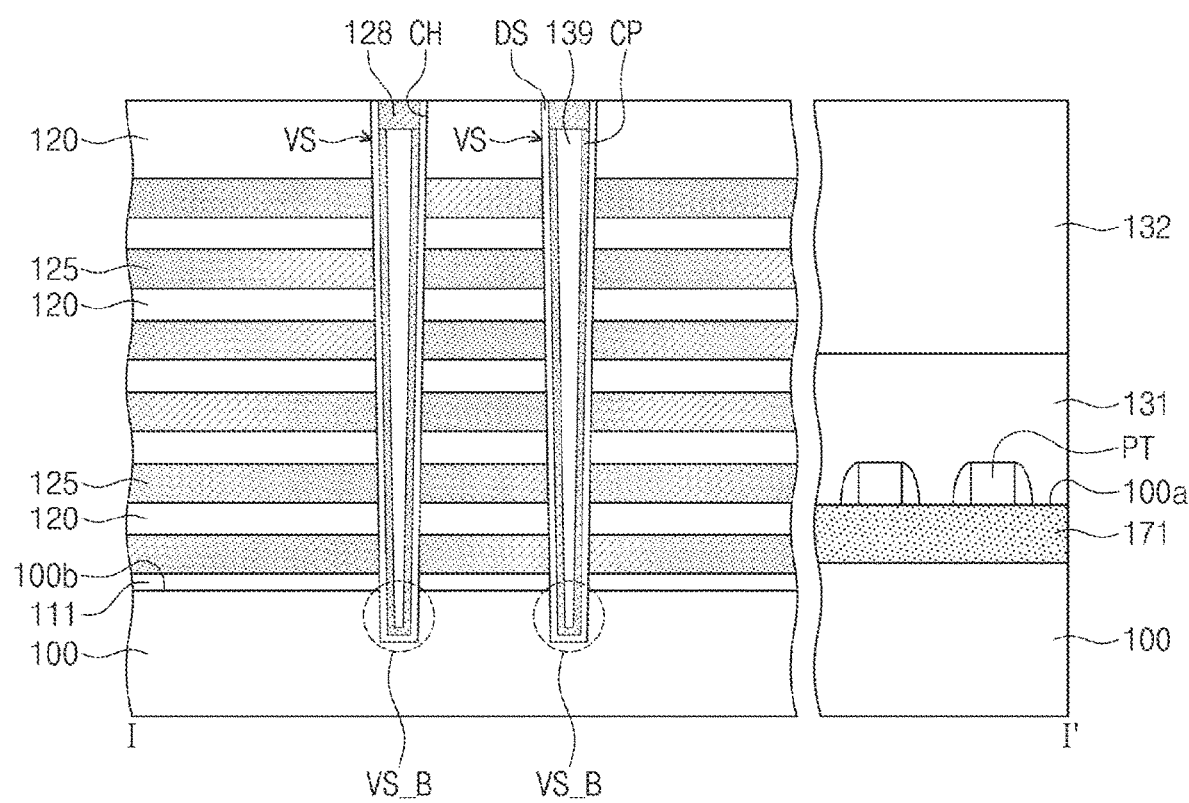

Referring to FIGS. 22A and 26, vertical structures VS may be formed to penetrate the sacrificial layers 125 and the insulation layers 120 and to be connected to the semiconductor substrate 100. An anisotropic etching process may be performed to form vertical holes CH that penetrate the sacrificial layers 125 and the insulation layers 120 and expose the semiconductor substrate 100, and then a deposition process may be performed to sequentially deposit a data storage layer DS, a channel semiconductor layer CP, and a filing insulation layer 139 in each of the vertical holes CH, thereby forming the vertical structures VS. The data storage layer DS, the channel semiconductor layer CP, and the filing insulation layer 139 may be configured the same as that discussed with reference to FIGS. 3A and 3B, and may be formed by one or more of chemical vapor deposition, atomic layer deposition, and sputtering. The data storage layer DS and the channel semiconductor layer CP may be conformally formed along a sidewall and a floor surface of the vertical hole CH. The filing insulation layer 139 may completely fill the vertical hole CH. Upper portions of the filing insulation layer 139 and the channel semiconductor layer CP may be removed, and then pad patterns 128 may be formed to fill the removed upper portions. The pad patterns 128 may include metal or doped polysilicon.

The vertical structures VS may have lower portions VS_B inserted into an upper portion of the semiconductor substrate 100. For example, when the vertical holes CH are formed, floor surfaces of the vertical holes CH may be over-etched below the top surface 100b of the semiconductor substrate 100, and as a result, the lower portions VS_B of the vertical structures VS may be embedded in the upper portion of the semiconductor substrate 100. A lower portion of the channel semiconductor layer CP may be surrounded by the data storage layer DS in each lower portion VS_B of the vertical structures VS. The channel semiconductor layer CP may be spaced apart from the semiconductor substrate 100 across the data storage layer DS.

Figure 27:
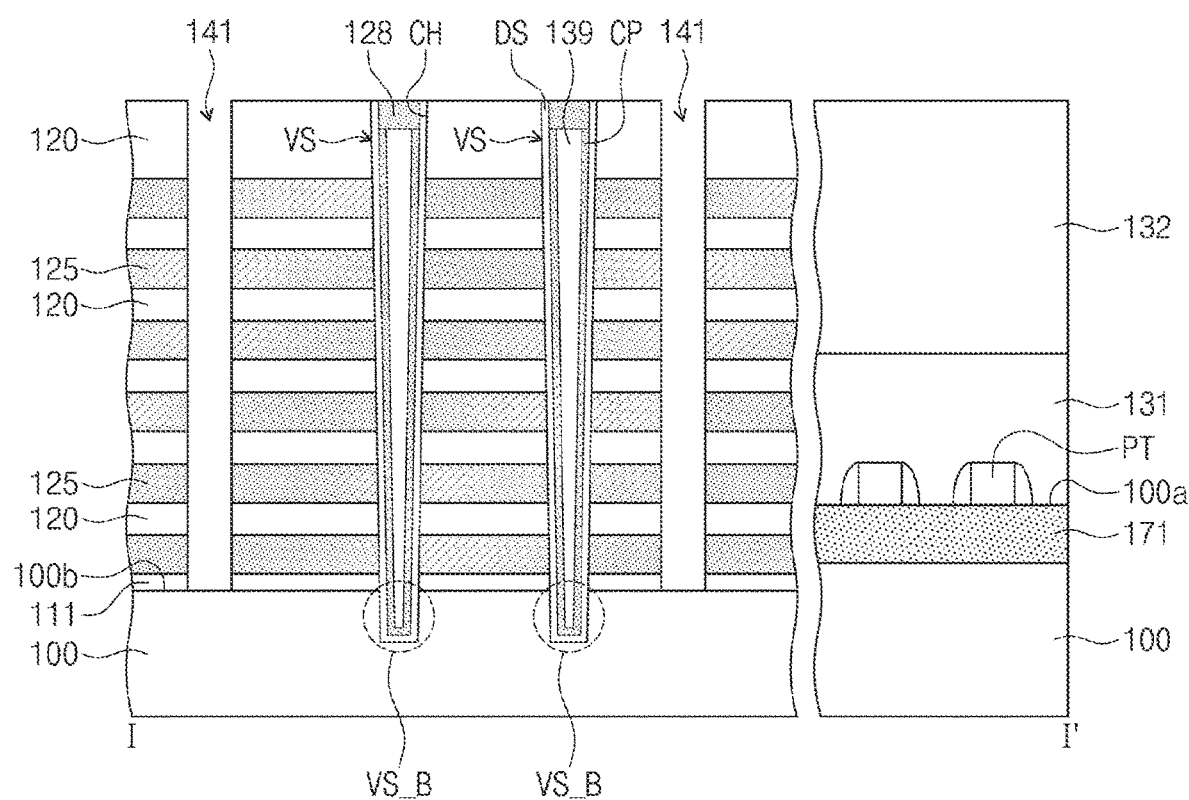

Referring to FIGS. 22A and 27, separation trenches 141 may be formed to penetrate the sacrificial layers 125 and the insulation layers 120. The separation trenches 141 may expose the top surface 100b of the semiconductor substrate 100, but inventive concepts are not limited thereto. The buffer layer 111 or the etch stop layer 113, which is discussed with reference to FIG. 3B, may remain in the separation trenches 141. The separation trenches 141 may be formed by an anisotropic etching process.

Figure 28:
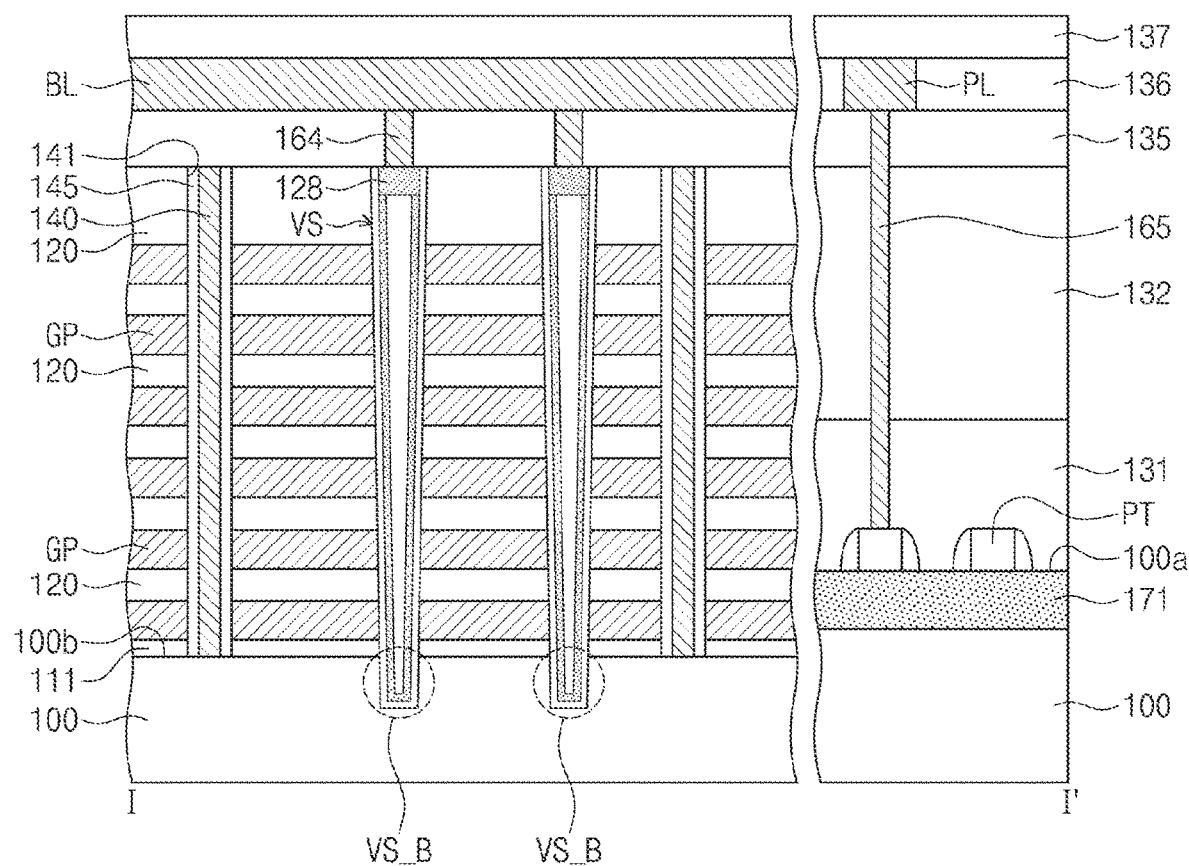

Referring to FIGS. 22A and 28, the sacrificial layers 125 may be replaced with gate electrodes GP. For example, a process may be performed to remove the sacrificial layers 125 exposed to the separation trenches 141, and the gate electrodes GP may be formed in spaces where the sacrificial layers 125 are removed. An etchant including phosphoric acid may be used to remove the sacrificial layers 125. In some embodiments, before the gate electrodes GP are formed, a blocking insulation layer may be conformally formed in the space where the sacrificial layers 125 are removed.

The separation trenches 141 may be provided therein with common source lines 140 that penetrate the separation patterns 145 and are connected to the semiconductor substrate 100. The common source lines 140 may be formed to have a plate shape that extends along the first direction D1. For example, the separation patterns 145 may be formed to have space shapes that cover sidewalls of the separation trenches 141, and the common source lines 140 may be formed to fill the separation trenches 141. Alternatively, contact holes may be formed to penetrate the separation patterns 145, and the common source lines 140 may be formed to fill the contact holes. The separation patterns 145 may be formed of one or more of a silicon oxide layer, a silicon nitride layer, and a silicon oxynitride layer. The common source lines 140 may be formed of one or more of doped silicon, metal, and conductive metal nitride.

For example, when the common source lines 140 include doped silicon, the common source lines 140 may be in-situ doped to have conductivity, a second conductive type, different from that of the semiconductor substrate 100. For example, the second conductivity may be an n-type conductive type.

A third interlayer dielectric layer 135 and a fourth interlayer dielectric layer 136 may be formed to cover the cell array region CR and the peripheral circuit region PR. Bit line contacts 164 may be formed to penetrate the third interlayer dielectric layer 135 and to be connected to the vertical structures VS, and a peripheral contact 165 may be formed to penetrate the first to third interlayer dielectric layers 131, 132, and 135 and to be connected to the peripheral transistor PT. Bit lines BL and a peripheral line PL may be formed in the fourth interlayer dielectric layer 136. A fifth interlayer dielectric layer 137 may be formed to cover the bit lines BL and the peripheral line PL. The third to fifth interlayer dielectric layers 135, 136, and 137 may be formed of a silicon oxide layer, but are not limited thereto. The bit lines BL, the peripheral line PL, and the contacts 164 and 165 may be formed of one of metal (e.g., tungsten, copper, or aluminum), conductive metal nitride (e.g., titanium nitride or tantalum nitride), and transition metal (e.g., titanium or tantalum).

Figure 29:
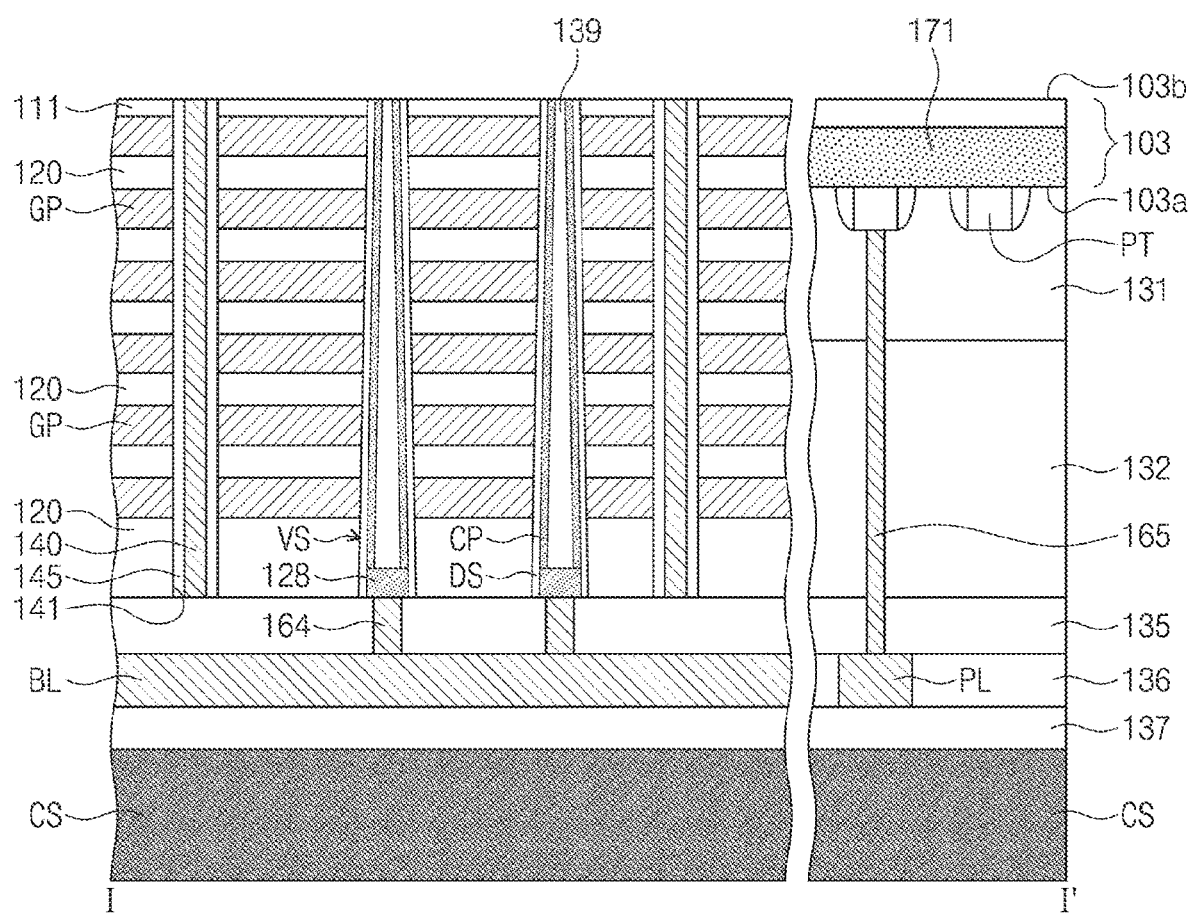

Referring to FIGS. 22A and 29, a removal process may be performed to remove the semiconductor substrate 100. A carrier substrate CS may be provided on the fifth interlayer dielectric layer 137, and a bottom surface of the semiconductor substrate 100 may be turned to face upward prior to the removal process of the semiconductor substrate 100. The carrier substrate CS may be an insulating substrate, such as glass, or a conductive substrate, such as metal. For example, the carrier substrate CS may be adhered to the fifth interlayer dielectric layer 137 with an adhesive tape and/or a glue layer therebetween.

The removal process of the semiconductor substrate 100 may include chemical mechanical polishing. The removal process of the semiconductor substrate 100 may expose the channel semiconductor layer CP. For example, when the semiconductor substrate 100 is removed, a portion of the data storage layer DS surrounding the channel semiconductor layer CP may be removed to expose an end portion of the channel semiconductor layer CP. In some embodiments, the removal process of the semiconductor substrate 100 may be performed until the lower portions VS_B of the vertical structures VS illustrated in FIG. 28 are removed.

The removal process of the semiconductor substrate 100 may remove the semiconductor substrate 100 from the cell array region CR. Accordingly, on the cell array region CR, the buffer layer 111 may be exposed, or the etch stop layer 113 discussed with reference to FIG. 3B may be exposed. Because the semiconductor substrate 100 has experienced the formation of the recess region RR discussed with reference to FIG. 24, the semiconductor substrate 100 may be caused to leave its portion (referred to hereinafter as a residual substrate 103) on the peripheral circuit region PR. The residual substrate 103 may include an exposed bottom surface 103b and a top surface 103a opposite the bottom surface 103b.

Figure 30:
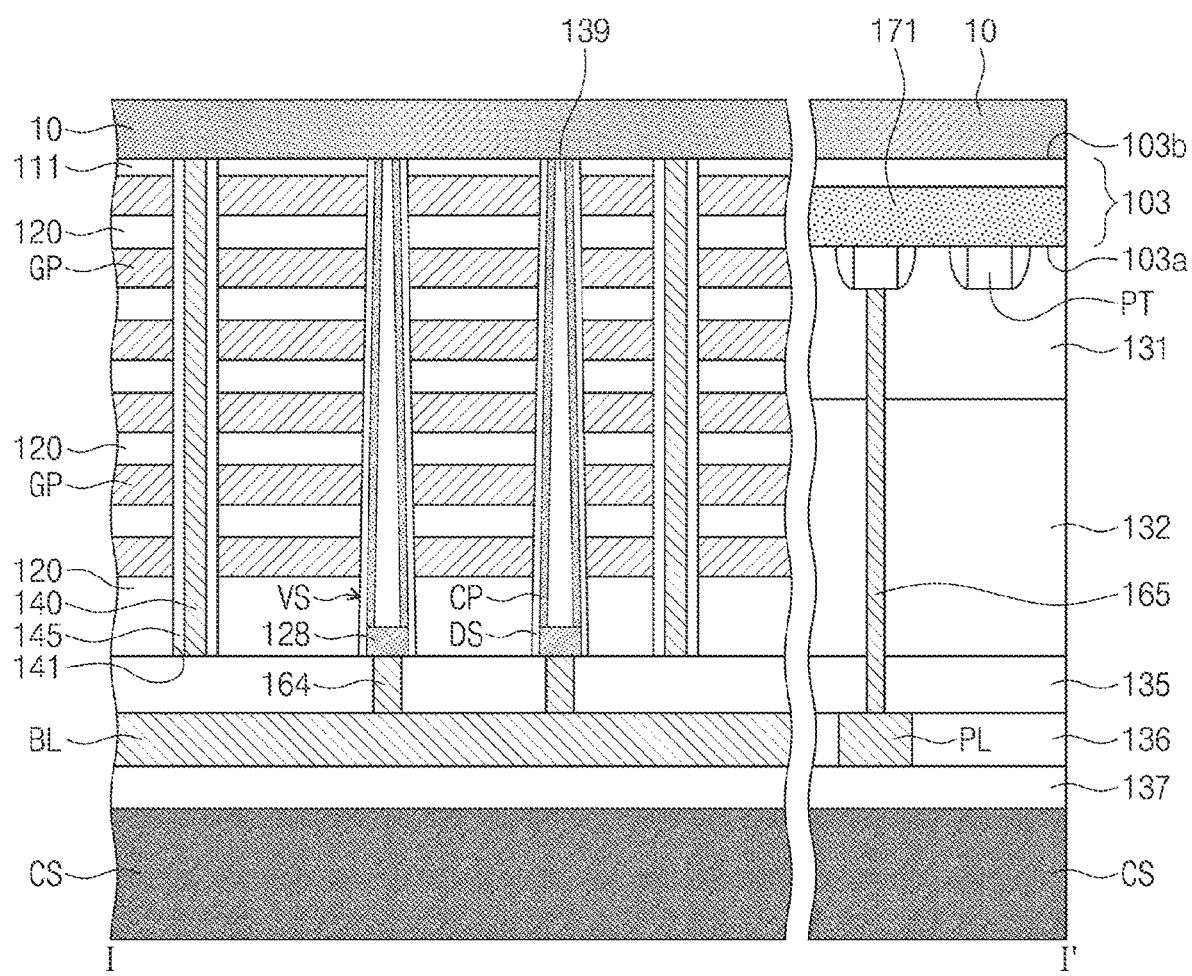

Referring to FIGS. 22A and 30, a body conductive layer 10 may be formed to cover the cell array region CR and the peripheral circuit region PR. The body conductive layer 10 may include a semiconductor material and/or a metallic material. For example, the body conductive layer 10 may be formed of polysilicon. The body conductive layer 10 may be in-situ doped to have first conductivity. The body conductive layer 10 may be formed by chemical vapor deposition or atomic layer deposition. For example, the formation of the body conductive layer 10 may include forming an amorphous silicon layer and performing an annealing process on the amorphous silicon layer. The annealing process may be performed at a temperature of about 700° C. to about 1000° C. For example, the body conductive layer 10 may have a thickness ranging from 5 nm to about 100 μm. The carrier substrate CS may then be removed, thereby manufacturing a semiconductor memory device as discussed with reference to FIGS. 22A and 22B.

On the peripheral circuit region PR, the body conductive layer 10 may be formed on the bottom surface 103b of the residual substrate 103. On the cell array region CR, the body conductive layer 10 may be connected to the channel semiconductor layer CP. For example, the body conductive layer 10 may be in direct contact with the channel semiconductor layer CP.

With increasing height of vertical semiconductor memory devices, the processing difficulty is increasing in electrical connection between the channel semiconductor layers and the semiconductor substrate. For example, a manufacturing process may include an operation to remove at least a portion of the data storage layer to electrically connect the channel semiconductor layers to the semiconductor substrate. According to some example embodiments of inventive concepts, the semiconductor substrate 100 may be removed from the cell array region CR and at the same time the channel semiconductor layers CP may be exposed, such that the body conductive layer 10 may be connected to the channel semiconductor layers CP with no separate etching process and thus the manufacturing process may be simplified.

FIGS. 31 to 38 illustrate cross-sectional views taken along line I-I' of FIG. 22A, showing a semiconductor memory device according to some example embodiments of inventive concepts. For brevity of description, explanations of duplicate components will be omitted.

Figure 31:
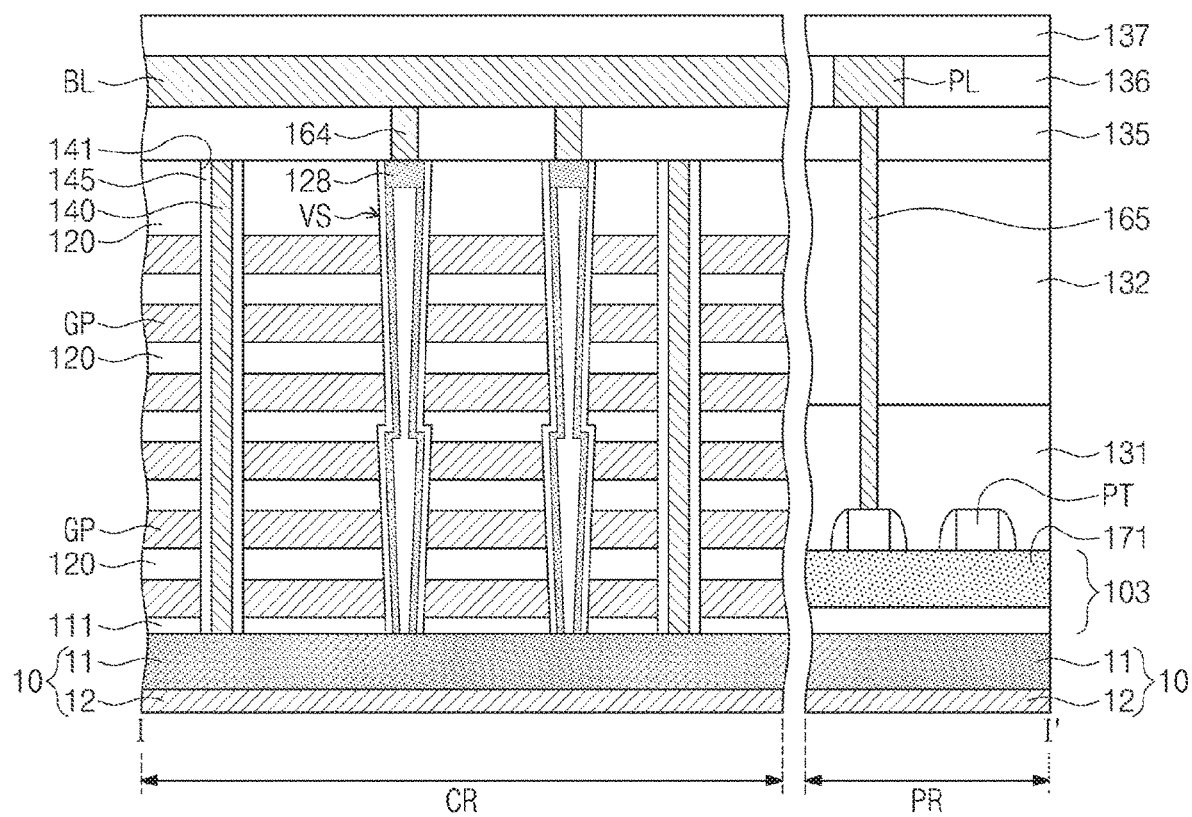
FIGS. 31 to 38 illustrate cross-sectional views taken along line I-I' of FIG. 22A, showing a semiconductor memory device according to some example embodiments of inventive concepts.

Referring to FIG. 31, a polycrystalline semiconductor layer 11 and a metal layer 12 may be included in the body conductive layer 10 of a semiconductor memory device according to some example embodiments of inventive concepts. The metal layer 12 may be spaced apart from the vertical structures VS across the polycrystalline semiconductor layer 11. The polycrystalline semiconductor layer 11 may be substantially the same as the polycrystalline semiconductor layer discussed with reference to FIG. 22B. For example, the polycrystalline semiconductor layer 11 may be a polycrystalline silicon layer. The metal layer 12 may include one or more of tungsten, titanium, tantalum, and any conducive nitride thereof. The metal layer 12 may be formed thinner the polycrystalline semiconductor layer 11. For example, the metal layer 12 may be formed by sputtering. In some embodiments, a plurality of etching processes may be performed to form vertical holes for forming the vertical structures VS, and as a result, the vertical structures VS may have portions whose width increases or decreases discontinuously.

Figure 32:
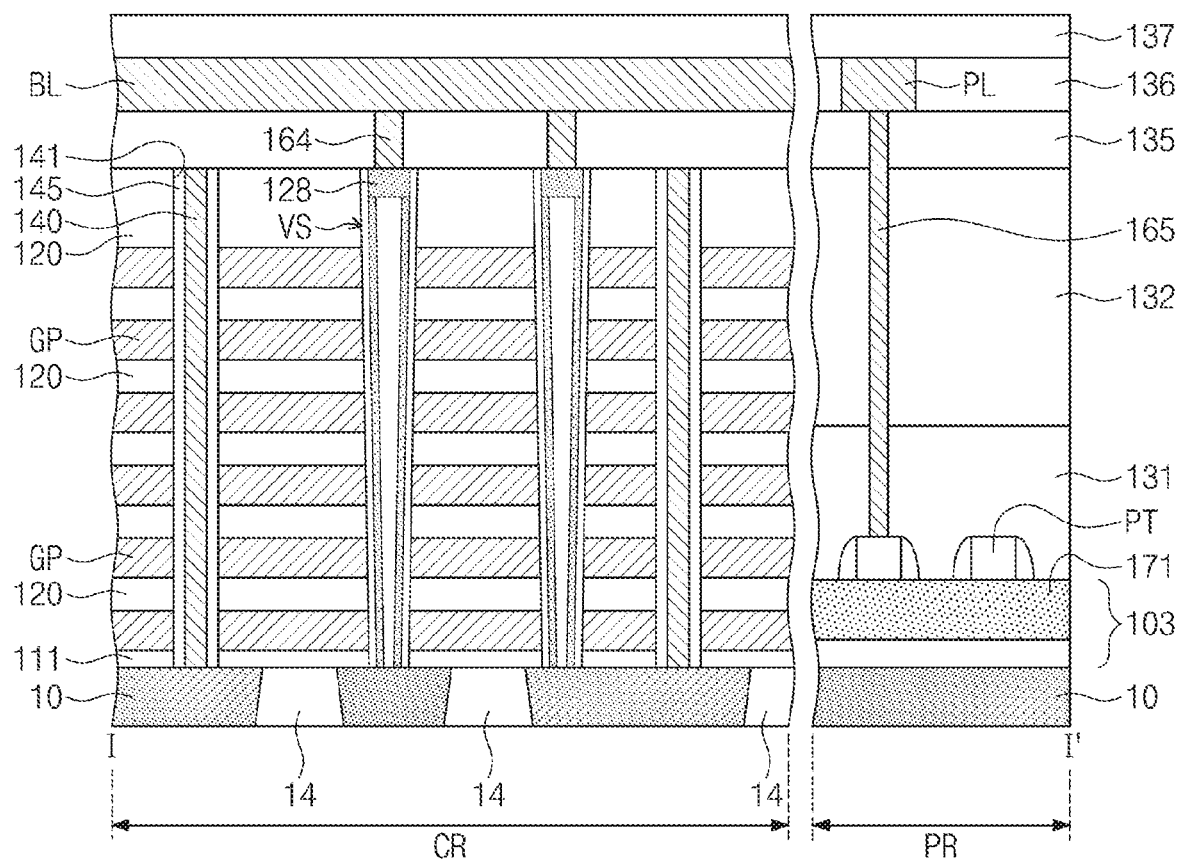

Referring to FIG. 32, insulation patterns 14 may be included in the body conductive layer 10 of a semiconductor memory device according to some example embodiments of inventive concepts. For example, the insulation patterns 14 may penetrate the body conductive layer 10. The insulation patterns 14 may have a linear shape that extends along the first direction D1 of FIG. 22A, but inventive concepts are not limited thereto. The insulation patterns 14 may include one or more of silicon oxide, silicon nitride, and silicon oxynitride. The formation of the insulation patterns 14 may include forming the body conductive layer 10, etching the body conductive layer 10 to form trenches, and filling the trenches with an insulating material.

Figure 33:
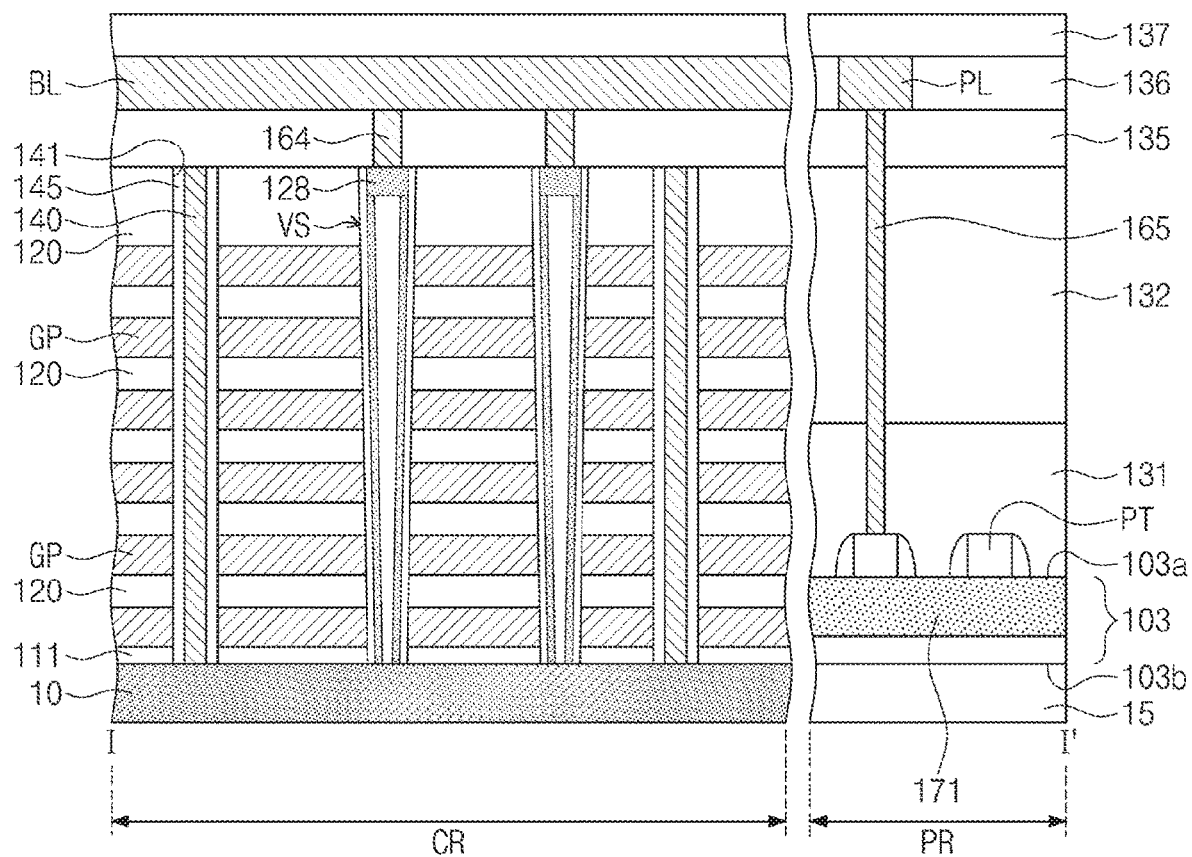

Referring to FIG. 33, the peripheral circuit region PR may be provided with a layer whose type is different from that of the body conductive layer 10. For example, an insulation pattern 15 may be provided to contact the bottom surface 103b of the residual substrate 103. The insulation pattern 15 may include one or more of silicon oxide, silicon nitride, and silicon oxynitride. The formation of the insulation pattern 15 may include removing the body conductive layer 10 on the peripheral circuit region PR to form a space on the peripheral circuit region PR and filling the space with an insulating material.

Figure 34:
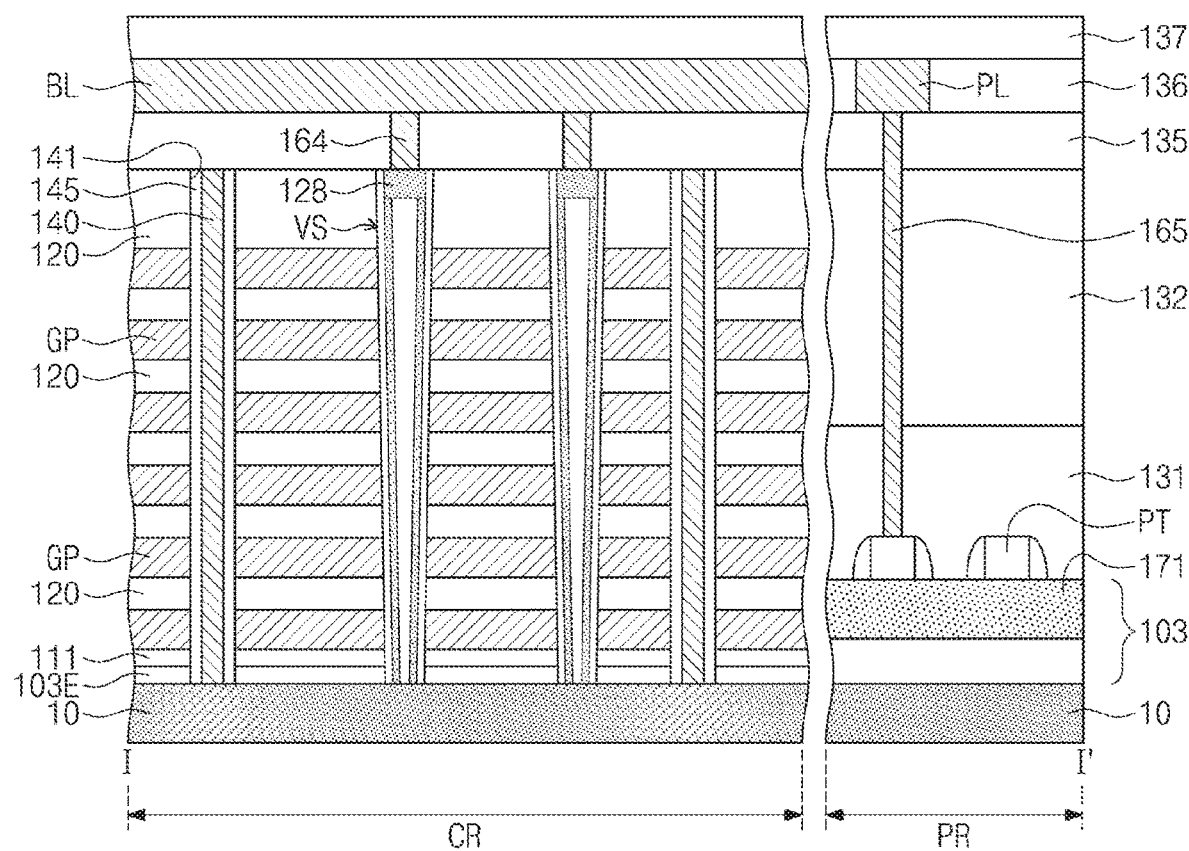

Referring to FIG. 34, the residual substrate 103 may extend onto the cell array region CR from the peripheral circuit region PR. For example, the residual substrate 103 may leave a remaining portion 103E on the cell array region CR. The residual substrate 103 on the peripheral circuit region PR may have a thickness greater than that of the remaining portion 103E on the cell array region CR. The above structural feature may be obtained by adjusting the chemical mechanical polishing discussed with reference to FIG. 29.

Figure 35:
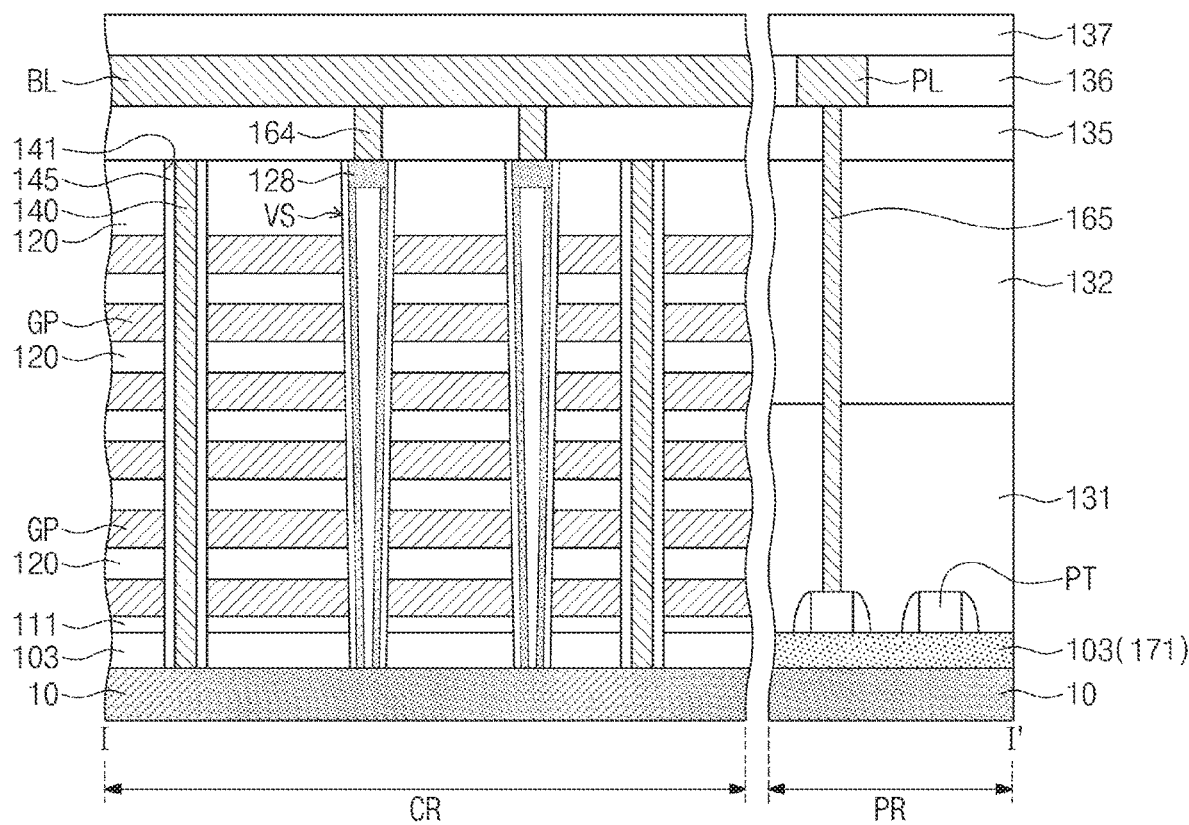

Referring to FIG. 35, the residual substrate 103 may extend onto the cell array region CR from the peripheral circuit region PR. The cell array region CR and the peripheral circuit region PR may be provided thereon with the semiconductor substrate 100 having substantially the same thickness. The above structural feature may be acquired when skipping the formation of the recess region RR discussed with reference to FIG. 24.

Figure 36:
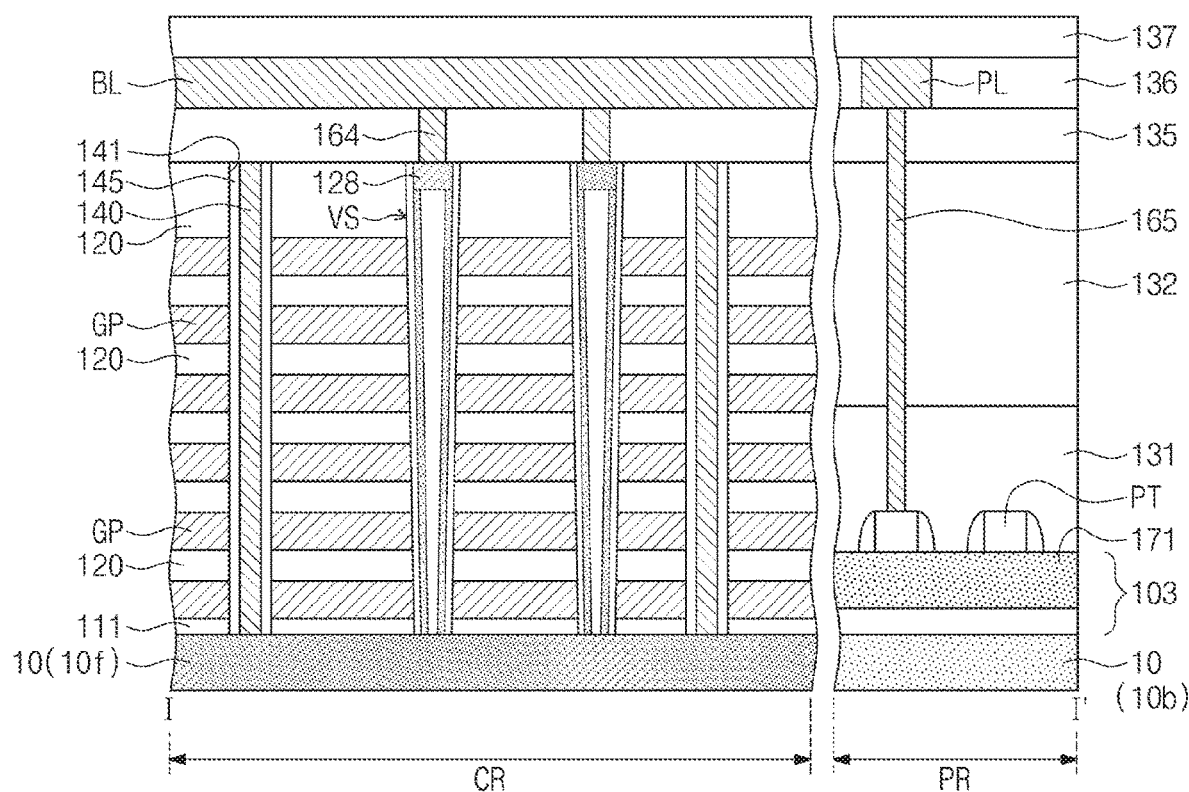

Referring to FIG. 36, according to some example embodiments of inventive concepts, the body conductive layer 10 may have a different impurity concentration between the cell array region CR and the peripheral circuit region PR. For example, an impurity concentration of a body conductive layer 10f on the cell array region CR may be greater than an impurity concentration of a body conductive layer 10b on the peripheral circuit region PR. For example, the impurity concentration of the body conductive layer 10f on the cell array region CR may be about 5 times to about 10 times greater than the impurity concentration of the body conductive layer 10b on the peripheral circuit region PR. The body conductive layer 10f may be formed and then partially removed to form the body conductive layer 10b of the peripheral circuit region PR.

Figure 37:
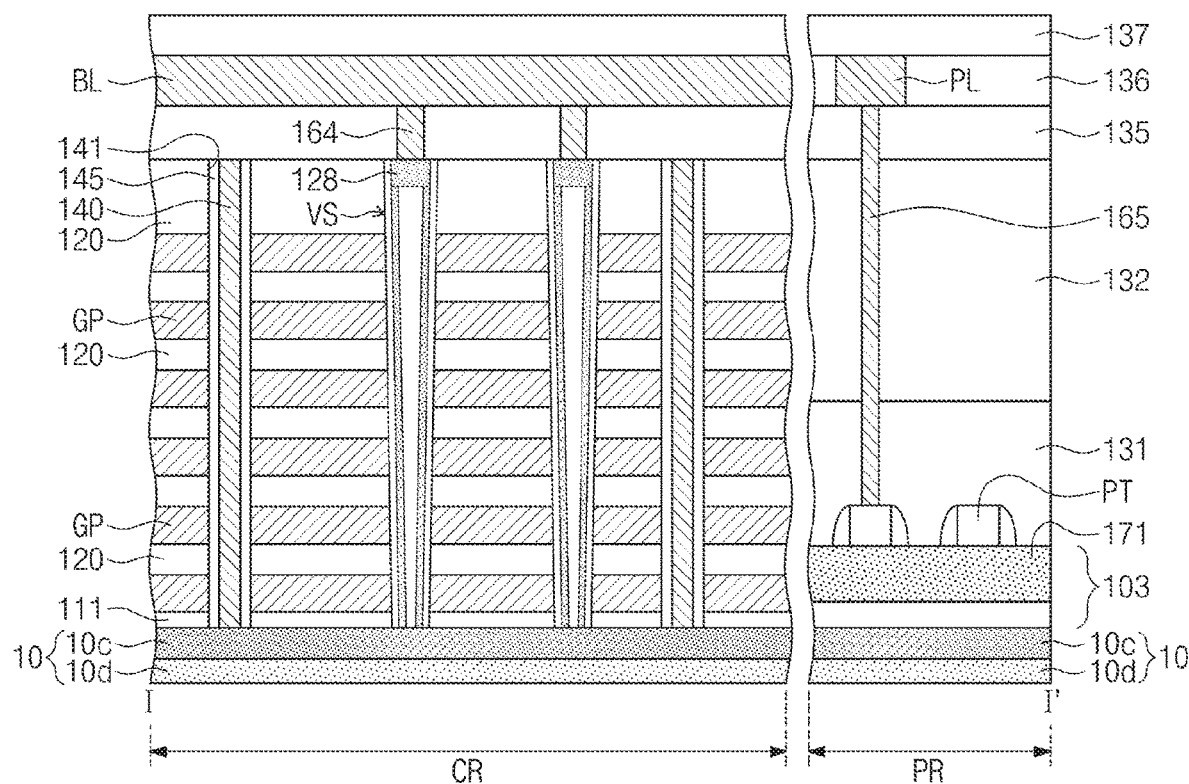

Referring to FIG. 37, according to some example embodiments of inventive concepts, the body conductive layer 10 may include a first semiconductor layer 10c and a second semiconductor layer 10d that have different impurity concentrations from each other. The second semiconductor layer 10d may be spaced apart from the vertical structures VS across the first semiconductor layer 10c. The first semiconductor layer 10c may have an impurity concentration greater than that of the second semiconductor layer 10d. For example, the impurity concentration of the first semiconductor layer 10c may be about 5 times to about 100 times greater than the impurity concentration of the second semiconductor layer 10d. The first and second semiconductor layers 10c and 10d may be formed to have different impurity concentrations by adjusting an impurity doping concentration in an in-situ process.

Figure 38:
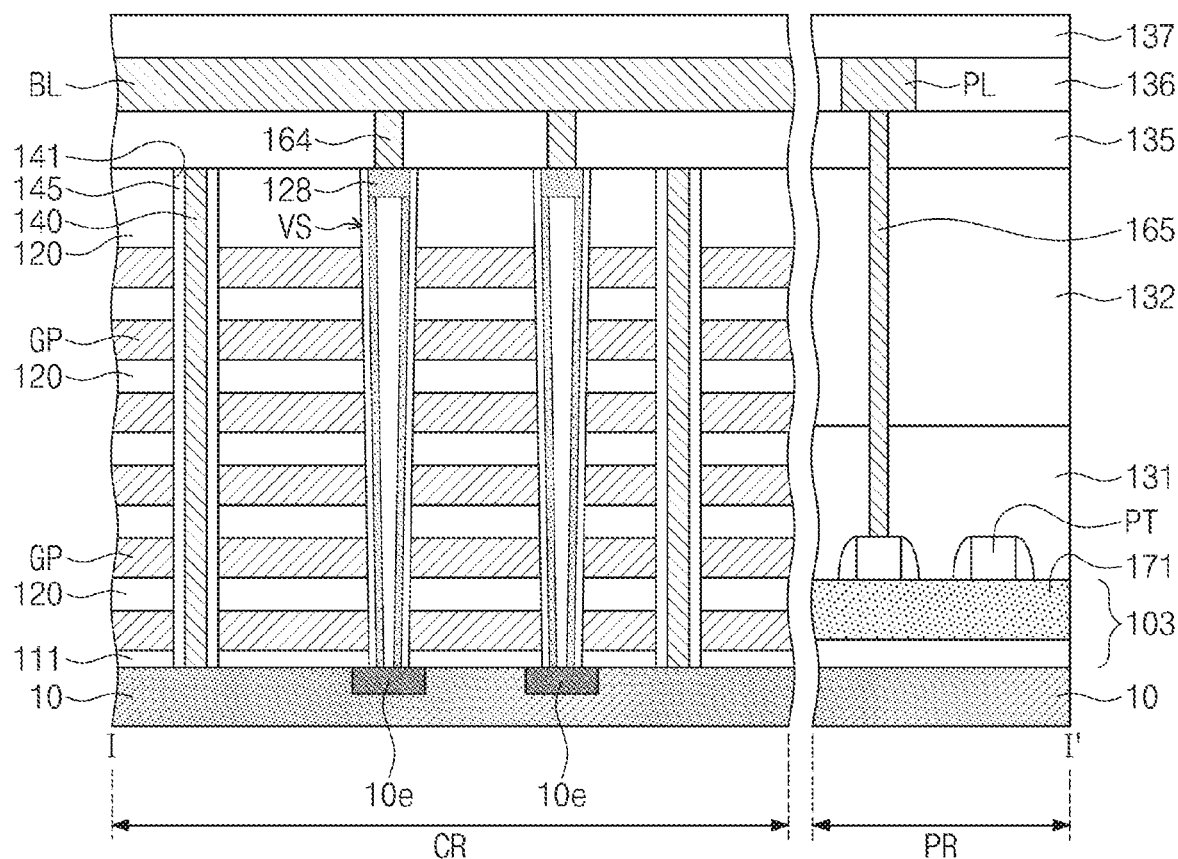

Referring to FIG. 38, according to some example embodiments of inventive concepts, the body conductive layer 10 may include impurity regions 10e that are locally formed therein. For example, the impurity regions 10e may be formed below the vertical structures VS. After the body conductive layer 10 is formed, an ion implantation process may be performed to form the impurity regions 10e. The impurity regions 10e may each have an impurity concentration greater than that of the body conductive layer 10. For example, each impurity concentration of the impurity regions 10e may be about 5 times to about 100 times greater than the impurity concentration of the body conductive layer 10.

Figure 39:
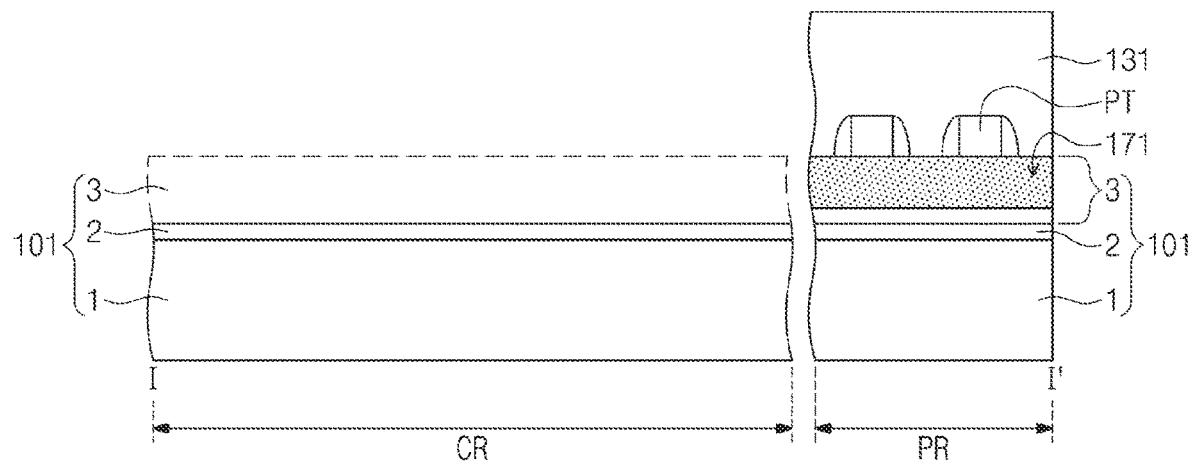
FIGS. 39 to 41 illustrate cross-sectional views taken along line I-I' of FIG. 22A, showing a method of manufacturing a semiconductor memory device according to some example embodiments of inventive concepts.
Figure 40:
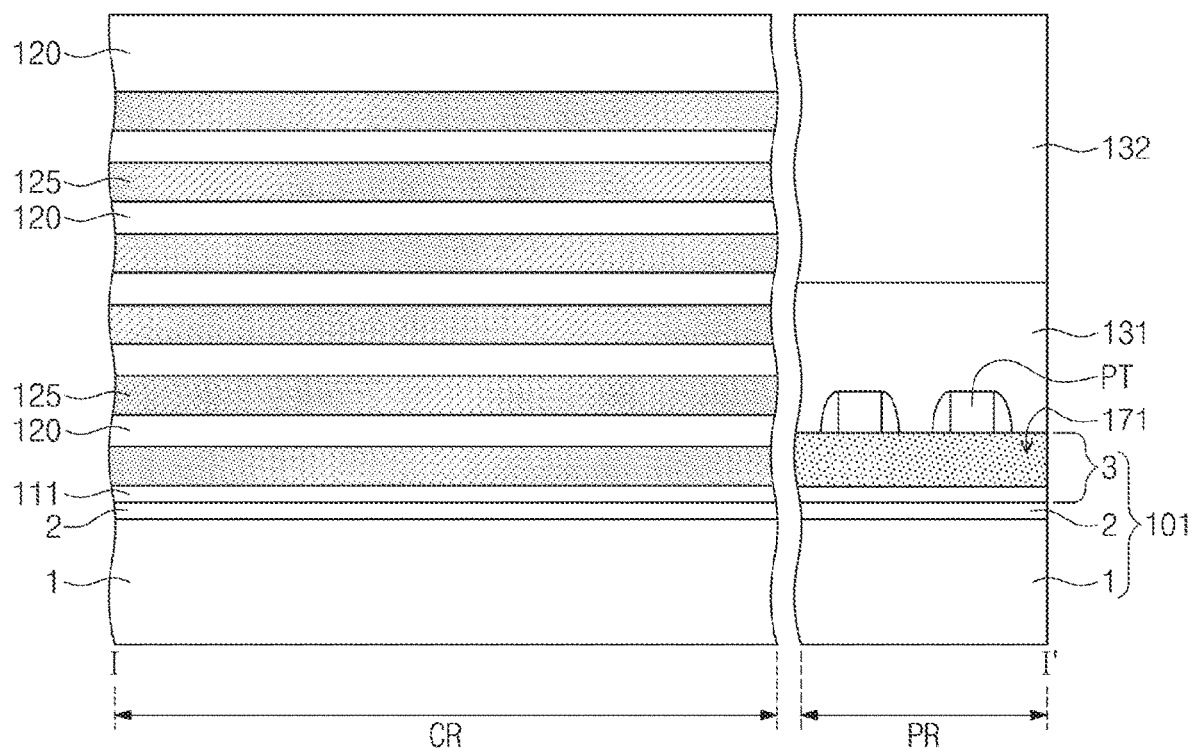
Figure 41:
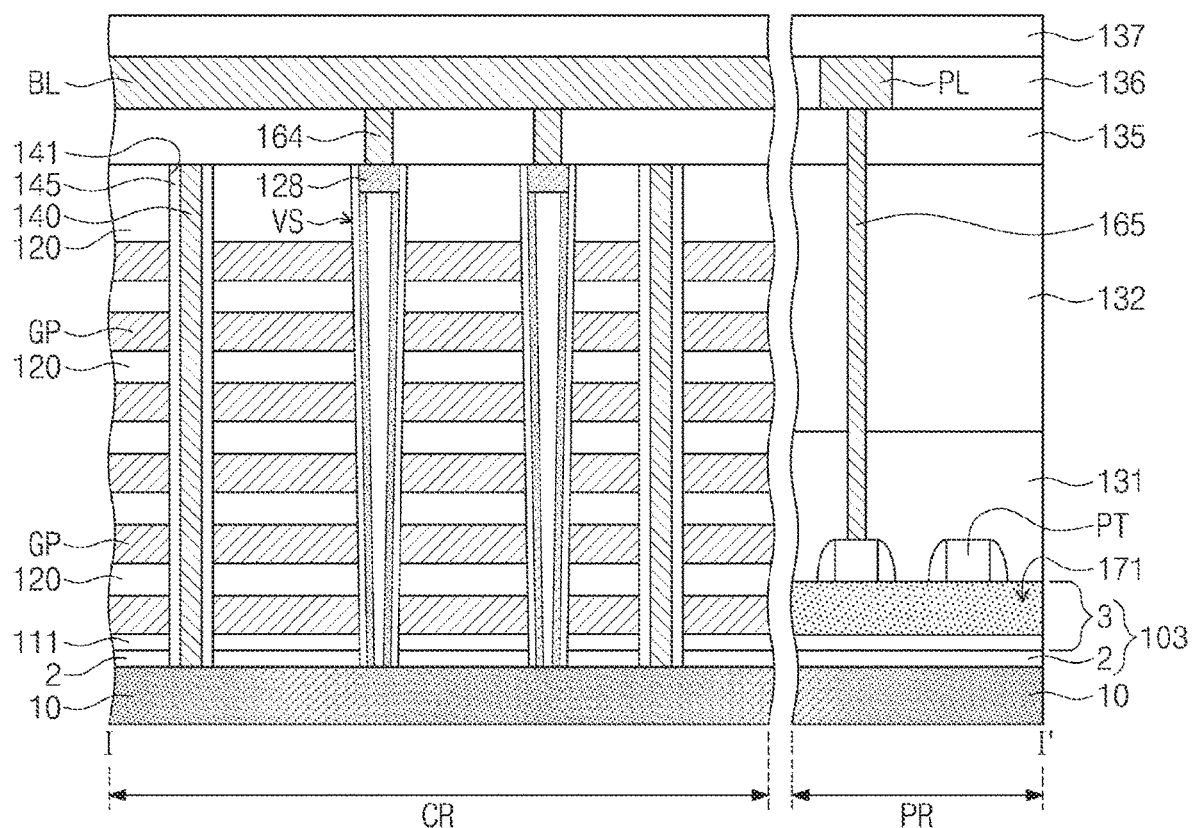

FIGS. 39 to 41 illustrate cross-sectional views taken along line I-I' of FIG. 22A, showing a method of manufacturing a semiconductor memory device according to some example embodiments of inventive concepts. For brevity of description, explanations of duplicate components will be omitted.

Referring to FIGS. 22A and 39, a semiconductor substrate 101 may be provided. The semiconductor substrate 101 may include therein an insulation layer. For example, the semiconductor substrate 101 may be an SOI (Silicon On Insulator) substrate or a GOI (Germanium On Insulator) substrate. The semiconductor substrate 101 may include a lower semiconductor layer 1, an upper semiconductor layer 3, and a middle insulation layer 2 between the lower and upper semiconductor layers 1 and 3. Peripheral transistors PT and a first interlayer dielectric layer 131 covering the peripheral transistors PT may be formed on a peripheral circuit region PR, and then the upper semiconductor layer 3 may be removed from a cell array region CR. As a result, the middle insulation layer 2 may be exposed on the cell array region CR.

Referring to FIGS. 22A and 40, a buffer layer 111 may be formed on the middle insulation layer 2 exposed on the cell array region CR, and then sacrificial layers 125 and insulation layers 120 may be alternately and repeatedly formed on the buffer layer 111. Thereafter, a second interlayer dielectric layer 132 may be formed to cover the peripheral circuit region PR.

Referring to FIGS. 22A and 41, processes substantially the same as those discussed with reference to FIGS. 27 to 30 may be performed, thereby manufacturing a semiconductor memory device. The semiconductor memory device may include a residual substrate 103 originated from at least a remaining portion of the semiconductor substrate 101. For example, on the cell array region CR, at least a portion of the middle insulation layer 2 may remain between the body conductive layer 10 and the buffer layer 111, and on the peripheral circuit region PR, the upper semiconductor layer 3 may remain on the middle insulation layer 2. The middle insulation layer 2 may act as an etch stop layer when the lower semiconductor layer 1 is removed. For example, the remaining upper semiconductor layer 3 may have a thickness ranging from 5 nm to about 1000 μm.

Figure 42:
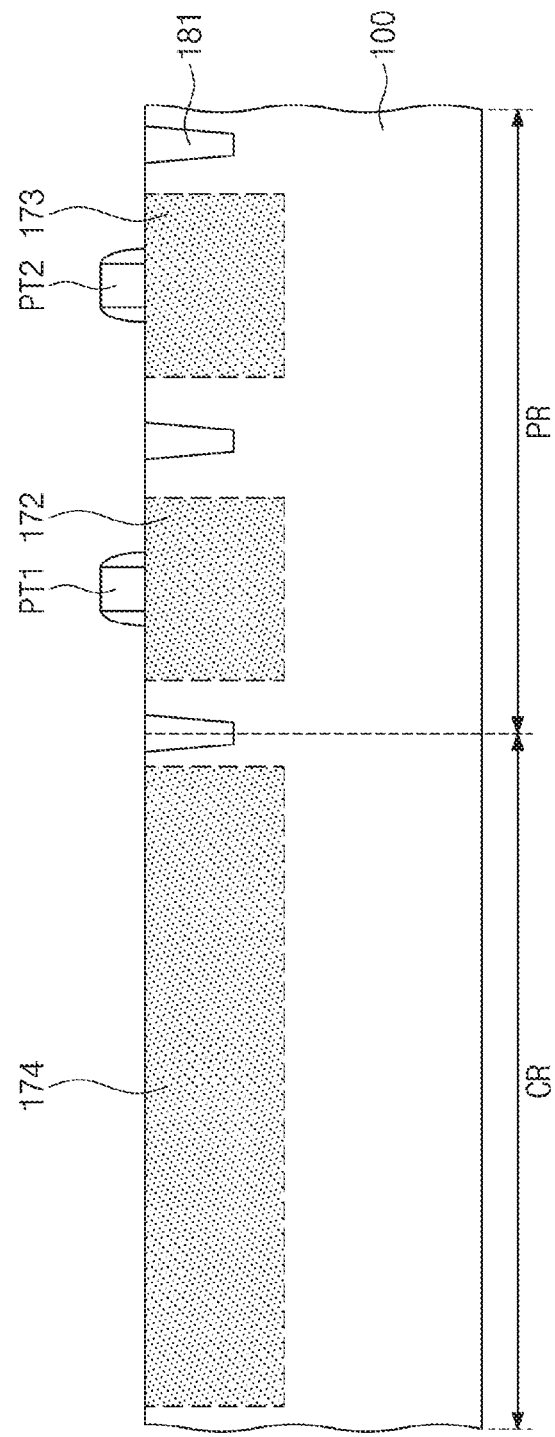
FIGS. 42 to 43 illustrate cross-sectional views showing a method of manufacturing a semiconductor memory device according to some example embodiments of inventive concepts.
Figure 43:
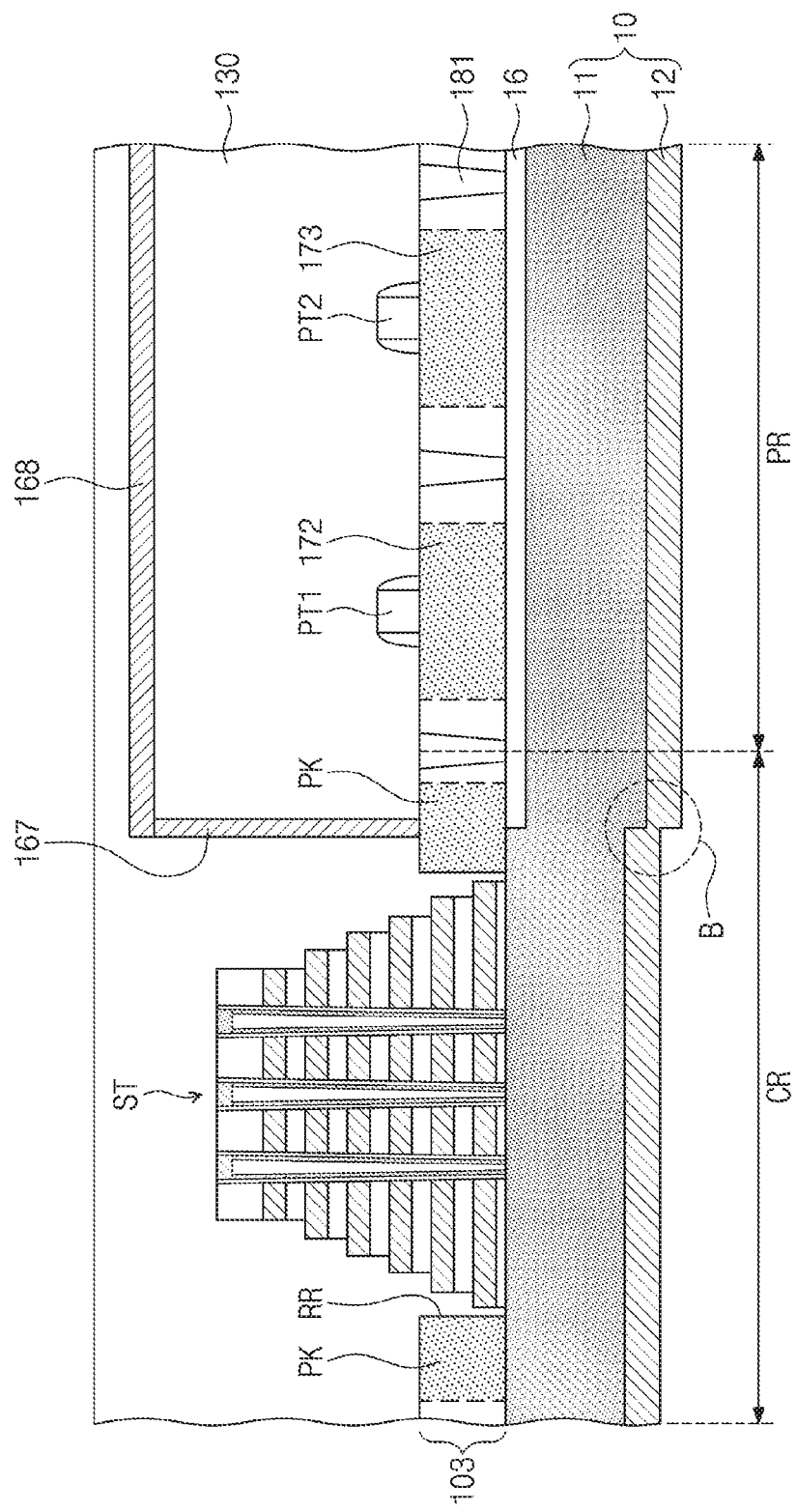

FIGS. 42 to 43 illustrate cross-sectional views showing a method of manufacturing a semiconductor memory device according to some example embodiments of inventive concepts. For brevity of description, explanations of duplicate components will be omitted.

Referring to FIG. 42, a semiconductor substrate 100 may be provided to include a cell array region CR and a peripheral circuit region PR. Device isolation layers 181 may be provided at or on an upper portion of the semiconductor substrate 100. A first impurity region 174 may be formed on the cell array region CR, and a second impurity region 172 and a third impurity region 173 may be formed on the peripheral circuit region PR. For example, the first and second impurity regions 174 and 172 may be substantially the same impurity region, and the third impurity region 173 may be an impurity region whose conductivity is different from that of the first and second impurity regions 174 and 172. A first peripheral transistor PT1 may be formed on the second impurity region 172, and a second peripheral transistor PT2 may be formed on the third impurity region 173. For example, the first peripheral transistor PT1 may be an NMOS transistor, and the second peripheral transistor PT2 may be a PMOS transistor. The device isolation layers 181 may be formed between the cell array region CR and the peripheral circuit region PR and between the first peripheral transistor PT1 and the second peripheral transistor PT2.

Referring to FIG. 43, a recess region RR may be formed at or on the upper portion of the semiconductor substrate 100, and then processes substantially the same as those discussed with reference to FIGS. 25 to 30 may be performed. As a result, a body conductive layer 10 and an electrode structure ST may be formed on the cell array region CR. The recess region RR may be exposed when the semiconductor substrate 100 experiences the removal process discussed with reference to FIG. 29, and thus a thorough region may be formed on the cell array region CR. After the recess region RR is formed, a portion of the first impurity region 174 may remain on the cell array region CR to create a pick-up impurity region PK. The pick-up impurity region PK may have an impurity concentration the same as or higher than that of the body conductive layer 10. The pick-up impurity region PK may be provided to supply the body conductive layer 10 with voltage. For example, a contact 167 and an electric line 168, which are connected to the pick-up impurity region PK, may be provided in an interlayer dielectric layer 130 that covers the cell array region CR and the peripheral circuit region PR.

In some embodiments, after the semiconductor substrate 100 is removed and before the body conductive layer 10 is formed, an insulation pattern 16 may be formed to cover a bottom surface of the residual substrate 103. The insulation pattern 16 may be connected to the device isolation layers 181. The insulation pattern 16 may separate the second and third impurity regions 172 and 173 from their underlying body conductive layer 10. For example, the insulation patterns 16 may include one or more of silicon oxide, silicon nitride, and silicon oxynitride.

The formation of the insulation pattern 16 may cause the body conductive layer 10 to have a stepwise structure B between the cell array region CR and the peripheral circuit region PR. The body conductive layer 10 may include the polycrystalline semiconductor layer 11 and the metal layer 12 as discussed with reference to FIG. 31, but inventive concepts are not limited thereto.

Figure 44:
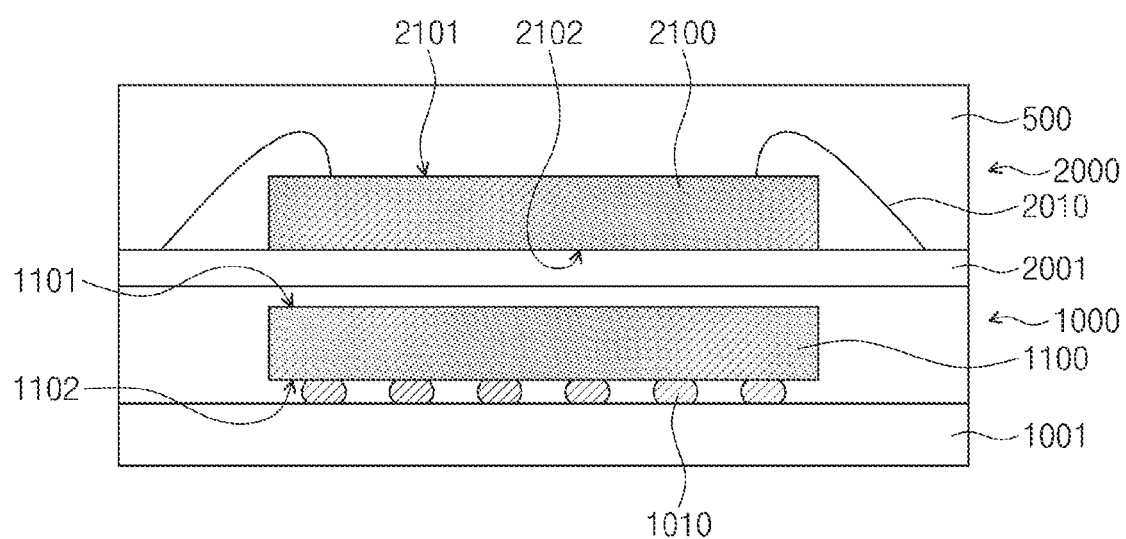
FIG. 44 illustrates a cross-sectional view showing a semiconductor package according to some example embodiments of inventive concepts.

FIG. 44 illustrates a cross-sectional view showing a semiconductor package according to some example embodiments of inventive concepts. For brevity of description, explanations of duplicate components will be omitted.

Referring to FIG. 44, a plurality of semiconductor packages may be included in a semiconductor package according to some example embodiments of inventive concepts. For example, a first package 1000 and a second package 2000 may be sequentially stacked in a semiconductor memory device according to some example embodiments of inventive concepts. The first package 1000 may include a first semiconductor chip 1100 mounted on a first package semiconductor substrate 1001. The second package 2000 may include a second semiconductor chip 2100 mounted on a second package substrate 2001. The first and second semiconductor chips 1100 and 2100 may be encapsulated by a molding layer 500 such as epoxy resin. The first and second package substrates 1001 and 2001 may be a printed circuit board.

One or more of the first and second semiconductor chips 1100 and 2100 may be a semiconductor memory device according to some example embodiments to inventive concepts. For example, the first and second semiconductor chips 1100 and 2100 may be the semiconductor memory device discussed with reference to FIGS. 22A and 22B.

The first semiconductor chip 1100 may be flip-chip mounted through bumps 1010 on the first package semiconductor substrate 1001. For example, the first semiconductor chip 1100 may include a first surface 1101 and a second surface 1102, and the first surface 1101 may be adjacently provided with the body conductive layer according to some example embodiments of inventive concepts. The second semiconductor chip 2100 may be connected through wires 2010 to the second package substrate 2001. For example, the second semiconductor chip 2100 may include a first surface 2101 and a second surface 2102, and the second surface 2102 may be adjacently provided with the body conductive layer according to some example embodiments of inventive concepts. The above mount type of the first and second semiconductor chips 1100 and 2100 are a non-limiting example, and more than two semiconductor chips may be differently mounted.

According to some embodiments of inventive concepts, the semiconductor memory device with the improved electrical characteristics may be provided. According to some embodiments of inventive concepts, the thickness of the semiconductor memory device may be reduced. According to some embodiments of inventive concepts, the connection conductive pattern connected to the body conductive layer may be formed.

While inventive concepts have been described with reference to example embodiments, it will be apparent to those skilled in the art that various changes and modifications may be made without departing from the spirits and scopes of inventive concepts. Therefore, it should be understood that the above embodiments are not limiting, but illustrative. Thus, the scopes of inventive concepts are to be determined by the broadest permissible interpretation of the following claims and their equivalents, and shall not be restricted or limited by the foregoing description.

What is claimed is:
1. A semiconductor memory device comprising:
a body conductive layer including a cell array portion and a peripheral circuit portion;

an electrode structure on the cell array portion of the body conductive layer, the electrode structure including a plurality of electrodes that are stacked on top of each other;

vertical structures penetrating the electrode structure, the vertical structures connected to the cell array portion of the body conductive layer;

a residual substrate on the peripheral circuit portion of the body conductive layer; and a connection conductive pattern penetrating the residual substrate, the connection conductive pattern connected to the peripheral circuit portion of the body conductive layer, wherein the body conductive layer includes a polycrystalline semiconductor layer.

2. The semiconductor memory device of claim 1, wherein the connection conductive pattern contacts a top surface of the body conductive layer, a width of a lower portion of the connection conductive pattern is less than a width of an upper portion of the connection conductive pattern, and the lower portion of the connection conductive pattern is in contact with the top surface of the body conductive layer.

3. The semiconductor memory device of claim 1, wherein a bottom surface of the connection conductive pattern is disposed at substantially a same level as a top surface of the body conductive layer.

4. The semiconductor memory device of claim 1, wherein a top surface of the connection conductive pattern is at a higher level than a top surface of the residual substrate.

5. The semiconductor memory device of claim 4, further comprising:

a peripheral gate electrode on the residual substrate, wherein the top surface of the connection conductive pattern is at a higher level than a top surface of the peripheral gate electrode.

6. The semiconductor memory device of claim 1, further comprising:

an insulating spacer between a sidewall of the connection conductive pattern and the residual substrate.

7. The semiconductor memory device of claim 1, further comprising:

a through-electrode penetrating the peripheral circuit portion of the body conductive layer, wherein the through-electrode is connected to the connection conductive pattern.

8. The semiconductor memory device of claim 1, wherein the connection conductive pattern includes dopants, and a conductivity type of the dopants in the connection conductive pattern is the same as a conductivity type of the body conductive layer.

9. The semiconductor memory device of claim 1, wherein a thickness of the body conductive layer is less than a thickness of the residual substrate.

10. The semiconductor memory device of claim 1, wherein the vertical structures directly contact with the cell array portion of the body conductive layer.

11. The semiconductor memory device of claim 1, wherein each of the vertical structures includes a channel semiconductor layer and a data storage layer, and the body conductive layer is connected to the channel semiconductor layer.

12. The semiconductor memory device of claim 11, wherein a bottom surface of the channel semiconductor layer and a bottom surface of the data storage layer are at substantially a same level.

13. The semiconductor memory device of claim 12, wherein a bottom surface of the connection conductive pattern is at substantially a same level as the bottom surface of the channel semiconductor layer.

14. The semiconductor memory device of claim 1, wherein a bottom surface of the connection conductive pattern is at a same level as bottom surfaces of the vertical structures.

15. The semiconductor memory device of claim 14, wherein the bottom surface of the connection conductive pattern is electrically and physically connected to a top surface of the body conductive layer.

16. The semiconductor memory device of claim 1, wherein the residual substrate includes a single-crystalline layer.

17. A semiconductor memory device comprising:

a body conductive layer including a cell array portion and a peripheral circuit portion;

an electrode structure on the cell array portion of the body conductive layer, the electrode structure including a plurality of electrodes that are stacked on top of each other;

vertical structures penetrating the electrode structure, the vertical structures connected to the cell array portion of the body conductive layer;

a residual substrate on the peripheral circuit portion of the body conductive layer;

a connection conductive pattern penetrating the residual substrate, the connection conductive pattern connected the peripheral circuit portion of the body conductive layer, wherein the residual substrate includes a peripheral active layer on a buried insulation layer, and the connection conductive pattern penetrates the peripheral active layer.

18. The semiconductor memory device of claim 17, wherein the connection conductive pattern penetrates the buried insulation layer.

19. The semiconductor memory device of claim 18, wherein the peripheral active layer is substantially single-crystalline.

20. The semiconductor memory device of claim 17, wherein a sidewall of the connection conductive pattern is connected to the peripheral active layer.

* * * * *